(12) United States Patent
Elberbaum

(10) Patent No.: US 10,313,141 B1
(45) Date of Patent: Jun. 4, 2019

(54) METHOD AND A TESTER FOR TESTING AND VERIFYING THE CONDUCTIVITY OF OPTICAL CABLE SEGMENTS LINKED WITHIN A CASCADED INFRASTRUCTURE OF SMART RESIDENCES

(71) Applicant: Elbex Video Ltd., Tokyo (JP)

(72) Inventor: David Elberbaum, Tokyo (JP)

(73) Assignee: ELBEX VIDEO LTD., Tokyo (JP)

( * ) Notice: Subject to any disclaimer, the term of this patent is extended or adjusted under 35 U.S.C. 154(b) by 0 days.

(21) Appl. No.: 16/171,362

(22) Filed: Oct. 26, 2018

Related U.S. Application Data

(63) Continuation-in-part of application No. 15/917,135, filed on Mar. 9, 2018, now Pat. No. 10,225,005.

(51) Int. Cl.
| | |
|---|---|
| *H02G 3/08* | (2006.01) |
| *H04L 12/12* | (2006.01) |
| *H04L 12/28* | (2006.01) |
| *H04L 12/40* | (2006.01) |
| *G01R 35/00* | (2006.01) |
| *G08C 23/06* | (2006.01) |
| *G01R 21/01* | (2006.01) |

(52) U.S. Cl.
CPC .............. *H04L 12/12* (2013.01); *G01R 21/01* (2013.01); *G01R 35/005* (2013.01); *G08C 23/06* (2013.01); *H02G 3/083* (2013.01); *H04L 12/2816* (2013.01); *H04L 12/40013* (2013.01)

(58) Field of Classification Search
CPC .... H01H 2300/03; H01H 9/167; H01H 47/22; H01H 89/00; H01H 9/168; H01H 9/26; H01H 50/58; H01H 51/10; H01H 51/27; H01H 9/0271

USPC ...................................................... 398/25–36
See application file for complete search history.

(56) References Cited

U.S. PATENT DOCUMENTS

| | | | |
|---|---|---|---|
| 5,323,363 A | 6/1994 | Hysek et al. | |
| 6,014,369 A * | 1/2000 | Takahasahi | H04M 3/303 370/248 |
| 6,522,794 B1 * | 2/2003 | Bischel | G02F 1/011 385/10 |
| 6,603,842 B2 | 8/2003 | Elberbaum | |
| 6,650,803 B1 * | 11/2003 | Ramaswami | H04J 14/0293 385/15 |
| 6,940,957 B2 | 9/2005 | Elberbaum | |
| 6,947,069 B1 * | 9/2005 | Elberbaum | H04N 7/22 348/50 |
| 7,369,907 B2 | 5/2008 | Hibino et al. | |
| 7,461,012 B2 | 12/2008 | Elberbaum | |
| 7,649,727 B2 * | 1/2010 | Elberbaum | H01H 9/167 361/170 |
| 7,864,500 B2 | 1/2011 | Elberbaum | |
| 7,973,647 B2 | 7/2011 | Elberbaum | |

(Continued)

*Primary Examiner* — Amritbir K Sandhu
(74) *Attorney, Agent, or Firm* — Stern & Schurin LLP

(57) ABSTRACT

A method and apparatus for testing and verifying the status of cascaded optical cable segments linked to at least one of plurality of AC cascaded devices or low voltage cascaded devices each including at least one optical access and self lock keys to attach the end of at least one cut segment of the optical cable including operate keys, a touch screen, a display and indicators to provide electrician and installers a simple range of hand held testers and to identify the status and particular of defects during installations or maintenance of units of smart residence or commercial grid and beyond.

20 Claims, 26 Drawing Sheets

(56) References Cited

U.S. PATENT DOCUMENTS

| | | | |
|---|---|---|---|
| 8,041,221 B2 | 10/2011 | Elberbaum | |
| 8,117,076 B2 | 2/2012 | Elberbaum | |
| 8,148,921 B2 | 4/2012 | Elberbaum | |
| 8,170,722 B1 | 5/2012 | Elberbaum | |
| 8,175,463 B2 | 5/2012 | Elberbaum | |
| 8,269,376 B1 * | 9/2012 | Elberbaum | H01H 9/167 307/115 |
| 8,331,794 B2 | 12/2012 | Elberbaum | |
| 8,331,795 B2 | 12/2012 | Elberbaum | |
| 8,340,527 B2 | 12/2012 | Elberbaum | |
| 8,344,668 B2 | 1/2013 | Elberbaum | |
| 8,384,249 B2 | 2/2013 | Elberbaum | |
| 8,441,824 B2 | 5/2013 | Elberbaum | |
| 8,442,792 B1 | 5/2013 | Elberbaum | |
| 8,489,469 B1 | 7/2013 | Elberbaum | |
| 8,594,965 B1 | 11/2013 | Elberbaum | |
| 8,638,087 B2 | 1/2014 | Elberbaum | |
| 8,639,465 B1 | 1/2014 | Elberbaum | |
| 8,742,892 B1 | 6/2014 | Elberbaum | |
| 8,930,158 B2 | 1/2015 | Elberbaum | |
| 9,036,320 B1 | 5/2015 | Elberbaum | |
| 9,219,358 B2 | 12/2015 | Elberbaum | |
| 9,257,251 B2 | 2/2016 | Elberbaum | |
| 9,281,147 B2 | 3/2016 | Elberbaum | |
| 10,139,274 B2 * | 11/2018 | Schell | G01J 1/44 |
| 10,225,005 B1 * | 3/2019 | Elberbaum | H04B 10/075 |
| 2002/0024162 A1 * | 2/2002 | Maguire | B01F 15/00805 264/40.7 |
| 2006/0082518 A1 * | 4/2006 | Ram | G06F 1/1601 345/1.1 |
| 2006/0198634 A1 * | 9/2006 | Ofalt | H04B 10/077 398/16 |
| 2007/0240832 A1 * | 10/2007 | Cavarec | E04F 10/0618 160/70 |
| 2008/0235418 A1 * | 9/2008 | Werthen | G06F 13/385 710/106 |
| 2009/0136235 A1 * | 5/2009 | Suh | G01R 31/31905 398/135 |
| 2010/0278537 A1 * | 11/2010 | Elberbaum | G08C 23/06 398/112 |
| 2011/0110673 A1 * | 5/2011 | Elberbaum | G02B 6/3817 398/202 |
| 2011/0145451 A1 * | 6/2011 | Soffer | G06F 3/023 710/64 |
| 2015/0062562 A1 * | 3/2015 | Kassler | G01M 11/3136 356/73.1 |
| 2018/0283937 A1 * | 10/2018 | Schell | G01M 11/33 |

\* cited by examiner

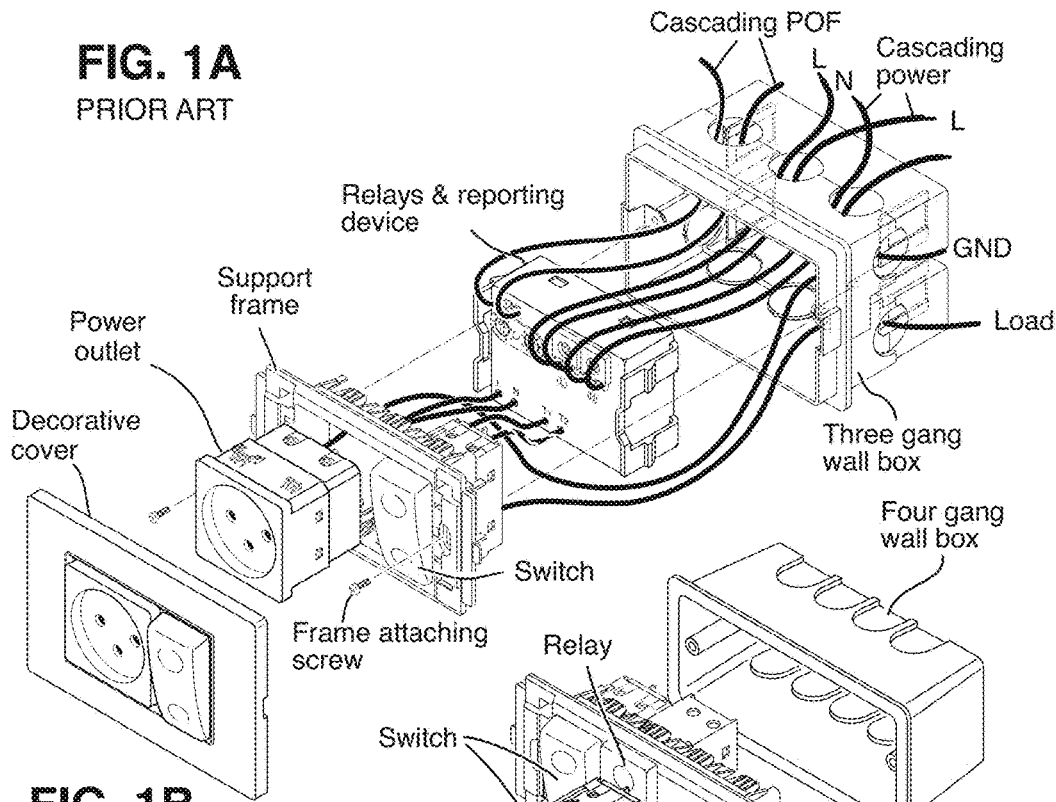
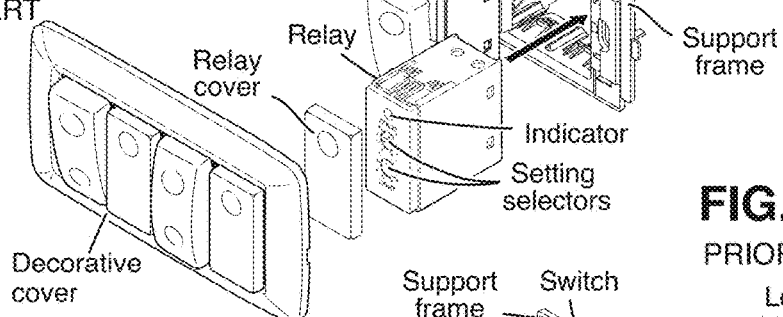
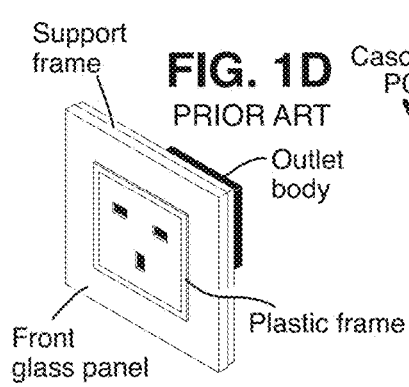
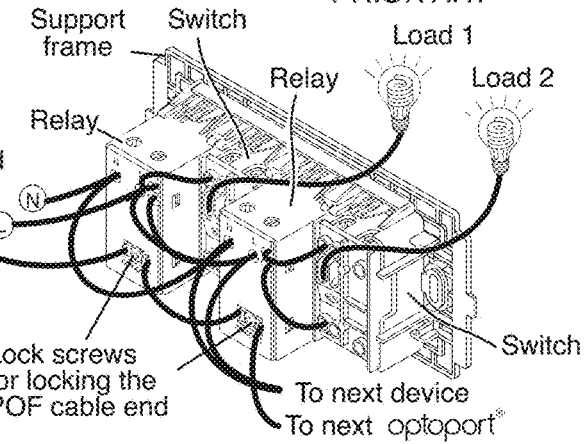
FIG. 1A PRIOR ART
FIG. 1B PRIOR ART
FIG. 1C PRIOR ART
FIG. 1D PRIOR ART

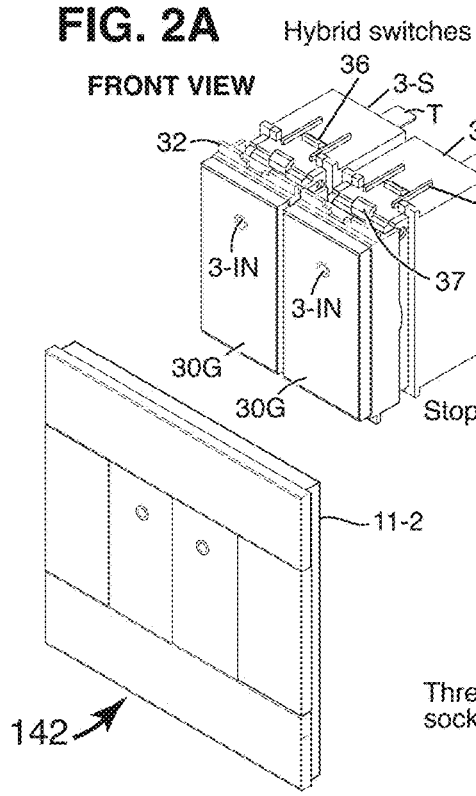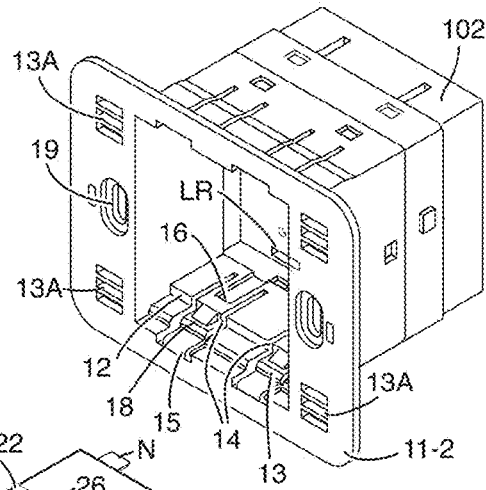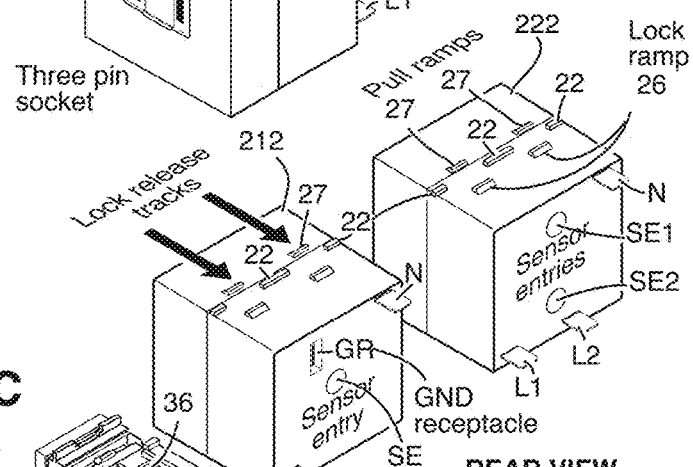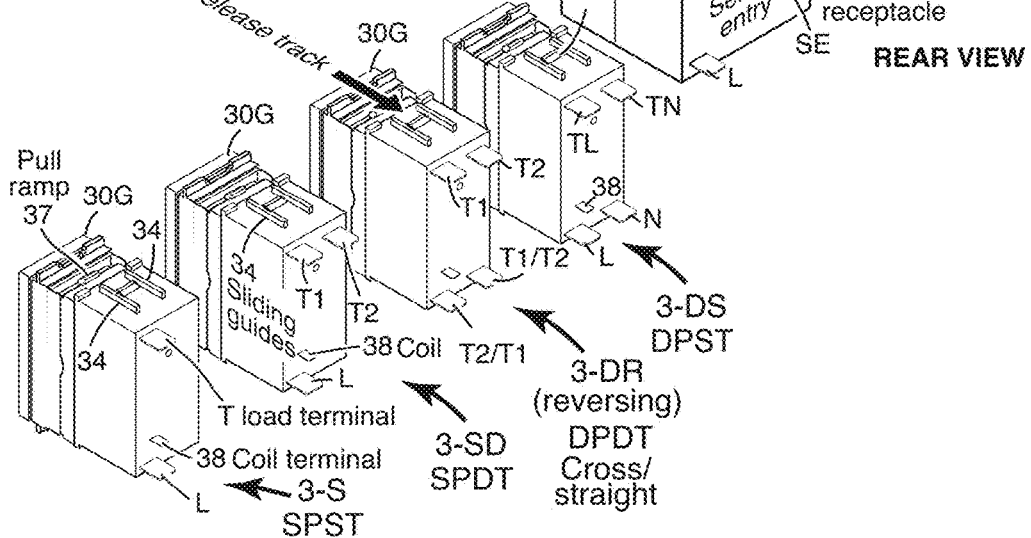

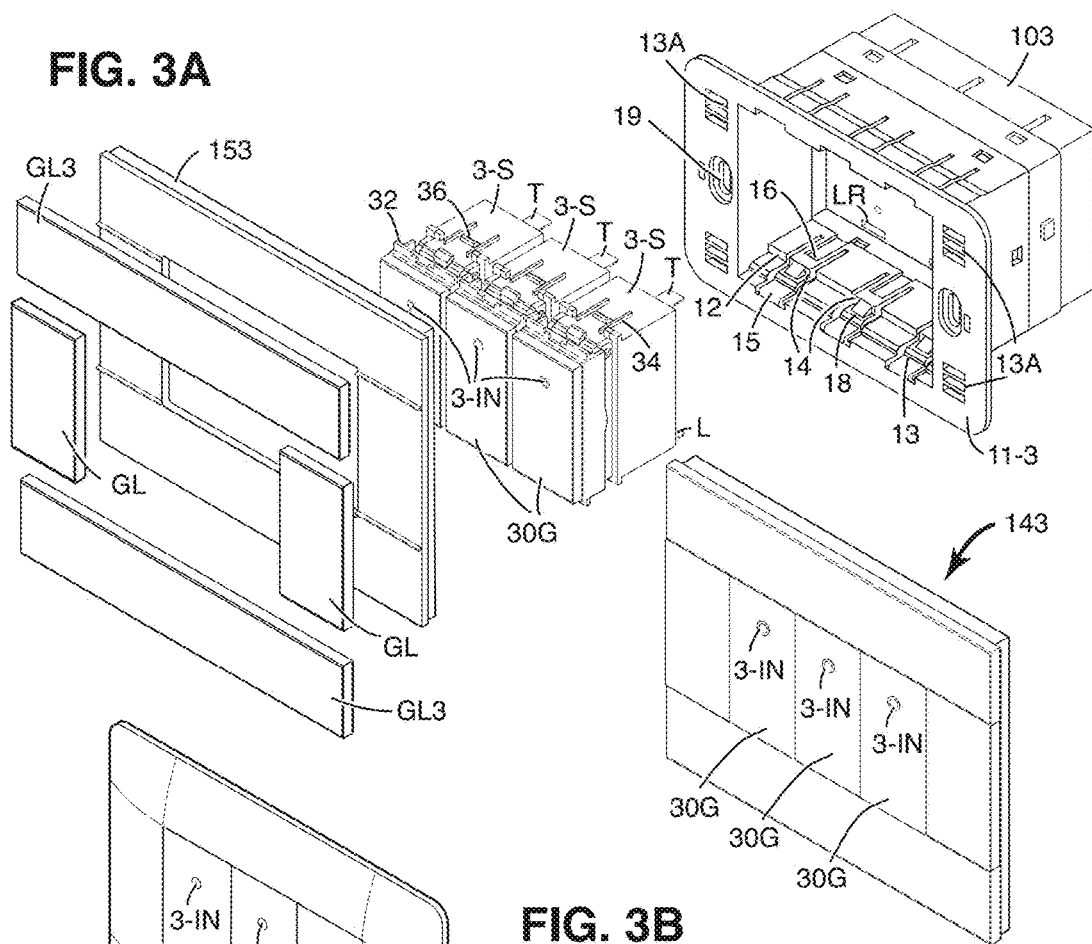
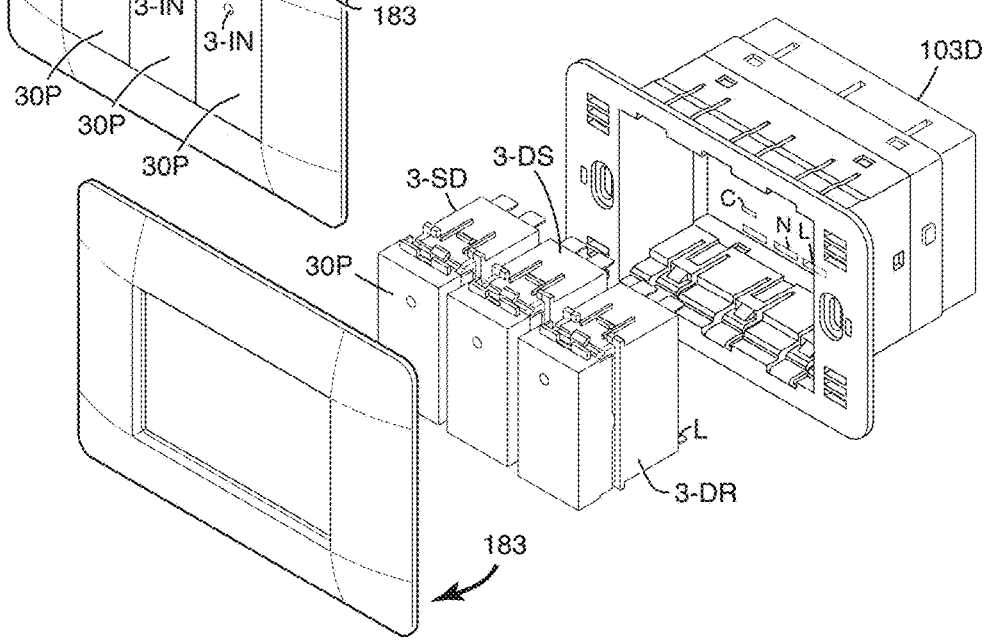
FIG. 3A
FIG. 3B

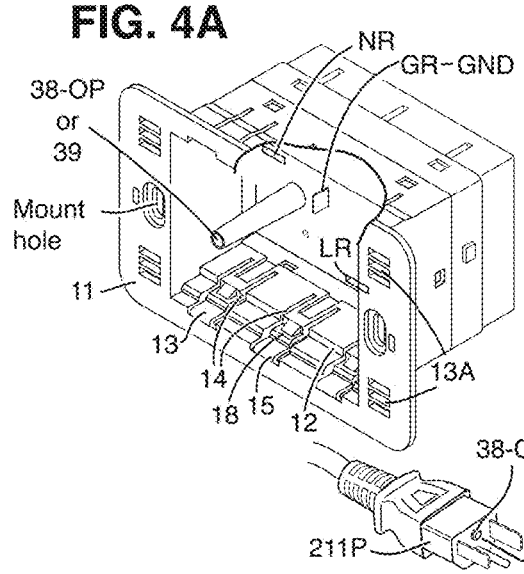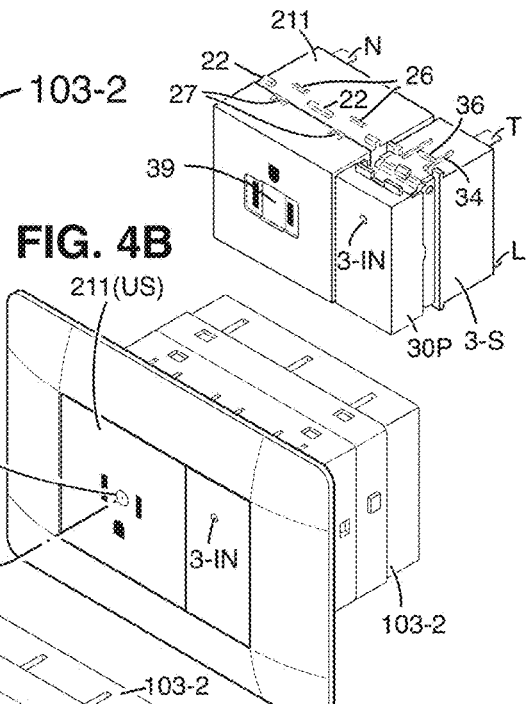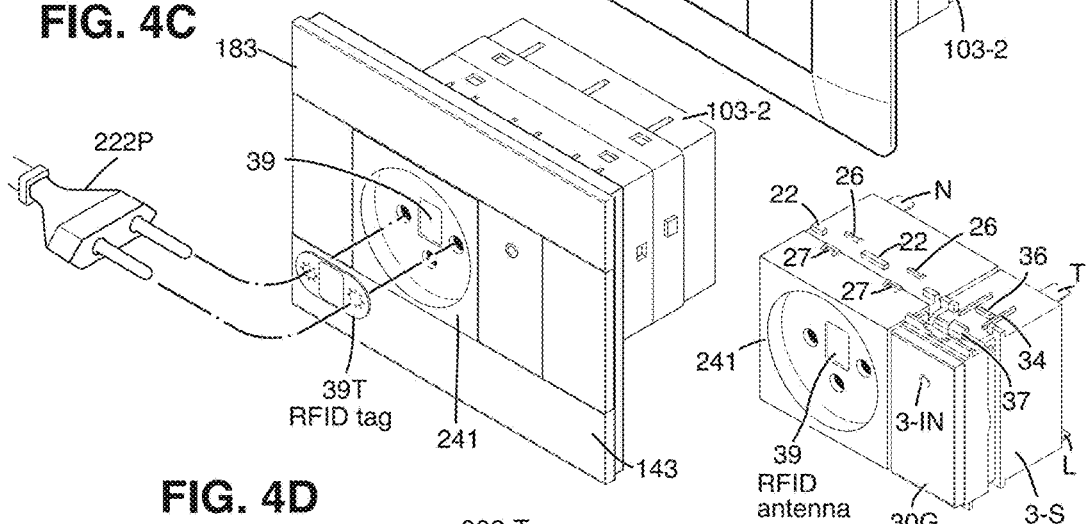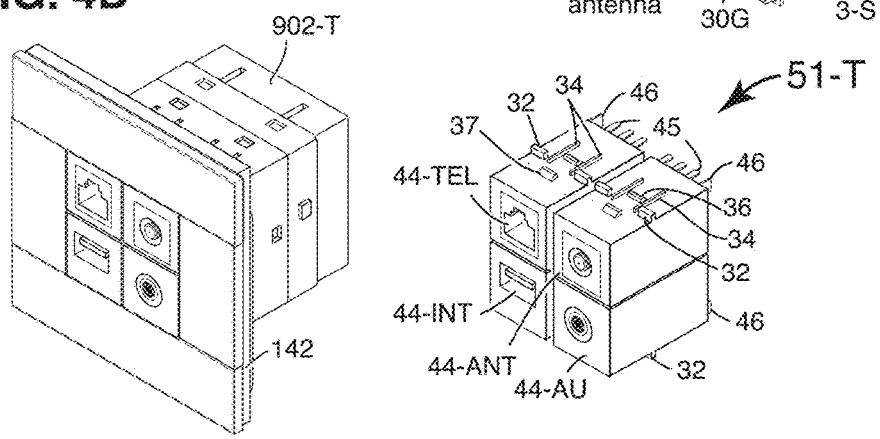

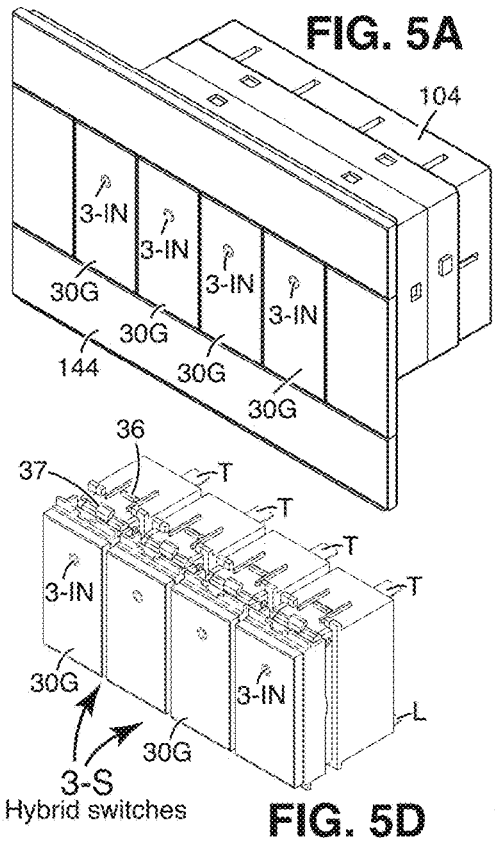
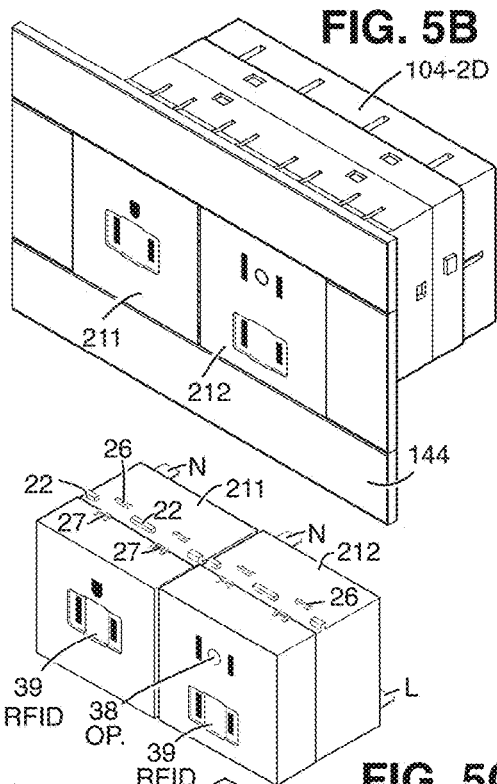
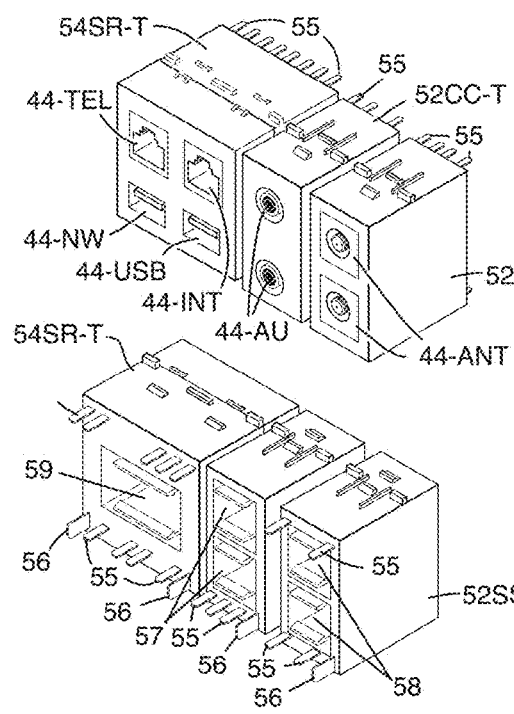
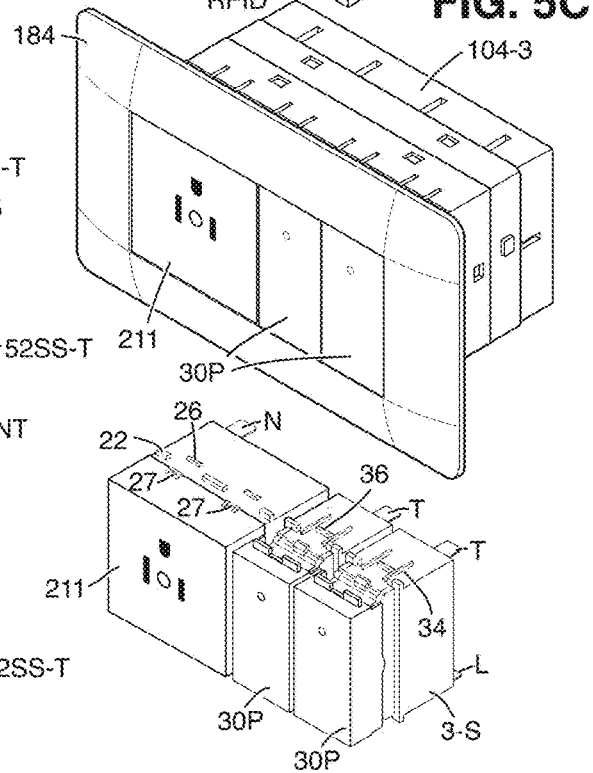

FIG. 6A
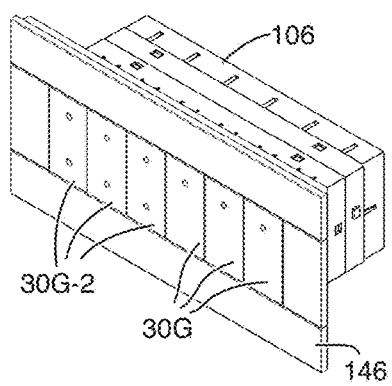
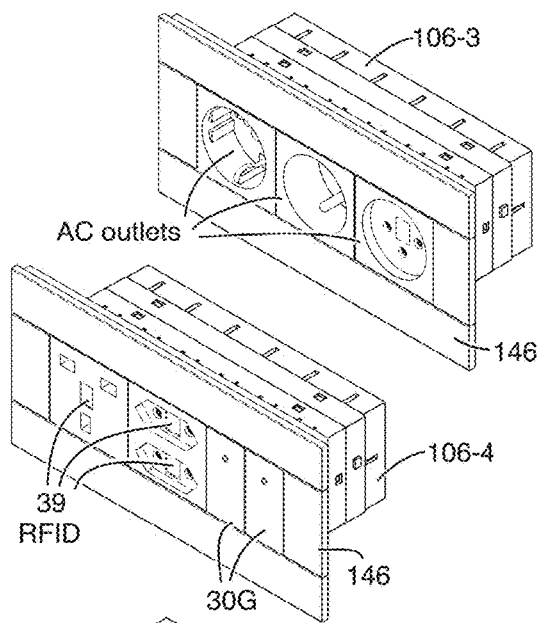
FIG. 6B
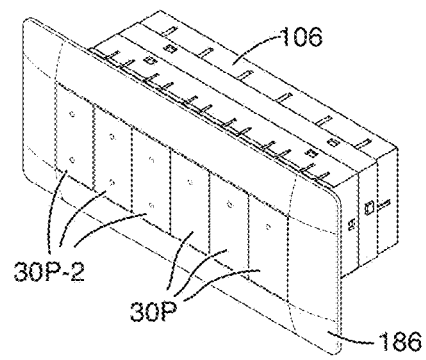
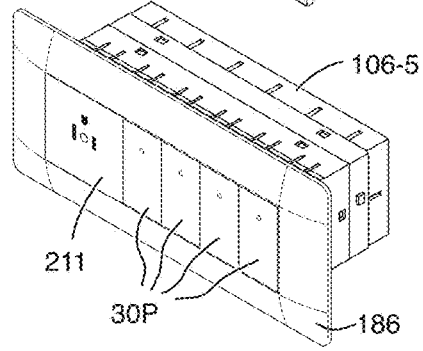
FIG. 6C
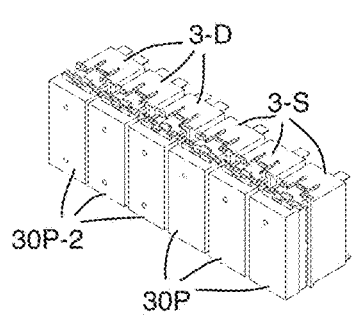
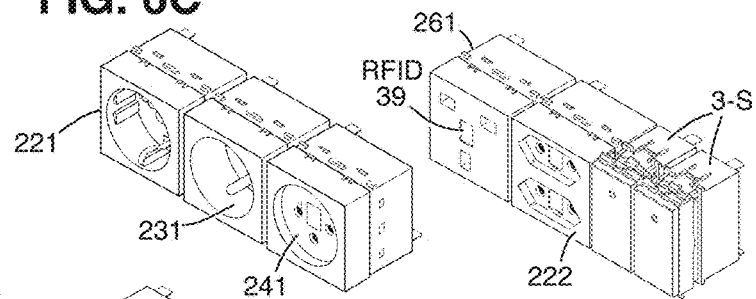
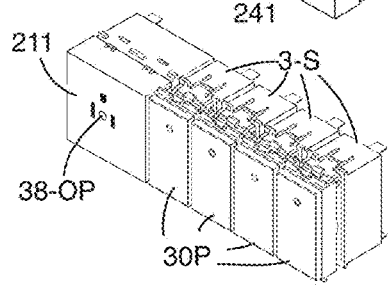

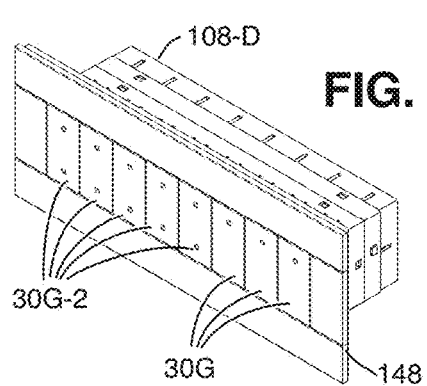
FIG. 7A
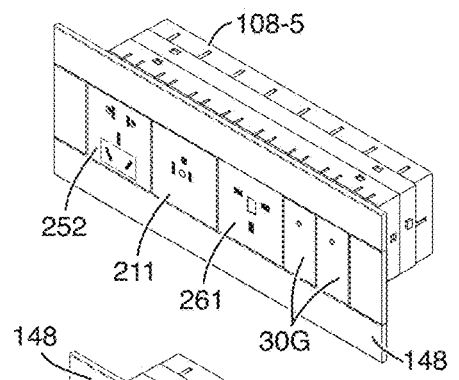
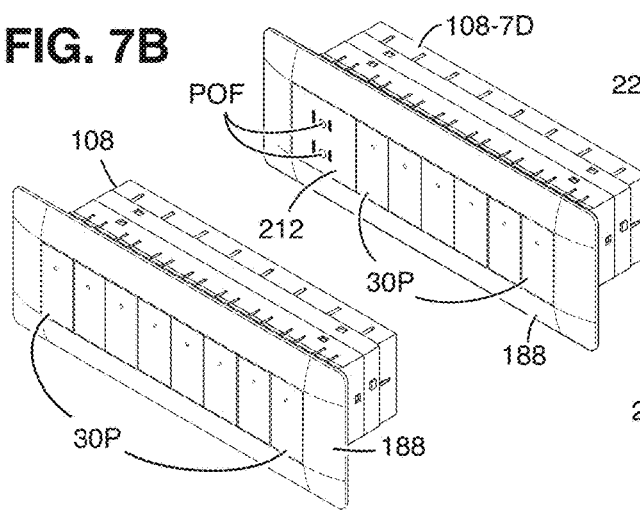
FIG. 7B
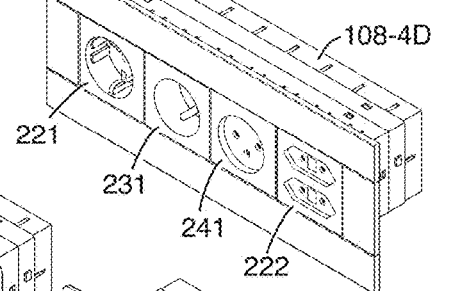
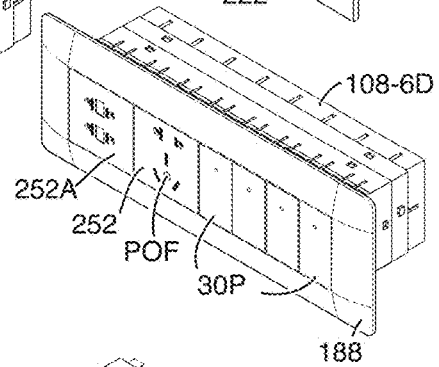
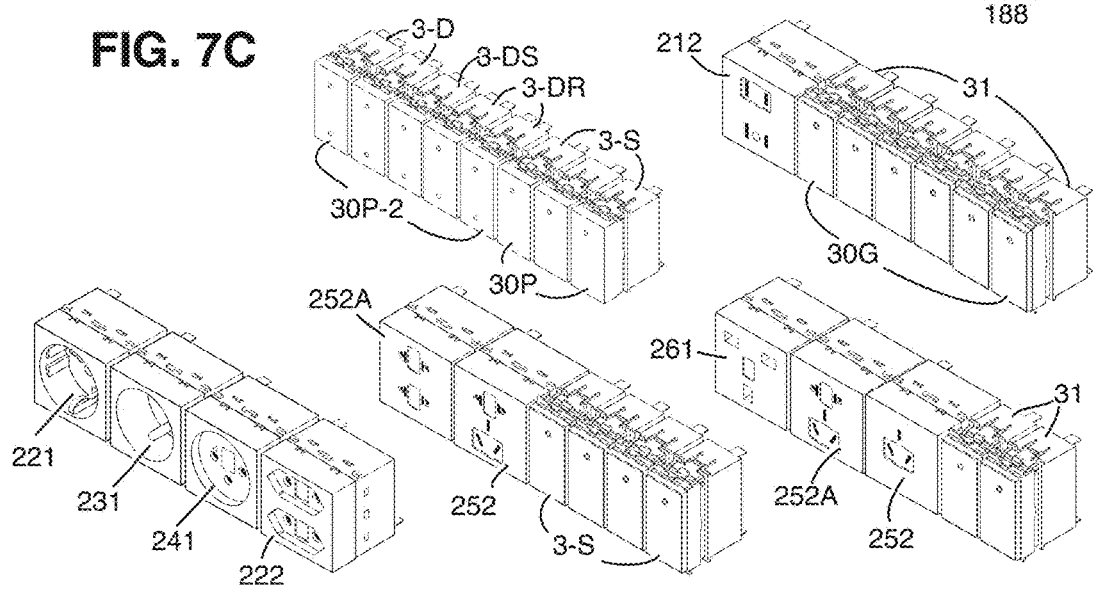
FIG. 7C

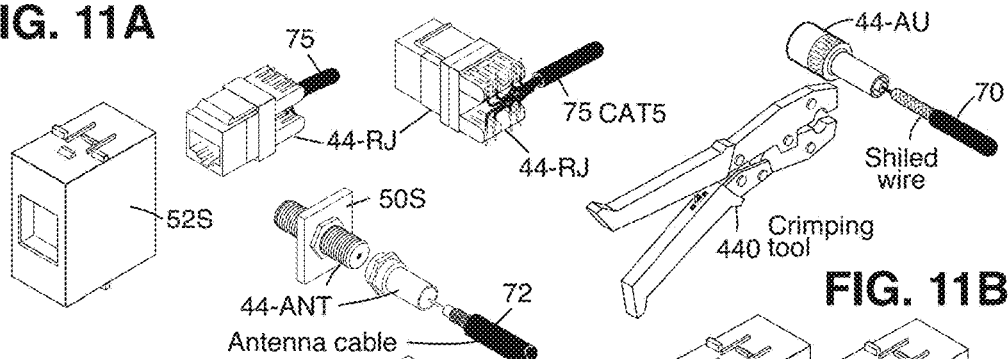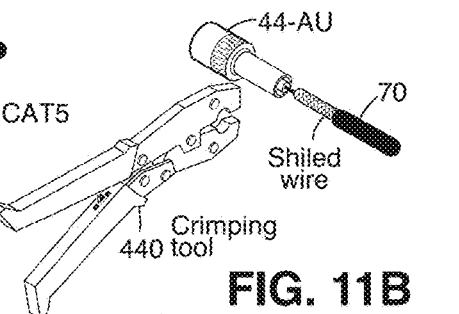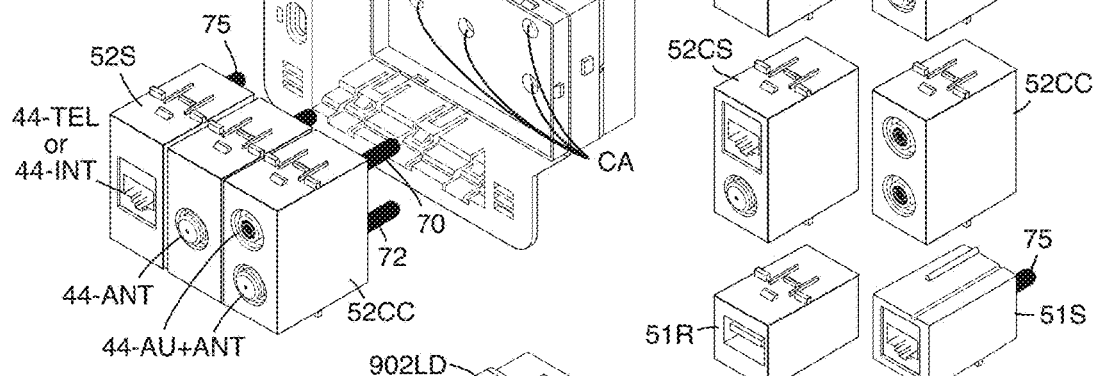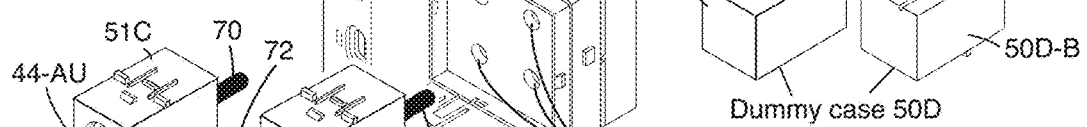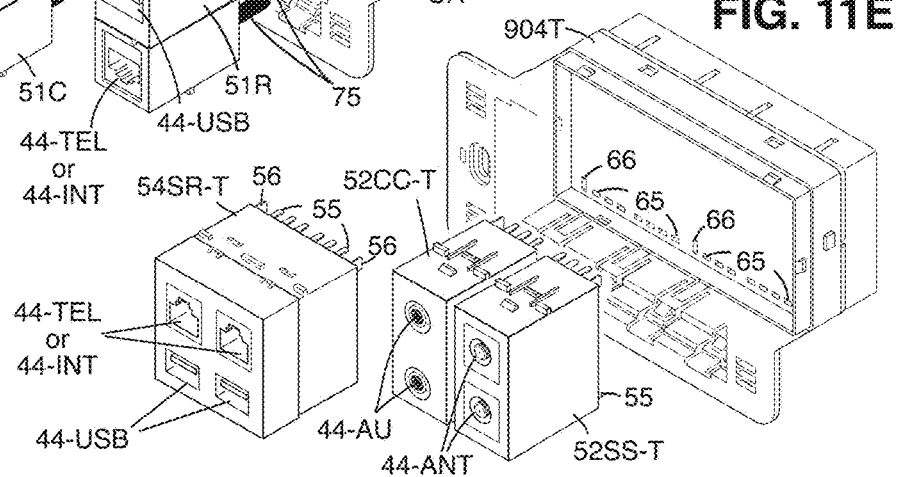

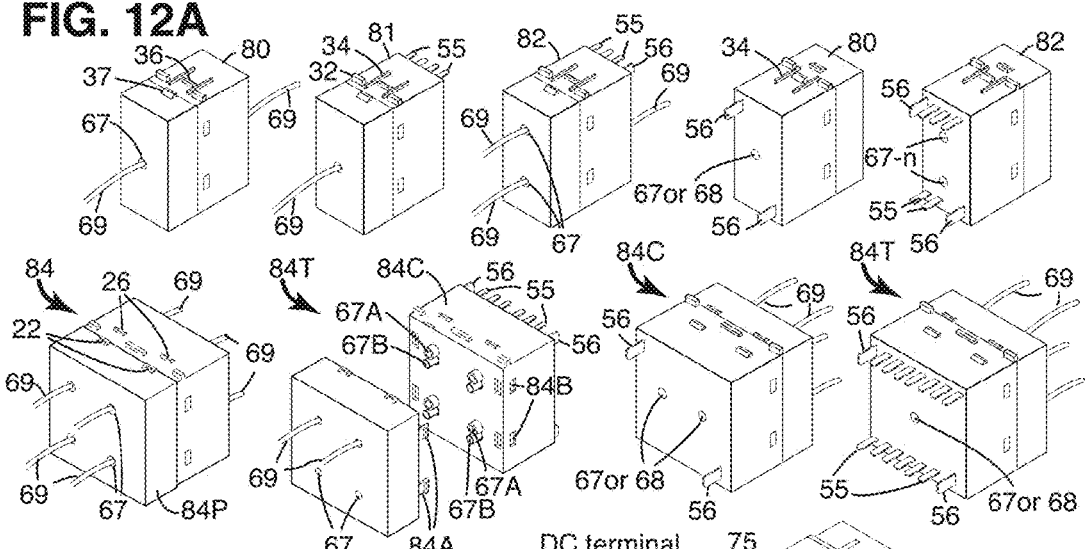
FIG. 12A
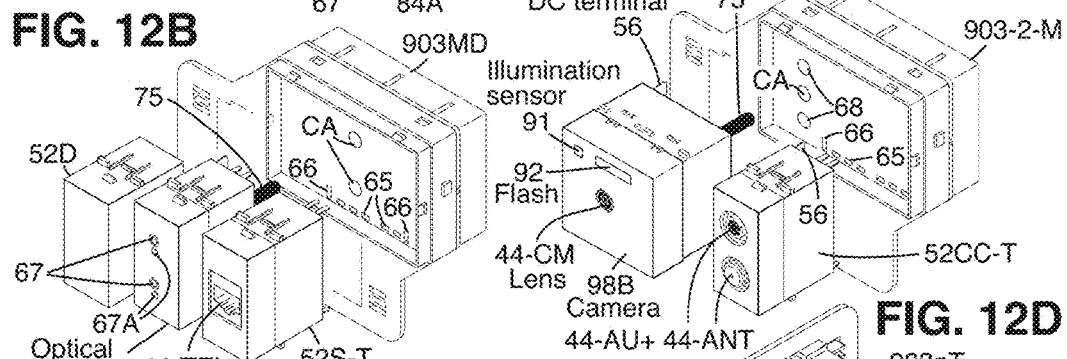
FIG. 12B
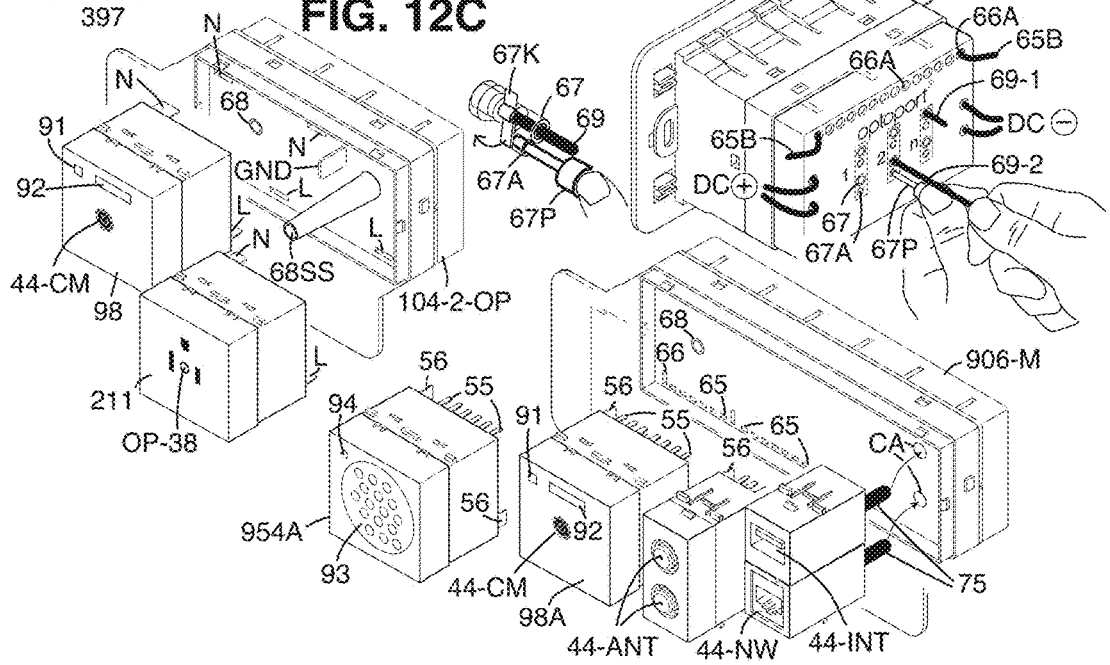
FIG. 12C
FIG. 12D

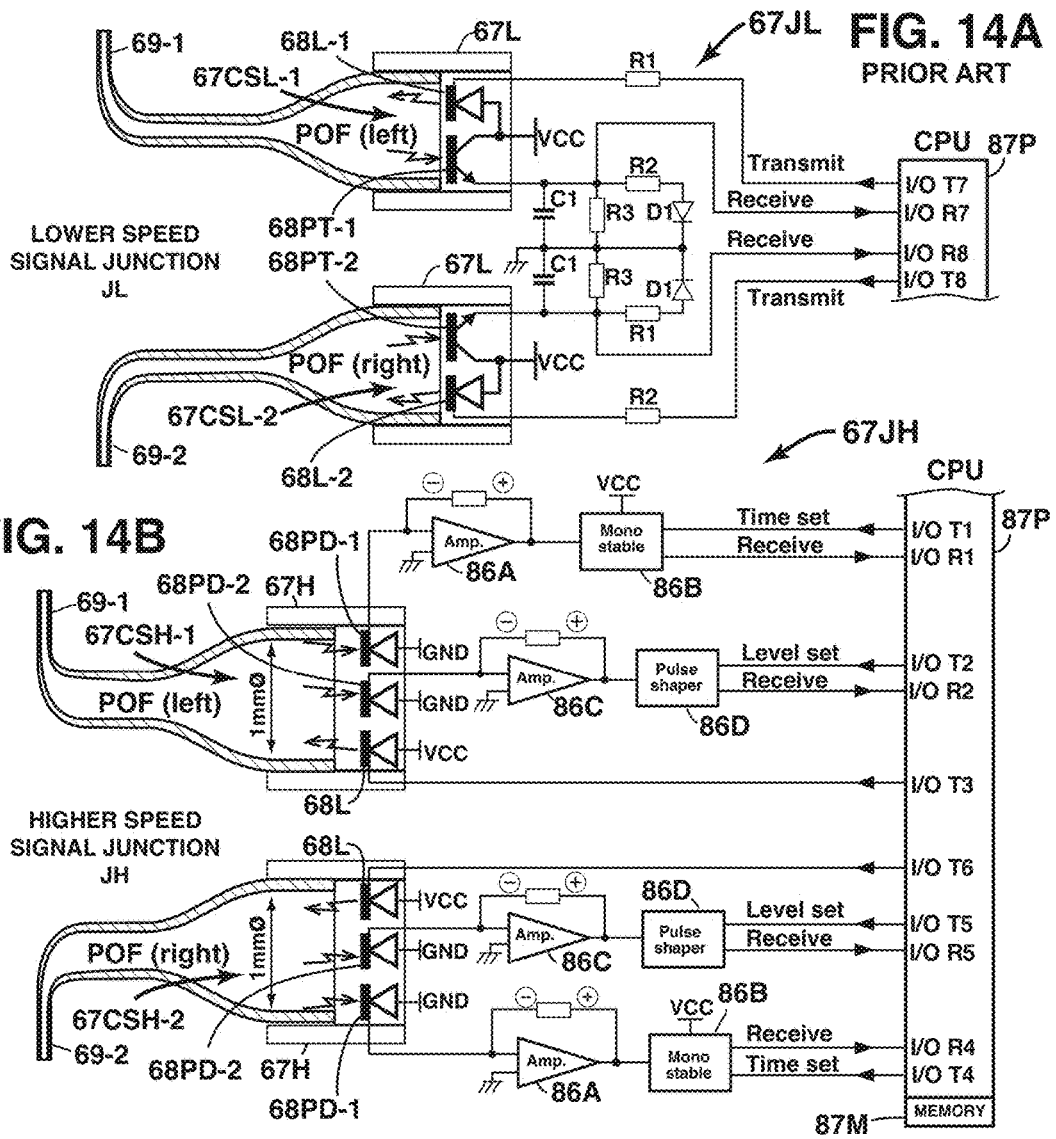
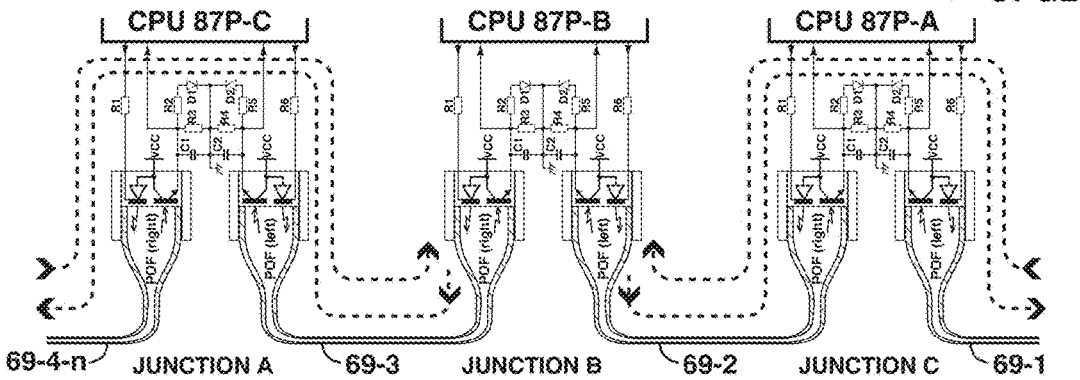

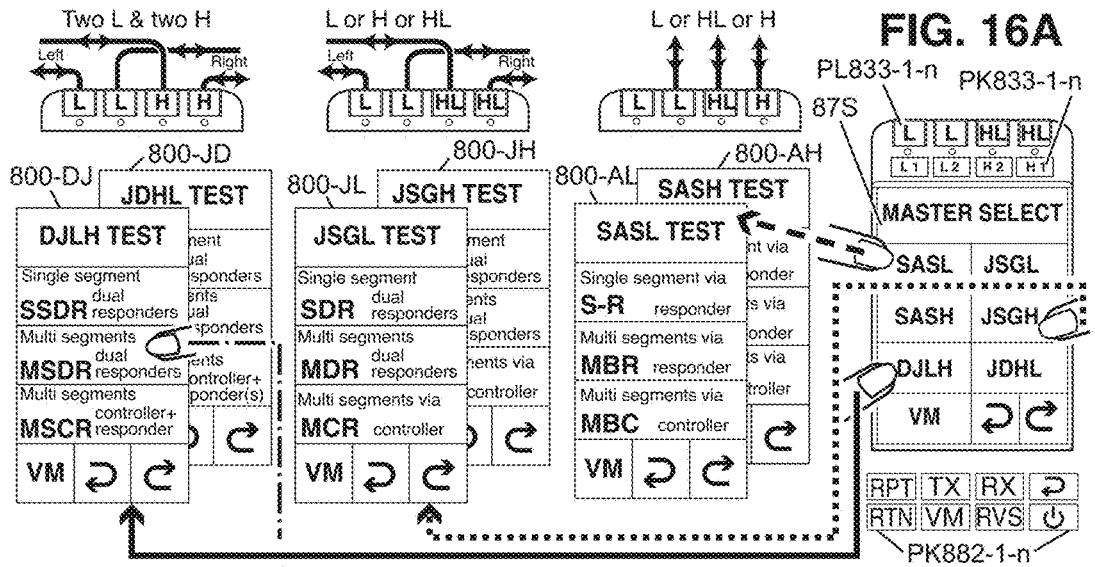
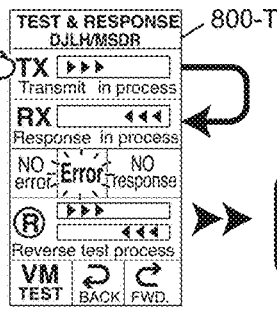
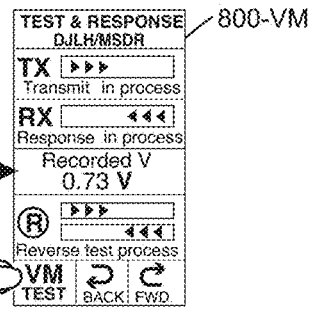
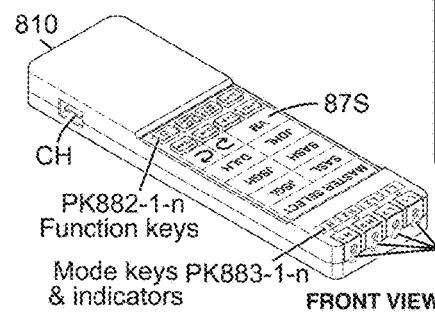
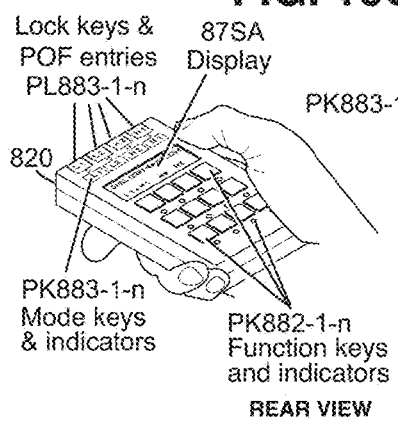
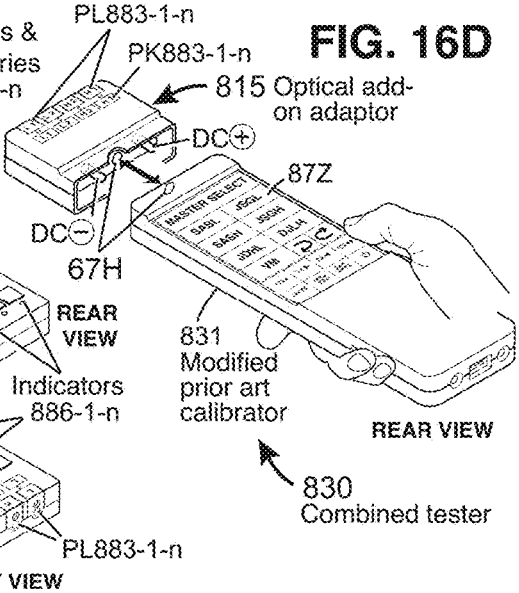

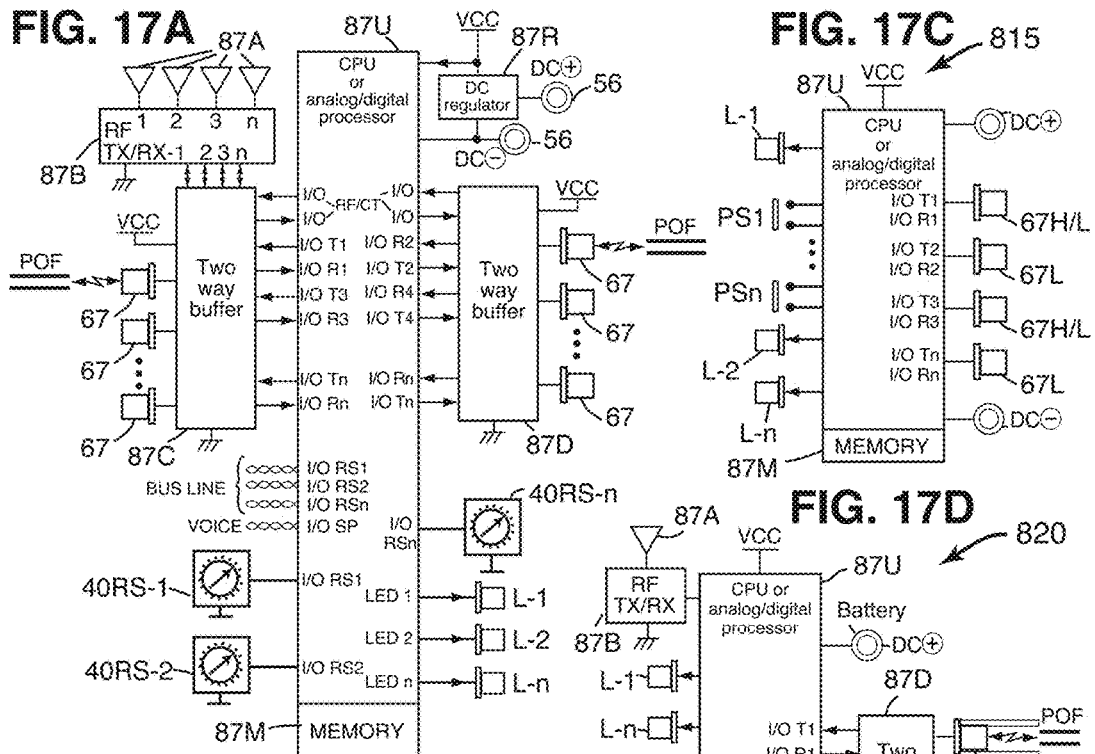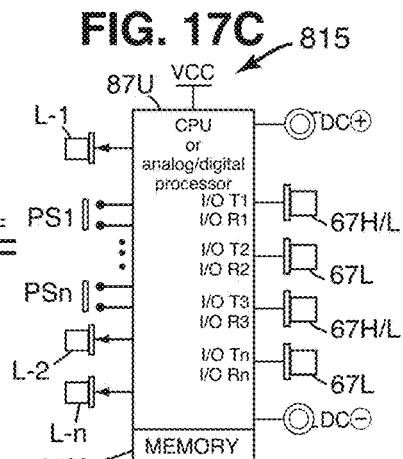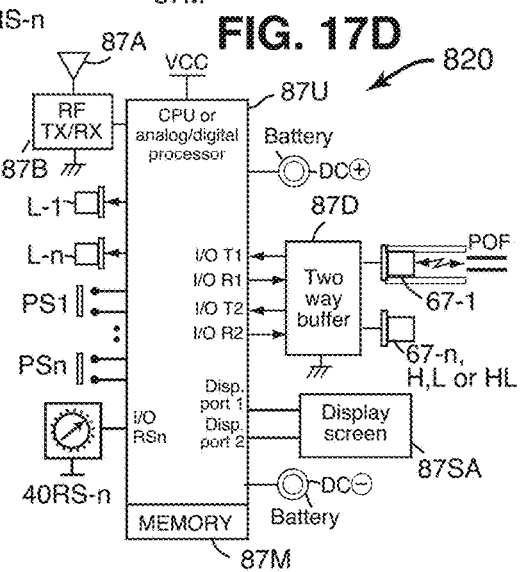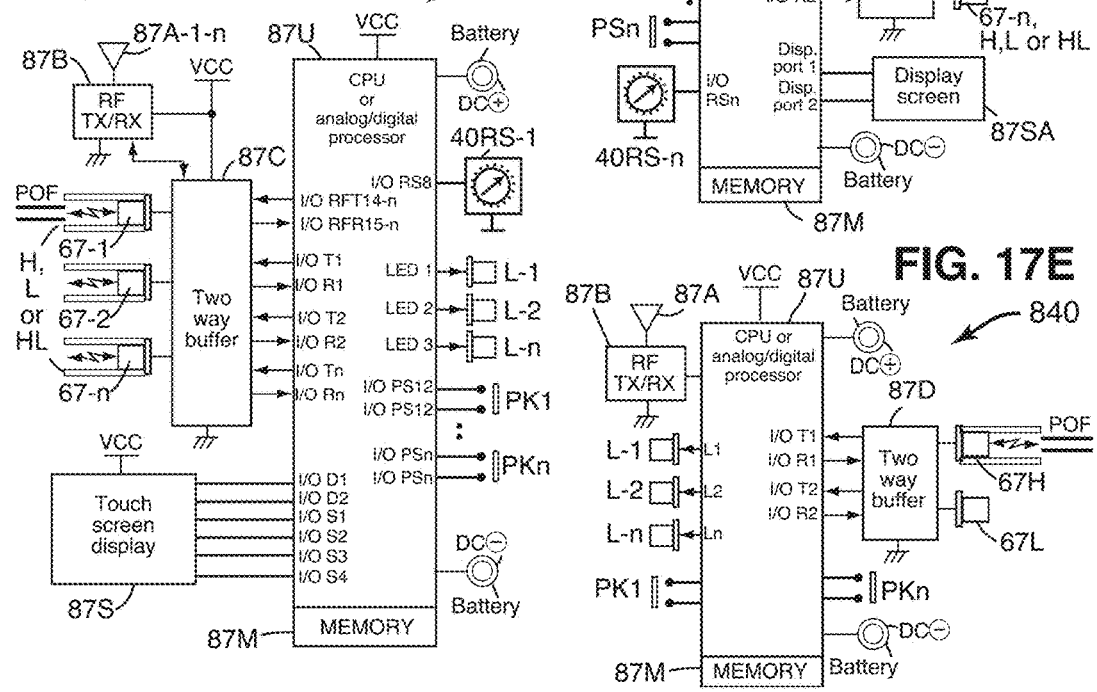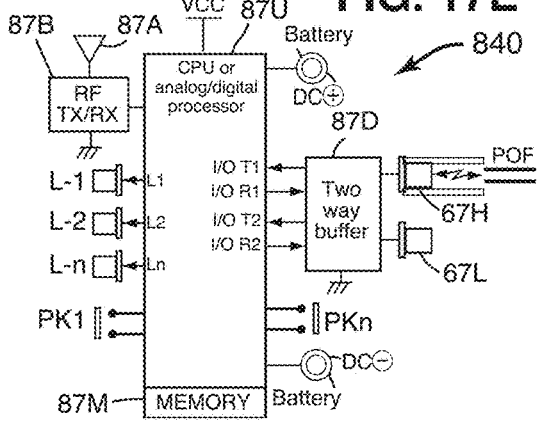

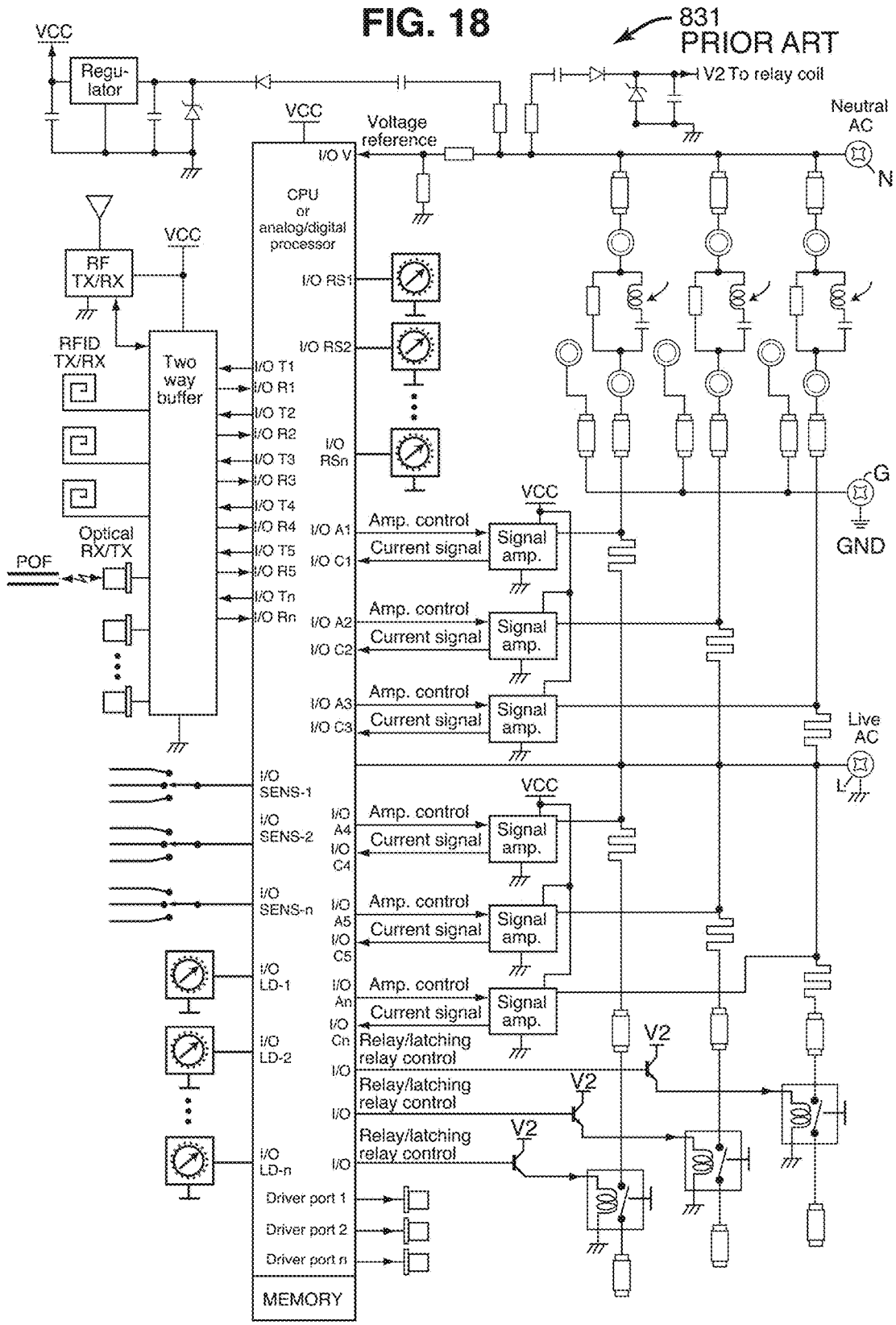
FIG. 18 — PRIOR ART

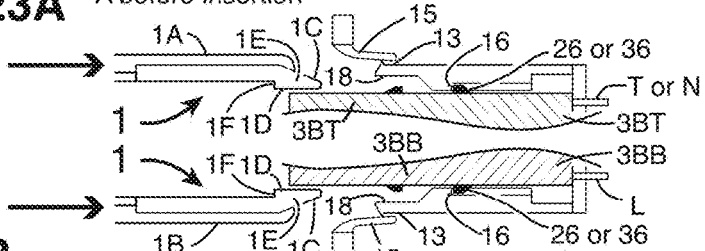
FIG. 23A A before insertion
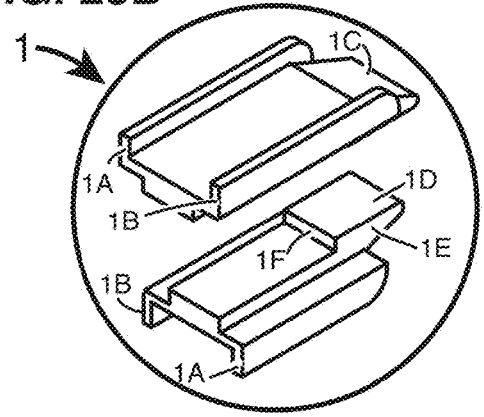
FIG. 23B
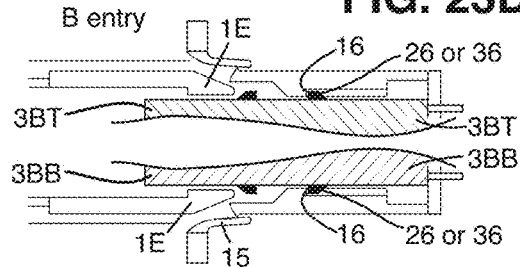
FIG. 23D B entry
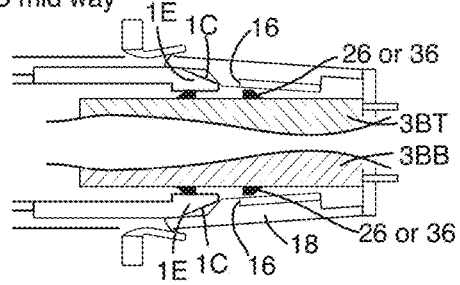
C mid way
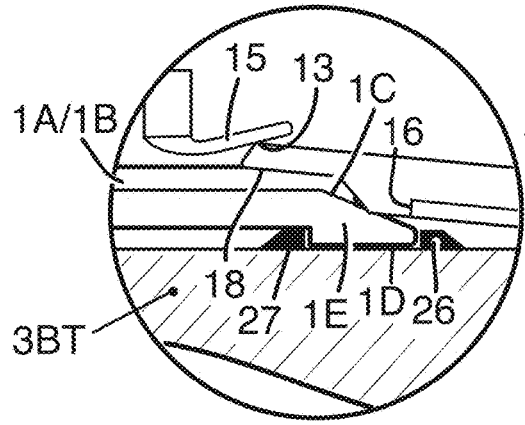
FIG. 23C
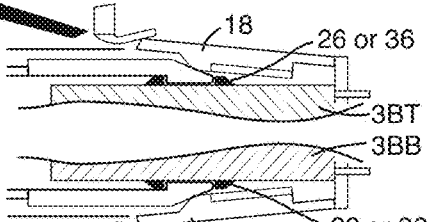
D fully pushed - released
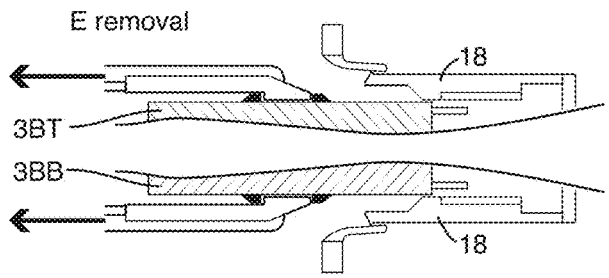
FIG. 23E E removal

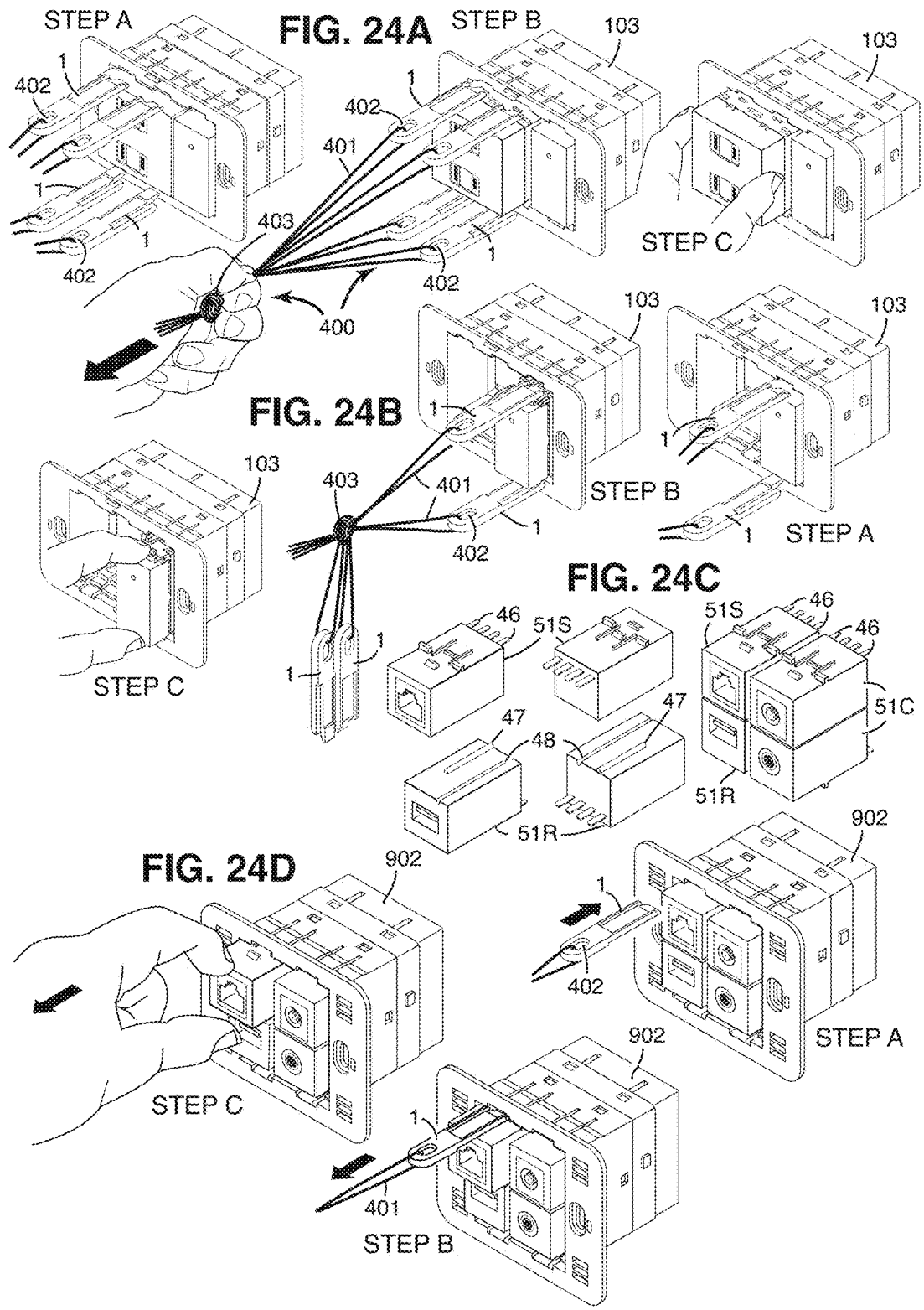

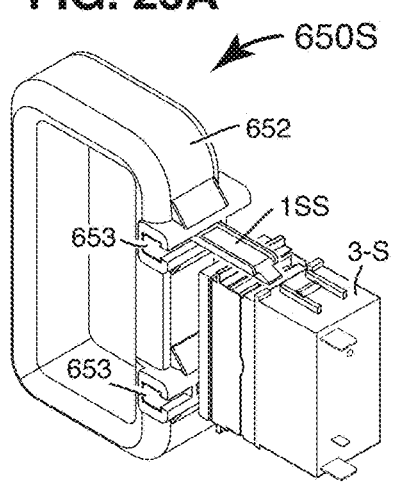
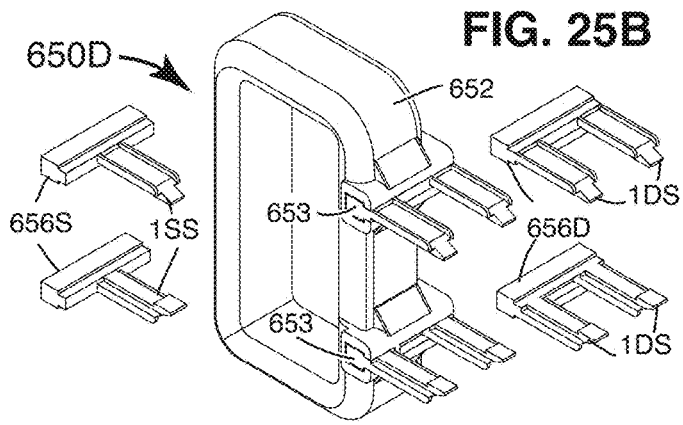
FIG. 25A
FIG. 25B
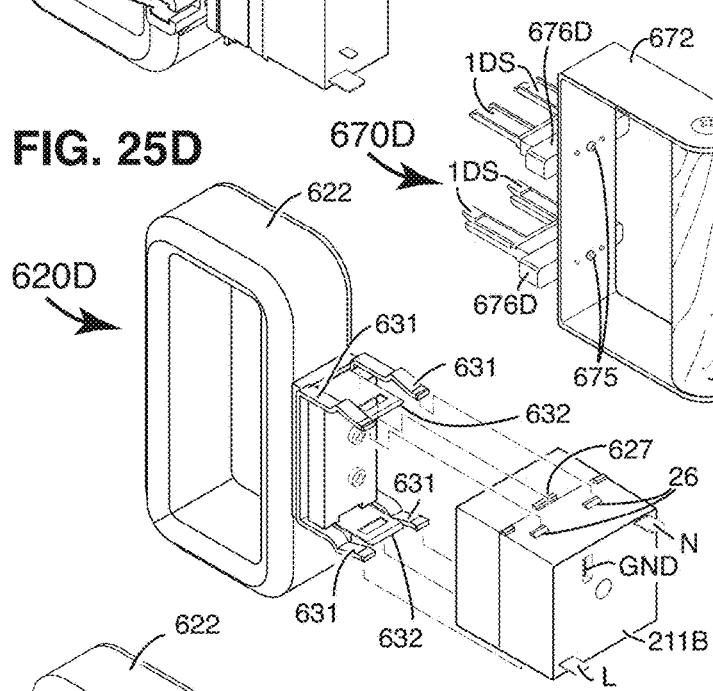
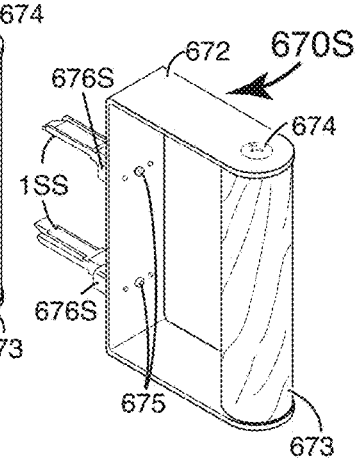
FIG. 25D
FIG. 25C
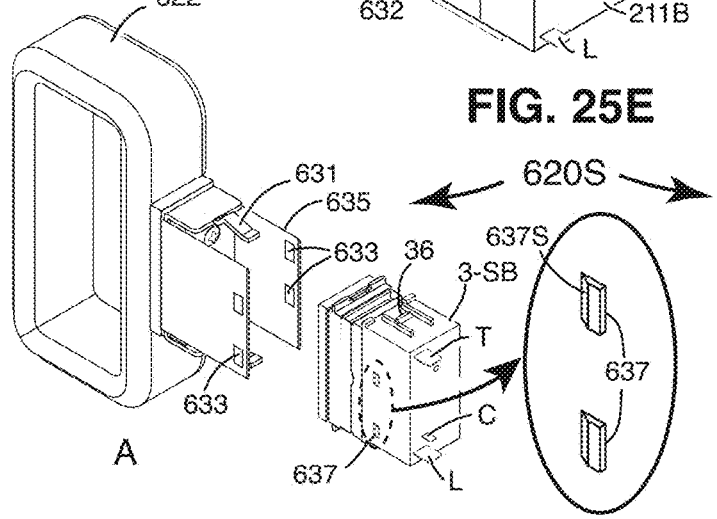
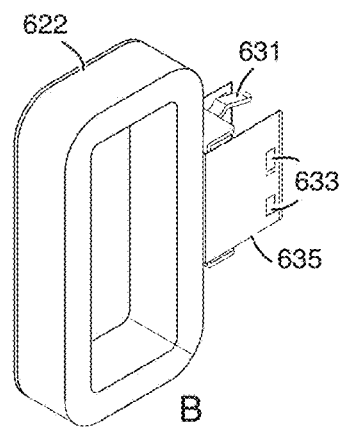
FIG. 25E

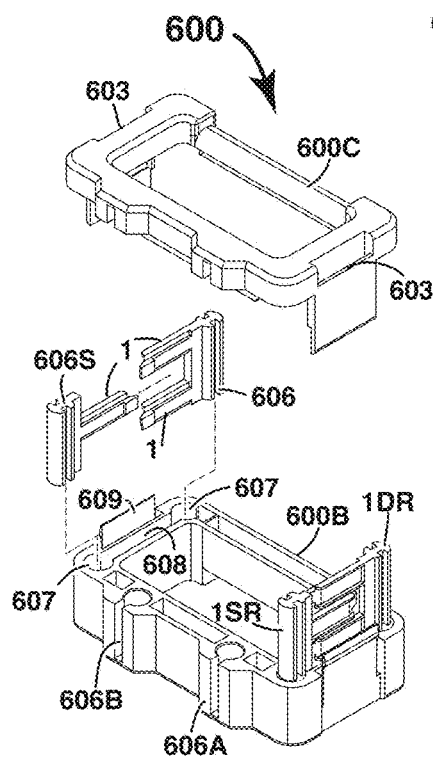
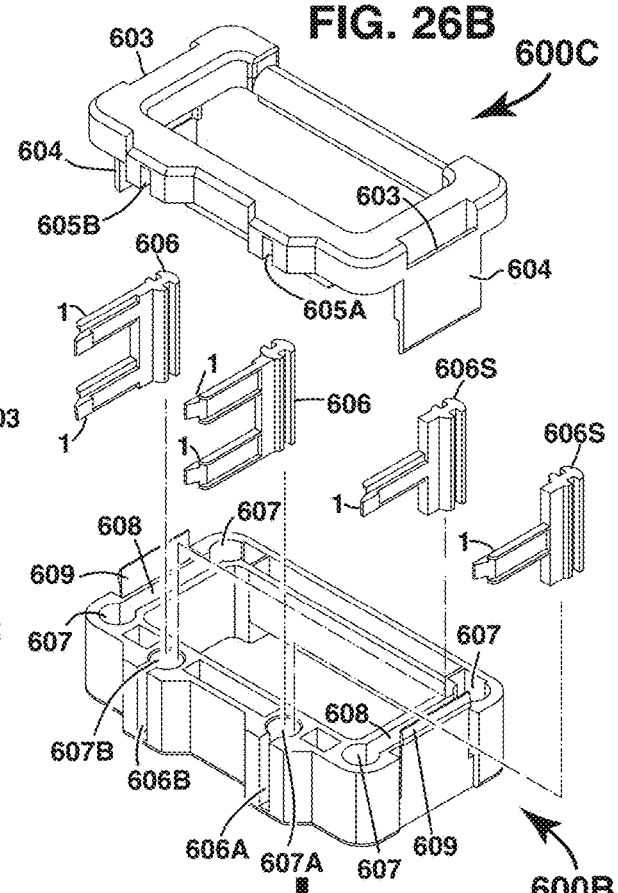
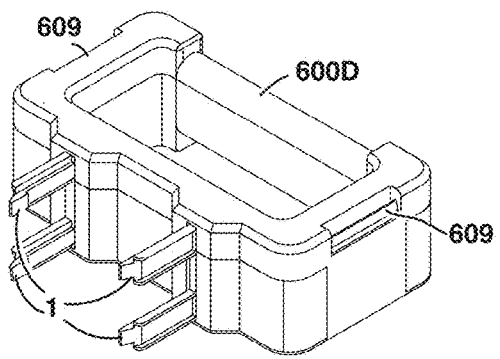
Release Tool (dual gang)
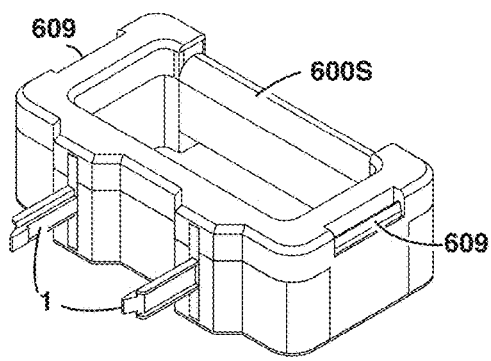
Release Tool (single gang)

METHOD AND A TESTER FOR TESTING AND VERIFYING THE CONDUCTIVITY OF OPTICAL CABLE SEGMENTS LINKED WITHIN A CASCADED INFRASTRUCTURE OF SMART RESIDENCES

RELATED APPLICATION(S)

This application is a continuation-in-part of U.S. application Ser. No. 15/917,135, filed on Mar. 9, 2018, which is incorporated herein by reference.

BACKGROUND OF THE INVENTION

1. Field of the Invention

This invention is related to combining electrical wiring devices including switches, hybrid switches, relays, AC outlets, and/or communication connectors, terminals or sockets for electrical, optical, RF and/or IR signals, including chargers, IoTs and AC devices mounted into intelligent support boxes or frames.

2. Description of the Prior Art

The common wiring devices shown in FIGS. 1A-D of the prior art are individually connected by wires to the device terminals, shown wired and mounted onto a frame, with the frame mounted onto a well known electrical wall boxes.

Removing the individually wired device for service or replacement is a process that is not too complex, but takes time to complete. First by removing a surrounding decorative frame, followed by removing the frame from the box and step by step disconnecting the wires from the device terminals, the device from the frame, and re-installing a new, replacement device.

The re-installing of replacement device, calls for a reverse process that is not too complex either, but takes time to complete. The time in this sense is far more costly than the cost of the device itself, as the removal and install must be carried by licensed electric professional and not by a user of the system. Decorating plates or frames surrounding the switches, relays and AC outlets, including decorative keys that are used for switching on-off electrical appliances, such as lights, water boiler, air conditioners, heaters and any other electrical equipment and appliances in residences, offices, public building, businesses, hotels, restaurants, factories and the like are very well known.

The well known decorative plates, panels, frames and key covers are injected by plastic materials in different colors, shapes and sizes, or by glass keys and frames disclosed in U.S. Pat. No. 9,608,418. The support frame for the varying AC wiring devices are disclosed in U.S. Pat. No. 9,219,358.

Further, the U.S. Pat. Nos. 7,453,686, 7,461,012, 7,639,907, 7,649,727, 7,864,500, 7,973,647, 8,041,221, 8,117,076, 8,148,921, 8,170,722, 8,175,463, 8,269,376, 8,331,794, 8,331,795, 8,340,527, 8,344,668, 8,384,249, 8,441,824, 8,442,792, 8,742,892, 8,930,158, 9,018,803, 9,036,158, 9,219,358, 9,257,251 and 9,281,147 disclose home automation controls, connections, intelligent outlets, hybrid switches, switches, relays and accessories for operating electrical appliance via add-on devices such as the SPDT and DPDT relays or current drain sensors, RFID tags for identifying the load and operating appliances via hybrid switches, including hybrid switches operated via mechanically or magnetic latching relays.

The U.S. Pat. Nos. 9,219,358 and 9,608,418 hereafter 358' and 418', are further introduced herein by reference particularly for disclosing in details the support boxes that are mounted into electrical wall boxes and the wiring devices being attached into the electrical support boxes by a plug in action. The structure of which are shown in FIGS. 2A-9D for the purpose of identifying the elements involved in the release and remove process by a push of a release bars of release hand tools, or bare push bar(s).

With the expanding demand for home automation devices there is a need to replace and introduce "easier to install, set and remove" devices, and/or change the look of the frames and keys, be it simple color change or other architectural needs, and There is a need for a solution to simplify the devices installation into intelligent or non-intelligent support boxes disclosed in U.S. Pat. No. 358' making the installing process of a device a simple process of a simple "plug into the box".

There is a need to introduce a simple "remove process", by a simple "push-in bars" individually inserted or plurality of push-in bars assembled into hand tool for simplifying the pull of a given wiring device from the support box by an electrical installer or by a user (a tenant) of a given premise.

SUMMARY OF INVENTION

The main object of the present invention therefore is to provide the installers and/or the users of "plug-in electrical wiring devices", and/or "plug-in communication devices" with at least one "release bar", "insertable into" at least one "channel of ramps" for unlocking at least one "lock ramp" of a "plug-in device" plugged into a "support box". Wherein said at least one release bar is included in a plurality of bars of a given "hand tool", for insertion into more than one channel of ramps for releasing a locked "plug-in device" and pull the device by a given "pull element" structures into said release bar or said hand tool providing a simple "push-in inserting action" and "a pull action" of the plugged-in device from the support box including a "support frame".

The term "electrical wiring device" as referred throughout the application is the well known, commonly used light switch, AC outlet and any combinations of switch(es) and outlet(s) in premises, be it residence, public building or businesses for switching on-off or dim lights and providing electric power sources to appliances.

The electrical wiring devices are mounted in well known wall boxes such as 2"×4" or 4"×4" in the US, or in 60 mm round or rectangular (in different sizes) in Europe, or square boxes in the UK and China, and are connected by electrical wires directly via screw, push or other wire supporting terminals.

The term "gang" as referred throughout the application and in the claims is a well known term for specifying a wall box size. The number of gangs is a given number of AC wiring devices that can be mounted into a given box. A gang can also be a reference to the width size of a given wiring device. The hybrid switch disclosed in the present application is having a single gang width size of approx. 23-26 mm (or approx. 1") to be used as one of standard common switch width used in Europe and the US.

The term "insertable into" as referred throughout the application and in the claims refers to an insertion of the release bar by hand direct or by using a support holder of an hand tool into a "channel of ramps".

The term "channel of ramps" as referred throughout the application and in the claims is at least one spaced area between a "plug-in device", also termed "plug-in low voltage device" or "plug-in communication device" or "plug-in AC powered device" and a "support frame" of the "support box" enclosing the "lock portion" of a "lock arm", "guide grooves" and "stop ridges" of the frame. With the plug-in device comprising a reciprocal lock ramp, a pull ramp and a reciprocal guiding convexes, wherein the "channel of ramps" provide the access for the insertion of the insertable release bar for releasing the lock ramp from being locked by the lock arm.

The term "lock ramp" as referred throughout the application and in the claims is at least one elevated structure having a slop terminated by a sharp drop step, structured onto the outer surface of a plug-in device for sliding into a support frame via the slop and be locked by a locking indentation, reciprocal to the sharp drop step, included in a bending lock arm of a support frame.

The term "release ramp" as referred throughout the application and in the claims is at least one protruded structure, similar to and reversely structured above the "lock ramp" in a position enabling the "release bar" to be inserted into said "channel of ramps" for reversely bending the lock arm, release said lock ramp and engage the release ramp's drop step, for pulling the plug-in device away from a lock state.

The term "plug-in electrical box" and/or "plug-in device box" and/or "plug-in box" and/or "low voltage plug-in box" and/or "plug-in support box" and/or "support box" and/or "standard plug-in box" as referred throughout the application and in the claims is a plug-in box or a casing, sized and shaped, to include the frame of and intelligent support box designed or otherwise similar to the disclosure in U.S. Pat. No. 9,219,358 of the prior art including at least one updated gang structured channels of ramps for providing a release and a pull of a plugged in device.

The term "push-in inserting action" as referred throughout the application and in the claims is the first action for releasing the locked plug-in device in contrast to the inserting action of the plug-in device into the frame and into the support box that is termed throughout the application and the claims to be a plug-in or plugged in action for locking the plug-in device to the support frame.

The term "pull elements" as referred throughout the application and in the claims refers to an element or structure for enabling the pull of a released plug-in device outwards away from the support frame to at least a point where the pulled plug-in device is accessible to further pull and removed by a bare hand of the person operating the one of and at least one release bar or a hand tool comprising plurality of bars.

The term "removal" as referred throughout the application and in the claims is an action of removing the released plug-in device from the support frame and the support box, pulled by at least one release bar or by plurality of release bars tied together by a cord, or plurality of release bars attached to an hand tool or by plurality of release bars assembly combined with a structured hand tool for pulling the released plug-in device by bare hand or by a further pull of the released plug-in device gripped or clutched by the release bars.

A decorative keys or other keys structured or attached to the plug-in switches or hybrid switches, including decorated keys with tinted glass or tinted crystal or molded plastic decorative keys or other molded keys as disclosed further below are structured to provide access for the release bar insertion with no obstruction to the release, pull or the removing action.

The term "plug-in communication outlet" or "low voltage communication outlet" refers to the known communication outlets such as plugs, sockets and combinations thereof for telephone, internet, USB, audio, TV or cable TV antenna, an RF antenna or optical cable, each occupying at least half gang space can be plugged-in in pairs and released in pairs by a pair of inserted release bars, or be removed individually by inserting a single release bar, enabled by a convex and concave structured guides separating the two.

A dummy or the term "blank insert" refers to a dummy structure having a size and shape of an half gang plug-in communication outlet for occupying the other half gang surface is introduced whenever only single half gang size outlet is needed.

The hand tool combining two release bars including a bare hand held two release bars for removal of switches, hybrid switches, relays, integrated switch-relay, IoT, touch pad and communication sockets occupying a single gang space, by inserting a pair of release bars into the two channels of ramps via the channel's accesses all the way to the stop point, thereby release the two lock ramps on both sides of the plug-in device and pull the released plug-in device away from its locking arm.

The term "hand tool" covers and including a bare hand held release bars for removal of switches, hybrid switches, relays, integrated switch relay, IoT, touch pad and communication outlets occupying a single gang space be it by a single, a pair or four release bars inserted into one, two or "n" channels of ramps, regardless if the individual release bar or bars are tied to a cord or attached together by a knot or to a pull handle or individually loose.

AC outlets, IoTs, connectors, sockets, and chargers occupying dual and/or "n" gang spaces are released and pulled away from the lock arms by four release bars or by plurality of "n" release bars or a hand tool combining "n" release bars for devices occupying more than two gang space of an intelligent support frame and box.

The term "outlet" including low voltage supply sockets or low voltage communication sockets including a feed of low voltage power for operating IoTs (Internet of Things), AI's (Artificial Intelligence) sensors, processors, communicators and/or controllers, via charger circuit included in the support box fed via given terminals or given connector, each constructed to be compatible with an "attachable device" in a size matching a single gang or plurality of gangs is referred hereafter and/or in the claims to be a "standard plug-in outlet".

The "attachable device" or the "standard plug-in outlet" are in contradiction, to the references disclosed to a similar, smaller or larger currently used AC switch or AC outlet of the prior art, known to be and referred to hereafter and in the claims as a "standard size AC switch or outlet".

The terms "standard switches" and/or "standard outlets" are referred to the known to be wiring devices that are mounted directly into "a standard electrical wall box", such as the known 2×4" or 4×4" wall boxes in the US, or such as 60 mm round European electrical wall box or other square or rectangular electrical boxes as used in Europe, UK, Australia or China and are shown in FIGS. 1A-1D (the prior art) in the present application, none of which is a plug-in device.

The term(s) "standard plug-in switch(es)" and/or "standard plug-in outlet(s)" (also to outlets referred to above) and/or "standard plug-in outlet" or "standard plug-in device(s)" that are supported by the support frame and box including the connection to AC power line by a plugged in terminals are referred to hereafter and in the claims as "standard plug-in AC device".

The above defined terms are needed to avoid confusion and misunderstanding of the lock and release actions of the present invention that cannot be equated with the known wiring devices assemblies mounted into wall boxes by different means, none is attached or released by a plug into and lock the body of the device and its terminals by plug-in action, and none is released and pulled away by a single simple action.

The term "standard plug-in AC switches" as referred throughout the application and in the claims refers to any switching semiconductor, or electromechanical, or manually operated switching element or combined elements, such as a triac, an FET switch, a relay, an hybrid switch, a manual switch and any combination thereof encapsulated in a size and shape fit the support frame and include at least two channels of ramps and accesses for the release bars to be inserted.

The term "standard plug-in AC outlets" as referred throughout the application and in the claims refers to AC socket of any known country and types be it two pin or three pin socket, with and without ground terminals, with or without inner movable safety covers for any known given safety standard, enclosed in a casing size occupying at least two gang space and four of said "channel of ramps" and accesses for four or more release bars.

The term "standard plug-in device" or "standard plug-in enclosure" as referred throughout the application and in the claims is at least one device or enclosure selected from a group comprising a switching device, an outlet device, a communication device, a communication connector, an IoT device, an AI device and combinations therefore enclosed in a size and shape fit the support frame and box including at least two channels of ramps and accesses for at least two release bars.

The term "attachable device" as referred throughout the application and in the claims is at least one device selected from a group comprising a switching device, an outlet device, a communication device, a communication connector, an IoT device, an Ai device and combination thereof enclosed in a size and shape and channels of ramps different from the size, shape and channels of ramps as well as different size and shape of the "standard release bar and is calling for the establishment of new sizes and structures for installing one of plurality of given plug-in devices or given plug-in AC switches and AC outlet/sockets that are differing in shape and sizes but not in the basics of plug-in devices that are installed by plug-in action and released in the same process of push-in, release, pull and remove.

The release bars disclosed above are all moulded bars made of hard plastic material, that is rigid to last, yet for some applications, installers and users may prefer to use a metal release and pull elements.

To provide such a release and pull bar and elements an another embodiment is structured by removing the release ramp from the channel of ramps and introduce dual release tongue on each of the sides (left-right) of the single gang device such as hybrid switches.

For the two gang devices, such as the plug in AC outlets, the release tongue is structured with dual release elevated ramps for the two channel of ramps, with the release ramps of the two release tongues are amended to provide a single rectangular cutout in each of a springy formed metal sheet for pulling a single reciprocal release ramp for pulling by the dual tongues the two gang plug-in AC device (the AC outlet) or IoT (as an example), wherein the metal sheet or the tongue provide for good clutching and for removing the single gang and dual gang devices away from the supporting box and frames, being clutched by the springy formed metal sheet all the way after and through the release and through for complete removal.

The decorating surfaces of keys and outlets are preferably further including decorating surfaces of communication connectors such as the known RJ-45 or USB connectors for connecting routers, printers and other PC peripherals and/or antenna socket or audio socket for connecting low voltage devices via audio connectors, cable television connectors, television antennas or dish antennas to be all in similar standard enclosure, to form a standard structures and sizes fitting the plug-in structures of the hybrid switches of the intelligent outlets.

Thereby unifying the structure and the architectural finishing of an expanding range of "wiring devices" be it AC power, DC power, PC and peripherals, audio, TV, IoT (Internet of Things), AI (Artificial Intelligence) and combinations thereof, all to be in a "standard plug-in device" measured in gang size, such as half gang, single gang or "n" gangs.

Accordingly the term "outlet" refers to hereafter and in the claims to an expanded range including AC or DC power outlets, and to other wall mounted PC and peripheral connectors, telephone connectors, audio connectors, TV antenna connectors, cable TV connectors, and other connectors used for connecting AC or DC appliances including the expanding the range of the support frames and the support boxes or intelligent support boxes. The examples of the half gang size and shape as disclosed below and are shown in FIGS. 4D, 5C and 12C-F.

The terms "flat outlet surface" or "flat switch surface" or "touch screen surface" refers to an outlet or a switch key having a flat front surface aligned with the entire flat panel including the decorative frame surface, and further including the surface of a plug-in touch screen device having a size and a flat surface of an outlet or a switch key, or of a whole panel including the decorative frame.

Another important practical object of the present invention is to provide lower cost decorative panels, frames and key covers to a given hybrid switches and power outlets installed into given intelligent support box disclosed in U.S. Pat. No. 9,219,358.

The term "hybrid switch" refers to hereafter and in the claims to one of relay/switch combination and mechanical latching relays used for electrical automation system disclosed in the referenced US patents, having front surface and body size and shape including the touch panels to be in identical with the outlets and/or the hybrid switches.

The term "standard size and shape" is the other objective attained by the present invention, providing the hybrid switch with a structure that can be fitted with different key levers such as flat push and flat rocker key and the freedom to select any from a wide variety of levers and decorative covers and frames sizes including variety of design and colors that are available and are being regularly introduced to the construction/electrical industry by the different switches manufacturers and can be defined as having half width size of a given outlet, or having the outlet at twice width size of a given "flat key".

"Flat key" refers to hereafter and in the claims to a flat keys of an hybrid switch operated by a push throughout the key surface and to flat key or keys of a manual toggle or rocker switch operated by a push of a designated/indicated area of the push key and with the outlet having the same flat surface and height of the key, and wherein the body structure is having standard size and shape, including the locking elements, guiding elements, height and given single gang width or plurality of gangs or "widths" combined.

To simplify the term "standard size and shape" the present invention and claims use the term "gang" to be the reference to a size and a shape of a single switch, hybrid switch, a relay or a touch pad such a single touch pad and other accessories having a single gang size and shape for operating at least one given appliance, by for example an intelligent IoT device.

Accordingly the term "single gang" is defined as the standard shape and size of a given switching device or operating device for at least one given appliance. Single gang occupies a single mounting space within the support box. "Single gang touch key" however can include two or more touch icon for operating more than one given appliance.

The term "dual gang" device is the size and shape for introduction a wiring device, such as at least one AC outlet as used for any known outlet in any given country or region. The "dual gang" occupies dual mounting spaces within the support box.

A dual gang AC outlet may combine two AC sockets, while a single gang switch can provide for SPST (single pole single throw), SPDT (single pole dual throw), DPST (dual pole single throw) and DPDT (dual pole dual throw) switching devices.

"Multi gang device" is defined as a device occupying a space of three or more gangs of the support box, including but not limited to Ai (Artificial intelligence) or IoT (Internet of Things) device having complex circuits and/or sensors and/or requiring n optical and/or RFID accesses into the supporting box, or requiring support boxes with different optical or RFID signals band width, mandating different optical transceiver and or RFID antenna.

The intelligent support boxes disclosed in U.S. Pat. No. 9,219,358 communicate between a chain of cascading boxes via POF (plastic optical fiber) or other "optical cable" recited in the claims or via RF antennas. The practical limit to optical or RF signals is due to the electrical and building codes prohibiting an introduction of low voltage copper lines between or into a wall box including support box mixed with AC live or neutral lines or wires.

The POF or silica fiber cable is a fire retardant and a perfect insulator that is permitted to be mixed and mingled with AC power wires to and from wall boxes between any given AC appliance and AC source. The disclosed intelligent boxes are linked in a cascaded chain or directly linked to a controller via POF or optical fiber cable. The preferred connection is via each end of a POF being terminated by a sharp cut, using POF guillotine cutter.

The terminated end of POF is attached to an optoport by push-in action, disclosed to be locked into the optoport by locking a screw. Alternatively, the cut end (terminated end) can be locked by a simple push-in via structured lock element with no supporting tools. The solution of which makes all the element of the intelligent box(s) to be plugged-in, be it the electrical wires, the POF and the plugged-in devices, including AC operated and AC powered devices, such as IoT, that cover different functions and specification. Particularly IoT and/or Ai devices that need to be linked to the electric and/or the home automation grid, to perform at least one function, such as referring to humidity, temperature, illumination, movement and the other known environmental sensing is included in the other "standard plug-in device", discussed and referred to above. The introduction of IoT and Ai devices into the interior electrical grid is another major object of the preferred embodiment of the present invention.

There are different communicating IoTs and Ai to consider and to provide for communicating data and commands via different signals such as RF, via given antenna, IR via IR transceiver (transmitter or transceiver), and optical via an optoport disclosed in U.S. Pat. No. 9,219,358, which is communicating at a lower speed for operating electrical appliances and reporting power consumption.

IoT, Ai and other devices call for higher speed optical signal communication for one of communicating data with other intelligent devices (IoTs and/or Ai devices), and/or both communicating the referred to lower speed and/or higher speed via same optoports, or via separate two optical grids. Each individual cascading grid, comprising terminated POF segments (cuts), with each cut is directed to propagate its signals via "four way" optoports. The "four way" lower speed or the higher speed or both are provided for propagating commands and responses to and from electrical devices between appliances and a controller communicating a short protocols and commands at a lower speed.

The expansion of the communication to higher speed is to provide the IoT and Ai devices with higher speed circuits operating the artificial intelligence devices (or a given appliance) that communicates data and/or mixed data and protocols. Thus, the providing of higher speed for data propagation is essential.

The low or high speed cascaded optoport require each optoport to comprise dual optical transceivers each for two way communication, i.e., receive or transmit in two direction, such as respond to command or data, or propagate the command or data to the next optoport of the next cascading intelligent box in the cascading chain, be it for lower speed, higher speed or combined.

The single cascading optoport operating in a two direction, each of the two way is in fact a joint crossing point of dual two way or "four way" junction to optical signals, such as receive command, respond, transmit the command to the next (cascading segment) and await for a response and re-propagate the response to complete the four way exchange.

The propagation of optical signals can be therefore viewed as actual four ways. The repeated responding to the initial transmission are a reverse propagation in each direction, this random reversing magnifies the incidences of signals collision that is reduced substantially with the lower speed signals by detecting on going propagated signal activity, detected by the receiving element of the optoport transceiver.

The lower speed signals, such as the use of short protocols with five byte, as disclosed in U.S. Pat. No. 8,170,722 referred to above, to the lower speed, such as below 1K bit per second, can be detected by the opto transistor used in the opto transceiver disclosed in U.S. Pat. No. 8,340,527. A detection duration of 0.5 mSec., as an example, provides sufficient time for the blocking or preventing the opto transmitter of the optoport from transmitting.

For higher speed signals the detecting and processing time may be insufficient to prevent collision, and moreover, for higher speed optical signals such as 100K bit and above the use of photo transistors is not recommended. The photo transistor processing speed is slower and the photo transistor amplification is non linear, introducing speed limits. For higher speed the use of photo diode or optodiode is preferred.

On the other hand, the photo transistor provide self amplification, but signals detected by opto diode need to be amplified, timed and shaped by added circuits which are costly. Further, the multi processing represents a time delay in the sensing of light or propagated activity of signals via the cascaded POF and therefore cannot be effective to ensure no collision.

The cascaded chain of POF cuts for higher speed communication is yet another object of the present invention, including a newly devised optoport comprising direct optical access to optical elements of a transmitter, a receiver including a signal sensor for sensing optical signal presence and a circuit for controlling the transmission start time.

The newly introduced optoport elements and circuits substantially upgrading the intelligence capabilities of an intelligent IoT and Ai boxes of the preferred embodiments of the present invention.

The introduction of higher speed optical grid into the intelligent support boxes of an electrical grid of a given premises, introduces higher speed grids, cascading between group of boxes. The installing of such higher performance grid cannot be completed without the grid being tested and verified to be performing as designed, or be tested and adjusted/corrected to perform as designed.

For such purpose, it is preferable to provide for the expanded capability (covering the lower speed cascading grid and/or the higher speed cascading grid) a measuring devices. This considering that many installers of electrical devices are not fiber optic communication installer, or are knowledgeable in optical signal propagation. Such state mandates an introduction of varying testers, covering the whole range of testing in the practical need for the cascading lines and the grid performances.

The optical testers can be combined with a calibrating tester, for calibrating intelligent AC outlet that measures AC current and calculates the power consumed by a load, disclosed in U.S. Pat. Nos. 8,442,792, 8,594,965 which are incorporated herein by reference.

The invention of optical signal testers along with hand pull tools for release and remove the structured enclosure of the hybrid switches, the AC outlet, the IoTs and Ai devices, covering different sensors for the interior and exterior environments, sensing functions and details that are known, or are unknown at present time, to be introduced in the future, all connected via at least one cut POF segment of plurality of cascading optic segments of POF grid, with each segment is terminated by a simple cut by a terminating guillotine hand cutting tool disclosed in U.S. Pat. Nos. 8,453,332, 8,596,174.

With the combined hand tools form a combined support to electrical installers, adding substantial support to simplify and ease the installation and setting, as disclosed in the many US patents listed above in the prior art section, and introduced herein by reference.

An introduction of the intelligent support boxes into a wall of an occupied premises, be it a stand alone house or an apartment of high rise building will be problematic in many instances, for one, it involve physical construction and may not be accessible to an optical fiber, such as a cut/terminated POF segment to other boxes and/or to a system distributor or controller direct.

To connect the whole of a given plurality of support boxes may require complete replacement of wiring devices and boxes, which is too costly and troublesome to the occupying residents.

For such reasons there is a need to provide the intelligent support boxes and the interior of the premises with wireless grid be it RF or IR in open spaces, whole or part of the element and combinations covering optical, RF and IR or optical and IR, optical and RF, RF and IR.

Further, the referenced U.S. Pat. Nos. 7,973,647, 8,170,722, 8,639,405 disclose two way command converters including optical to RF, RF to optical, optical to electrical, electrical to optical, IR (optical) to RF, RF to IR, IR to electrical, electrical to IR, RF to electrical, electrical to RF and combinations thereof.

Introducing a selection of the converter, all powered by the AC power line, along with the other circuits of the intelligent support boxes provide for segmenting the boxes into confined areas and be cascaded by a segmented communication, be it electrical, optical, IR or RF and/or combinations thereof.

Yet, another object of the present invention is to segment the communication signals and protocols to limit collisions between other non optical signals, such as providing different frequencies and/or modulation to electrical and RF signals, shorten the protocols by reducing bit count, addresses length, including programs and prevent collisions with and between two or more intelligent support boxes in given segmented cascaded line as set, the particulars of which are further detailed in the preferred embodiment descriptions.

Further the well known cordless telephones, operating at 25-60 MHz band for internal communication within a building, using modulated signals, such as FM, AM, ASK, FSK and other well known modulation for max. eight or sixteen zones or channels, using common coded protocols, unified for all frequencies, can be adapted (as an example) to communicate between the intelligent support boxes and/or the standard plug-in support boxes and between plurality of IoT's and Ai's devices, including voice commands via an attached IoT or Ai plug-in device, using well known RF transceivers and antennas.

BRIEF DESCRIPTION OF THE DRAWINGS

The foregoing and other objects and features of the present invention will become apparent from the following description of the preferred embodiments of the invention with reference to the accompanying drawings, in which:

FIGS. 1A~1D are perspective illustrations of the prior art showing the installation and assembling of commonly used wiring devices, including optical controlled relays by cascaded POF segments, decorative covers and commonly used keys of the prior art including the well known glass cover;

FIGS. 2A~2B are perspective view illustrations of the prior art disclosed in U.S. Pat. No. 9,608,418 (418') showing dual gang support box for installing AC outlet or dual hybrid switches of the prior art, updated with pull elements of the preferred embodiment of the present invention;

FIG. 2C is showing perspective views of the structured elements for installing by plug-in, and locking single gang SPST, SPDT, DPST, reversing DPDT and dual gang plug-in AC outlet of FIG. 2B disclosed in U.S. Pat. Nos. 9,219,358 (358') and 418', including a single or dual socket with one or dual entries for one or dual RFID and/or optical accesses of the prior art, updated with pull elements of the preferred embodiment of the present invention;

FIGS. 3A~3B are perspective view and illustrations of the assembling of three hybrid combinations of switch-relay, or hybrid switches of the preferred embodiment of the prior art (U.S. Pat. Nos. 358' and 418') including a detailed glass elements of the decorative covers and keys, as updated with pull elements of the preferred embodiment of the present invention;

FIGS. 4A~4C are perspective illustrations, showing particulars of the positions of the lock arms of the support frame and of the channel of ramps for the "standard plug-in AC switches and outlets" of the preferred embodiment of the present invention, including the showing of the pull elements, the RFID tag and the optoport for communicating with an RFID tag or an appliance via an AC plug with built-in front optoport of the prior art.

FIG. 4D shows a perspective view of the half gang communication outlets of the preferred embodiment of the present invention;

FIGS. 5A~5C are perspective illustrations showing four gang support boxes including frames and decorative covers of the prior art (Pat. 358' and 418') and the intelligent boxes of the present invention for supporting a range of AC outlets and hybrid switches including the pull elements in an identical size casing covered by molded plastic and cut glass frames and keys;

FIG. 5D shows a perspective view of the single and dual gangs communication outlets, including power and communication terminals of the preferred embodiment of the present invention;

FIGS. 6A~6C are perspective views and illustrations showing the six gang support boxes showing the versatility of the intelligent boxes of the prior art (Pat. 358' and 418'), updated with pull elements of the preferred embodiment of the present invention, for supporting hybrid switches and AC outlets as used in the different countries or regions of the world, in an identical standard size plug-in casing;

FIGS. 7A~7C are perspective views and illustrations showing the eight gang support boxes and the versatility of the intelligent boxes of the prior art (Pat. 358' and 418') as updated with pull elements of the preferred embodiment of the present invention outlets as used in the different countries or regions of the world;

FIGS. 11A-11E are perspective drawings showing the versatility of low voltage plug-in connectors and connection particulars and the assembling of the connectors into the plug-in enclosure and prior to insertion into the low voltage plug-in support boxes of the preferred embodiment of the present invention;

FIGS. 12A-12D are perspective drawings showing the low voltage plug-in devices including IoTs and Ai devices linked via extended cables, POF and terminals to the low voltage plug-in support boxes and further show the combination of IoT device and AC outlet as updated plugged into the intelligent support box (FIG. 12C) of the prior art of the preferred embodiment of the present invention;

FIG. 14A-14C are illustrative circuit diagrams showing the prior art optical access for slower speed signals and the upgraded optical accesses for propagating higher speed signals including the generating of intend to transmit command for providing traffic control signal to a cascaded optical network;

FIGS. 16A-16D show illustrative drawings of an optical tester series, including a responder for testing and verifying the connectivity and signal propagation within the optical grids, be it the lower speed, the higher speed, and combined, including an updated calibrator tester of the prior art, by using a tester adaptor to be attached to the prior art calibrator.

FIGS. 17A-17E are block diagrams showing the electrical-optical circuits of the standard plug-in support box, and the different optical signal testers, including the block diagram of the added-on adaptor for use with the calibrator/tester.

FIG. 18 is a block diagram of the intelligent support box of the prior art, shown to be similar to at least in part of the circuits used within the embodiments of the present invention;

FIGS. 23A-23E are illustrations showing the lock and release elements of the plug-in boxes and devices including the release steps and process from prior to insertion of the release bar into and up-to the removal of the pulled plug-in device;

FIGS. 24A-24D are illustrative drawings showing the combining of a cord tied release bars for removing two gang plug-in outlet by four release bars, a single gang plug-in hybrid switch by dual release bars and an half gang plug-in device by a single release bar, with FIG. 24C showing the half gang structure of the preferred embodiment of the present invention;

FIGS. 25A-25C are illustrative drawings showing the other preferred embodiments of the present invention including a molded or structured holders for the release bars, structured for sliding into guided tracks of a molded handle, or assembled by screws to structured holder assembly, for unlocking and removing a single gang or dual gang plug-in devices of the present invention by a single push and pull action;

FIGS. 25D and 25E are illustrative drawings showing a molded handle similar to the handle in drawings 25A-25B but with release and pull elements using hard metal formed rails for the release elements and rectangular cut slots into a formed springy metal sheets for the pull elements, onto top and bottom of an AC outlet and dual sides of hybrid switch shown to be reciprocal molded release ramps onto the plug-in devices, of the other preferred embodiment of the present invention.

FIGS. 26A-C are illustrative drawing of a molded hand tool and release bars, structure for self assembly for single gang and dual gang removal, with the release elements detailed in FIGS. 23A-25C are enclosed in the body of the hand tool, that is convenient and compact to carry and the main preferred embodiment of the present invention for a release hand tool.

DETAILED DESCRIPTION OF THE PREFERRED EMBODIMENT

Figure 8:
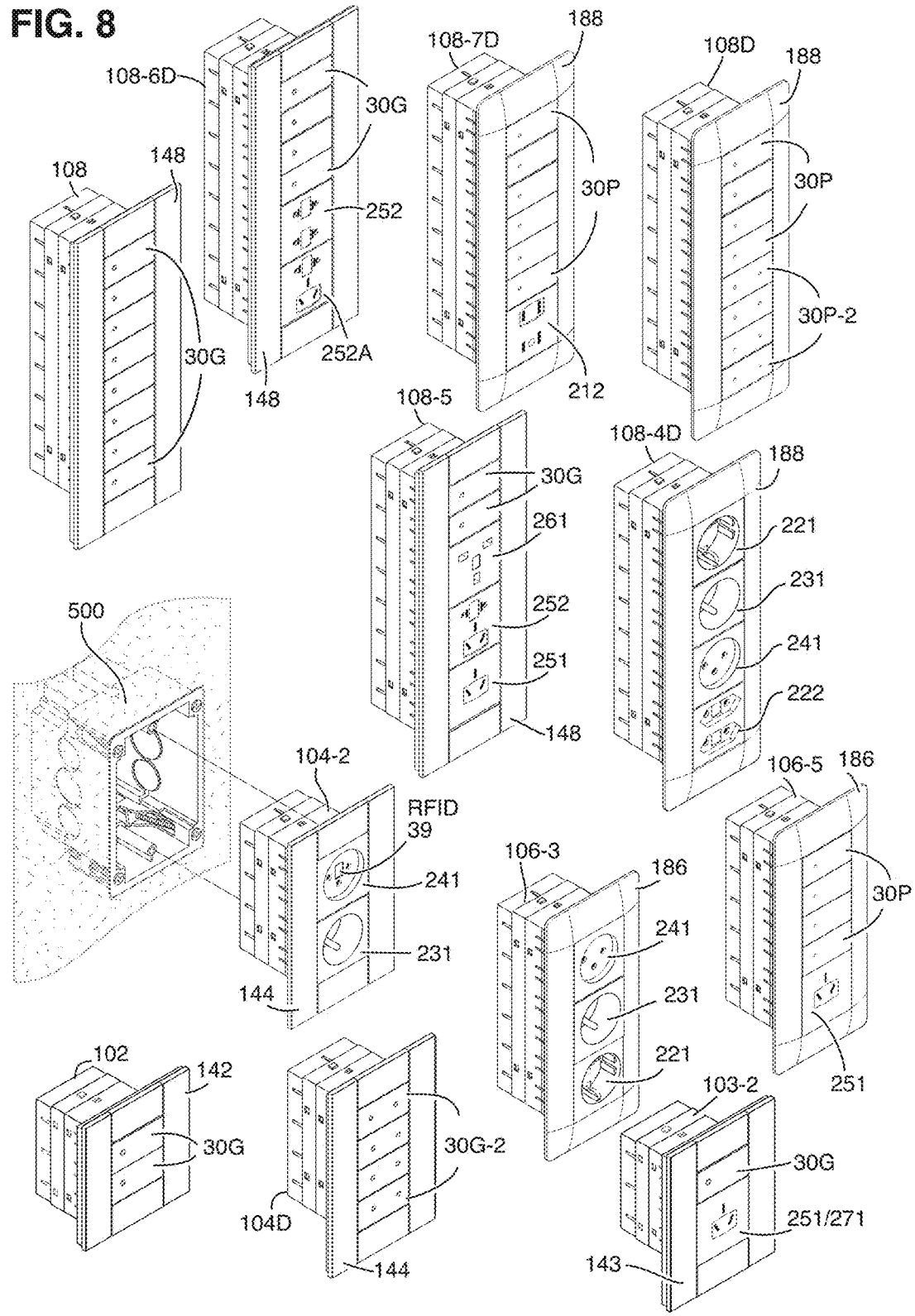
FIG. 8 shows a perspective views illustrating the different support boxes that can be mounted vertically for supporting modified power outlets, shown in FIGS. 2A-7C, updated with pull elements of the preferred embodiment of the present invention, structured for mounting into vertical column boxes and an example of a typical wall box for the four gang support box.

FIGS. 1A-1D show and illustrate the known standard electrical wiring devices and wall boxes and frames for attaching the individually wired devices onto support frames, with the entire devices are wired and attached to the frame. The frame is attached by frame attaching screws to a three gang wall box shown in FIG. 1A and further show the mechanical attachments into four gang wall box FIG. 1B.

The wiring of the individual standard wiring devices are shown, as an example, in FIG. 1C.

The well known decorative glass frames is shown in FIG. 1D that is the known prior art of the standard wiring devices, or electrical wiring devices, that are wired and mounted individually onto the shown support frames or directly into the wall boxes.

In clear contrast the wiring devices of the present application are termed hereafter and in the claims "standard plug-in devices". Shown in FIGS. 2A-8 are plug-in wiring devices disclosed in U.S. Pat. Nos. 9,219,358, 9,541,911 and 9,608,418 that are introduced herein by reference.

The communication outlets 44-AU, 44-ANT and 44-C of FIGS. 4D and 5C are not disclosed in the above references 358', 911' and 418' and are further shown in greater details in FIGS. 12B and 12D and 24C-24D are discussed in details separately.

FIGS. 2A, 2B and 2C show the structured elements used to mount (install) two switches or hybrid switches 3-S or the AC outlets 211 (a standard US outlet for 3 pin plug) into a two gang support box 102. The switches or the hybrid switches comprising SPST 3-S and SPDT 3-D of FIG. 2C and two dual poles versions, reversing DPDT (cross-straight) 3-DR and DPST 3-DS shown in FIG. 2C.

FIG. 2B also shows the decorative cover 142 with two push keys, all glass covered. FIG. 2A shows the two gang support box, or the intelligent support box 102, attached to the two gang support frame 11-2.

All the references to the elements in FIGS. 2A-3A above are references to basic elements used for the plug-in devices of the preferred embodiment of the present invention, wherein each basic detailed element is used for plug-in insertion of the plug-in devices referenced with numerical 3-S, 3-SD, 3-DR, 3-DS, 211, 212, 222 and other outlets shown and disclosed throughout the application.

The electrical connections to plug-in devices by push pins are referenced with alpha numeric L, L1, L2, T, T1, T2, N, and coil terminal 38, or the ground receptacle GR. The stop ridges are referenced with 12 (the support frame), 22 (the dual gang) and 32 (the single gang), guiding grooves 14, convexes 34, lock ramps 16 (the support frame), 26 and 36, bending lock arm 18, and pull ramps (also termed release ramp) 27 and 37.

FIG. 2A further shows (partially covered) the receptacle opening LR for the plug-in Live AC terminal L of the switch or hybrid switch S-3.

FIG. 3A shows the receptacle opening LR (uncovered) of the three gang box 103 and frame 11-3 and the three switches/hybrid switches 3-S repeating the shown elements pertaining to the plug-in switches and outlets, i.e., terminals L and T, the guide grooves 14, the convexes 34, the stop ridges 12 and 32, the lock ramps 16 and 36.

FIG. 3A further shows the locking receptacles 13 and 13A that are also shown in FIG. 2A. The locking receptacle 13 and 13A are for locking the decorative frames by a push, be it plastic molded frames such as 183 or glass covered frames 143 or 142 of FIG. 2A. The locking and releasing the frames are disclosed further below in connection with FIGS. 9A-9B.

FIG. 3A further shows the glass elements GL and GL3 for the decorative glass frame 143 that are bonded to a moulded base frame 153 as well as the decorating glass covered keys 30G including the transparent portion shown as round indicator area 3-IN but can be other decorative shaped indicator areas, such as star, square or other decorative motifs.

The glass frame and the glass covered keys are disclosed in the prior U.S. Pat. No. 9,608,418 recited above. Some differences can be identified between the shown glass covered keys in the 418' that are cuts made to the moulded portion of keys, to enable a free access to the release bar of the present application into the "channel of ramps" details of which are disclosed further below.

FIG. 3B shows a different support box 103D structured to connect, control and operate dual throw and/or the dual pole switches or hybrid switches, including the DPST 3-DS that switches on-off the live AC via terminals L and TL and the neutral AC via terminals N and TN shown in FIG. 2C, the terminals of the reversing DPDT 3-DR that reverses the dual traveler terminals T1 and T2 connections with each switching action, and the SPDT 3-SD known as three way switch, or switch over the live terminal L from terminal T1 to T2 or from T2 to T1.

The reverse action, such as switch over, or the dual pole switches, such as DPST 3-DS or reversing DPDT (known as four way switch) 3-DR use three or four terminals, for which the support box 103D provides.

The support boxes further shown in FIGS. 4A-9B are therefore provided in many different versions for combinations of switches, outlets, be it in non intelligent support boxes connected via plug-in terminals and/or receptacles into reciprocal receptacles and/or terminals and with full supporting intelligent circuits, power consuming calculation and reporting/communicating via RFID antenna or optical transceiver, or directly with an optoport of the intelligent box or via the plug-in outlets, shown to be structured for the different types and standard AC plugs, used in different countries and regions.

The commonality of the plug-in AC outlets is in their common plug-in structure and the plug-in terminals that are common to all types wiring devices and/or other outlet or standard plug-in devices of all countries and regions.

All are enclosed in a standard plug-in device be it half gang, single gang, dual gangs, or n gangs. Same applies to the introduction of IoT's and AI's plug-in devices of FIGS. 12B-12D, including but not limited to environment plug-in sensors shown in FIGS. 13A-13C.

FIG. 3B further shows the moulded decorative cover 183 and the moulded decorative keys 30P, that use no glass cover, but otherwise provide same structure, length, width and height that can be exchanged or replace one with the other, by the users, by simple remove and attach process, as disclosed further below. Transforming the fixedly installed prior art wiring devices, into self updating designs, color and finishing, with the ability for self selection and by the user self replacement.

FIG. 4A shows the three gang box model 103A for supporting one three pin outlet 211 and SPST switch or hybrid switch 3-S, with the outlet 211 is provided with sensor entry SE shown in FIG. 2C for optical transceiver 38-OP or for RFID antenna 39 of FIG. 4C respectively, for communicating with RFID tag 39T, attached to standard 2 pin AC plug 222P.

Both the optical sensor and RFID antenna are disclosed in U.S. Pat. Nos. 8,422,792; 8,594,965; 8,639,465 and 8,930, 158.

FIGS. 4A-4C show the elements shown in FIGS. 2A-3B pertaining to the steps of plug-in, lock, release and remove the plug-in devices. The two decorative covers, the moulded cover 183 and the glass cover 143 including the keys, the moulded key 30P and the glass covered key 30G, with both types of keys include the transparent indicator portion (window) 3-IN.

FIG. 4D shows the two gang support box 902-T containing four half gang plug-in outlets, including telephone outlet 44-TEL, network outlet 44-NW, antenna outlet 44-ANT and audio outlet 44-AU, shown to include the elements for plugging-in two half gang outlets, shown in the support box 902-T covered by a glass frame 142, recited to be and referenced with the same element numericals shown for the plugging-in, locking, unlocking, releasing and removing the hybrid switches shown in FIGS. 2A-4C.

The terminals 45 of the half gang outlets 44 shown in FIG. 4D are further discussed in connection with FIGS. 5D, 11D, 12D and 24C-24D.

FIG. 5A shows the four gang support box 104 with the glass decorative frame 144 with the four hybrid switches 3-S, the glass keys 30G, the indicator windows 3-IN, the lock ramp 36 and the pull ramp 37, and the terminals L and T of the switches. All other elements are identical to the element shown in FIGS. 2A-4D, and need not be repeated.

FIGS. 5A-5C are introduced to illustrate the commonality of the many combinations of the support boxes and the standard plug-in devices of the present invention.

FIG. 5B shows the box 104-2D for two plug-in AC outlet, 211 with three pin US outlet and the US outlet 212 with dual 2 pin sockets, each with one of optical 38-OP communication transceiver access and the other with RFID antenna 39 at the top end of the structured RFID sensor 39 shown in FIG. 4A for communicating at least one way of bidirectional communications with RFID tag 39T or RFID antenna inside the AC plug (not shown).

FIG. 5C shows the four gang box 104-3 to include single US 3 pin plug-in AC outlet and two SPST hybrid switches 3-S. The combined assembly is shown to be covered by the moulded decorative cover and moulded key 30P with indicators accesses. The particular elements for the plug-in outlet and switches are not referenced in full, and the numericals are limited to the stop ridge 22, the guiding convex 34, the lock ramps 26 and 36 and the pull ramp 27, such that FIGS. 5A-5C cover most of the elements involved in the plug-in, lock, release and remove elements. FIG. 5C further shows references to the neutral AC terminal N for the plug-in AC outlet and the terminal L (live AC) for one of the two switches shown.

FIG. 5D shows the single and dual gang plug-in communication outlets, shown in FIG. 4D enclosed into an half gang plug-in outlet.

The details of the communication outlet, including the IoTs and Ai outlets are discussed further below.

FIGS. 6A-6B show the further combinations via six gang boxes, namely 106, 106-3, 106-4 and 106-5. Support box 106 of FIG. 6A is shown with three SPDT 3-D and three SPST 3-S plug-in switches, three with dual indicator windows and three with single indicator windows. The assembly in the support box 106 of FIG. 6A is covered by glass decorative frame 146 and glass keys 30G-2 and 30G respectively. FIG. 6B shows identical switches covered by moulded decorative frame 186 with moulded keys 30P-2 and 30P respectively.

The other six gang support boxes 106-3 shows three plug-in outlets 221 (DE/EP), 231 (FR) and 241 (ME and EP) as used in the middle east and Europe, and the assembly of UK outlet 261 and dual 2 pin outlets 222 (ME and EP) are also covered by decorative glass frame 146.

FIG. 6B further shows the six gang support box 106-5 containing four 3-S(SPST) plug-in switches operated by moulded keys 30P and US plug-in socket 211 with optical access 38-OP (shown in FIG. 6C).

FIG. 6C further shows the different plug-in outlets and hybrid switches shown in the six gang boxes of FIGS. 6A and 6B.

FIG. 6A to FIG. 8 are illustrative presentation of the many different combinations including support box sizes such as the eight gang shown in FIGS. 7A-7C. The not shown are the larger support boxes, such as the 10 and 12 gang support boxes and frames for as many as 12 plug-in single gang devices, or the many other variations of given sizes and shapes of the support boxes and combinations thereof. This includes dual (parallel) 6 gang frames within a single box for controlling/reporting up to 12 single gang plug-in hybrid switches or six AC outlets combinations thereof or other structured intelligent support box shapes and sizes.

FIG. 8 covers one such variation, wherein all the intelligent support boxes shown are for vertical mounting into vertically installed wall boxes. Presenting all the sizes referred to above and any combinations thereof, including the communication plug-in outlets and outlets for plug-in IoTs and Ai combinations (not shown), or provide for directly plug-in connection for IoTs, Ai and/or combinations thereof.

The IoTs and the Ai plug-in devices communicate from close proximity (literally face to face) with the RFID antennas 39 and/or the optical transceivers 38-OP for linking the IoTs and AI communication devices with AC support boxes and communicate the data pertaining the device activity via the optical grid connecting said support boxes to a controller or to appliances and/or via the optical grid of the intelligent support boxes, including via other grids such as wireless disclosed in U.S. Pat. No. 9,541,511, that is incorporated herein by reference.

IoTs and Ai plug-in devices can also communicate via bus-line via data or protocol converter for reporting power consumed, statuses and other particulars, including appliance or IoT reporting self statuses. Appliance or IoT may need to coordinate reported data by other IoTs or appliances, including the appliance or the IoT location within the premises are discussed further below.

Figure 9A:
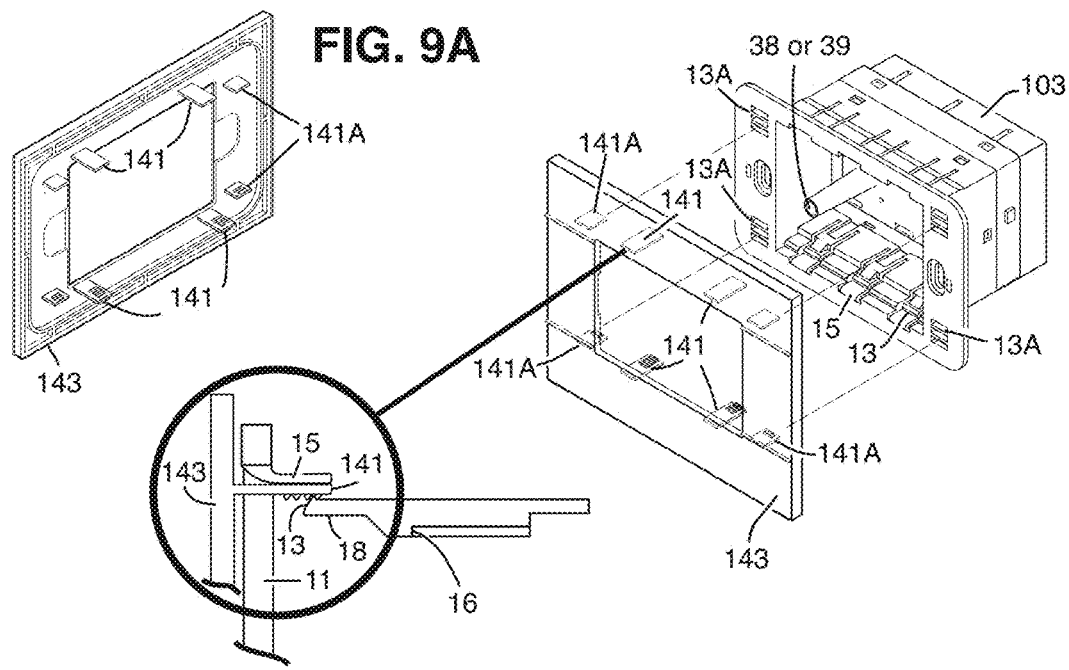
FIGS. 9A~9B are illustrative and enlarged drawings showing the elements for attachment of the decorative covers onto an installed support frame including the particulars of the structured elements for attaching of the decorative frames.
Figure 9B:
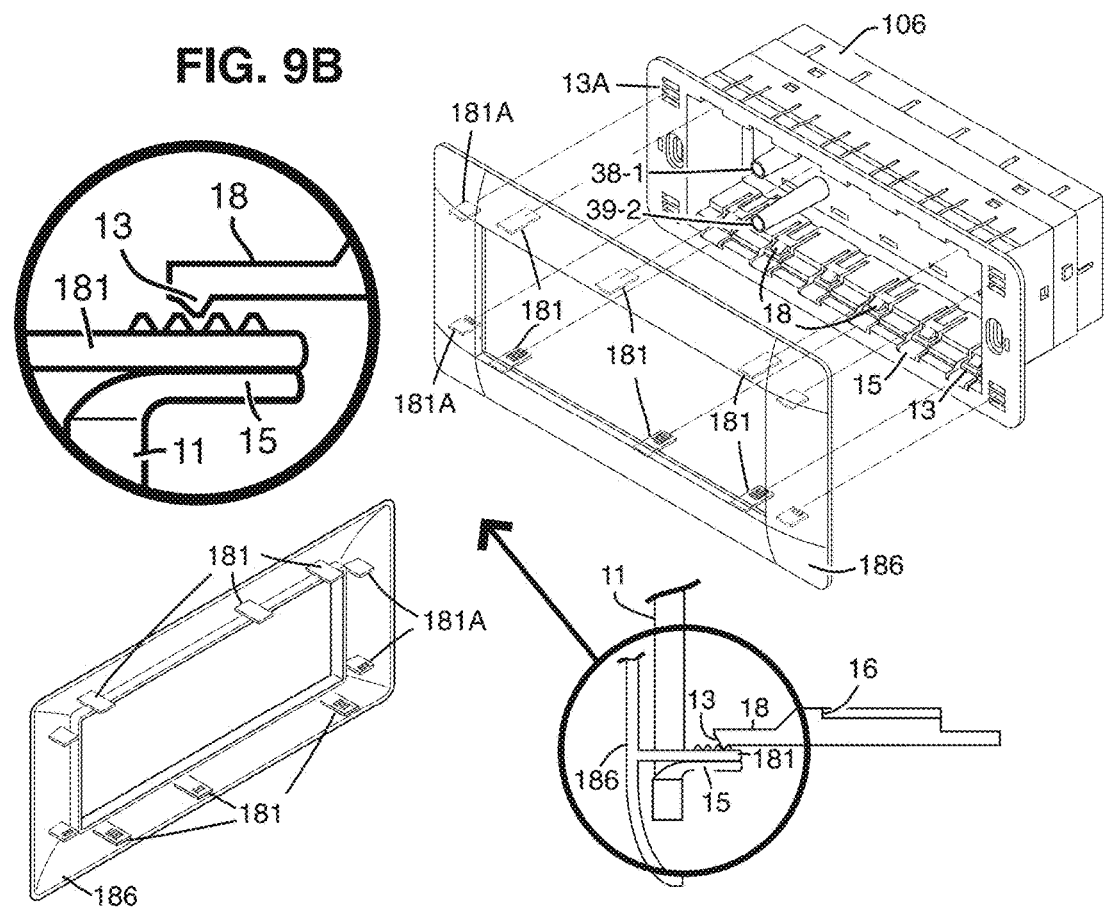

FIGS. 9A and 9B illustrate the locking elements used for attaching or removing the glass decorative covers 143 or the moulded decorative cover 186, shown as an example. The attaching or removing the decorative covers are necessary for covering or for accessing the channel of ramps of a given plug-in device.

All plug-in devices plugged into the shown support boxes 102-108, and the 110 (10 gang) or 112 (12 gang) (not shown), of the preferred embodiment of the present application, cannot be plugged-in or removed from the support frame without a first step, which is the removal of the decorative cover from the support frame and box (any size).

For providing clear description of the introduced reference numerals to AC outlets in FIGS. 7A-7C and FIG. 8 the below outlets referenced numerals shown are the different outlets as used in the many countries and regions of the world. Each AC outlet is provided for mating with a given AC plugs of the different countries and regions standards.

The reference 211 refers to the US 3 pin AC outlet also used in Japan and other countries;

212 refers to dual two pin sockets of US outlet as used also in Japan and other countries (the 2 pin AC socket is used also in China);

221 refers to the two round pin and ground contacts of the German and other European countries AC outlet including some Asian countries, such as Korea;

222 refers to dual two pin sockets as used in Germany, French, the middle east and many other European, Asian and South American countries, including China as an example;

231 refers to the 3 pin outlet as used in France and Belgium, includes the dual round pin sockets and a protruding round ground pin;

241 refers to 3 pin outlet as used in the middle east and some European countries;

251/251A are the single and dual sockets for two combination (round (DE) and flat (US) pins and three flat pin including ground pin as used in China;

261 is a three rectangular pins as used in the UK and also in H.K.;

271 refers to three flat pins as used in China and Australia.

FIG. 9A shows the glass decorative cover 143 as used with the support box 103 (any type or version thereof). The cover 143 shown to include two different serrated lock bars, four shorter bars 141A aligned with lock structures 13A are used mainly for small support box, such as 102 of FIG. 2A.

The reason for using the shorter serrated bars with the lock receptacles 13A is the need to have the serrated lock bars at the four corners of the decorative cover. In the example shown, the support frame of the support boxes 103 and 106 or larger support boxes, a firm locking can be provided with no reliance on the four corners by the shown longer serrated bar 141 or 181. The 141 and 181 serrated bars ensure proper lock onto the wall surface surrounding the support frame for all the support boxes sizes.

Important reason is that the receptacles 13A are located at the two ends of the support frame, in a position outside the support frame inner open cavity, i.e., the receptacles 13A may be positioned in a space against the cemented wall, and cannot accommodate longer serrated bars, such as the longer serrated bars 141 or 181 shown in FIGS. 9A and 9B.

The serrated bars 141 or 181 are inserted into a receptacles 13 inside the support frame inner open cavity. The serrated bars 141A and 181A are shorter to prevent an impossible insertion, wherein the bars 141A/181A are blocked by the cemented wall and cannot be pushed all the way to be flat with the wall.

Further, as explained and detailed below, the insertion of the locking serrated bars 141 into the lock 13 provide for stronger pressure onto the bending lock arm 18 that firmly lock the lock ramps 26 or 36 and further lock the decorative frame onto the wall surface via more than four serrated bars such as the six bars 181 shown in FIG. 9B.

Accordingly it is a question of design choice to introduce n plurality of serrated bars into the different boxes be it only 141A or 141, or combinations thereof, or only 181 or 181A or both.

The enlarged cut view show the lock of the serrated bar 141 locked by a sharp bulge 13 at the top rear edge of the bending lock arm 18. The bulge 13 and the serrated bar are structured for the decorative frame to be firmly locked as it rests flat on the wall surface surrounding the support frame.

The decorative frame, be it 143 or 183 or any other locked decorative support frame size, can be removed from the wall by a firm pull by an installer or the user hands (with no tools).

The serrated bar introduces two advantages, the first is to lock freely and simply by pushing the decorative frame onto the wall by hand all the way to rest flat with the key's surfaces. The other advantage is the securing of the bending lock arm 18 into tight lock position as referred to above, by increasing the flexing arm 15 to a stronger push onto the lock arm 18 to firmly hold or lock the locking ramps 26 or 36 into the lock position, enabling to release the lock only when the decorative frame is removed.

Figure 10A:
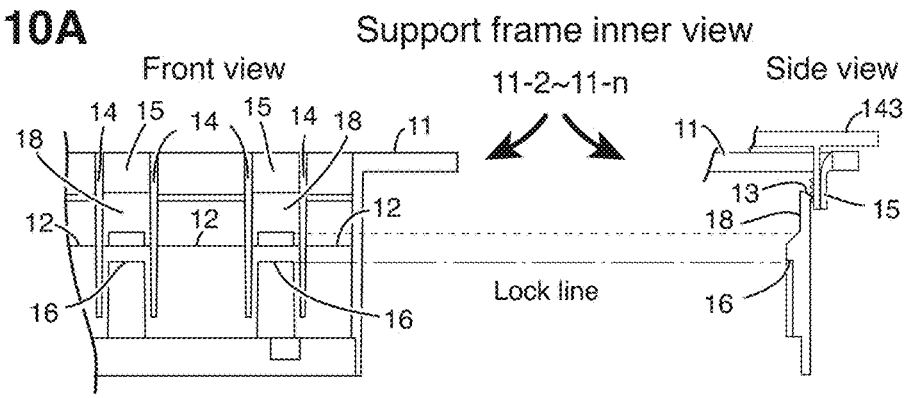
FIGS. 10A~10C are front, rear and side drawings showing the elements for the plug-in, locking, release and the pull of the outlets and hybrid switches from the support frame of the intelligent support box, or the standard plug-in support box including the lock and release ridges and particulars of updated pull elements of the preferred embodiment of the present invention.
Figure 10B:
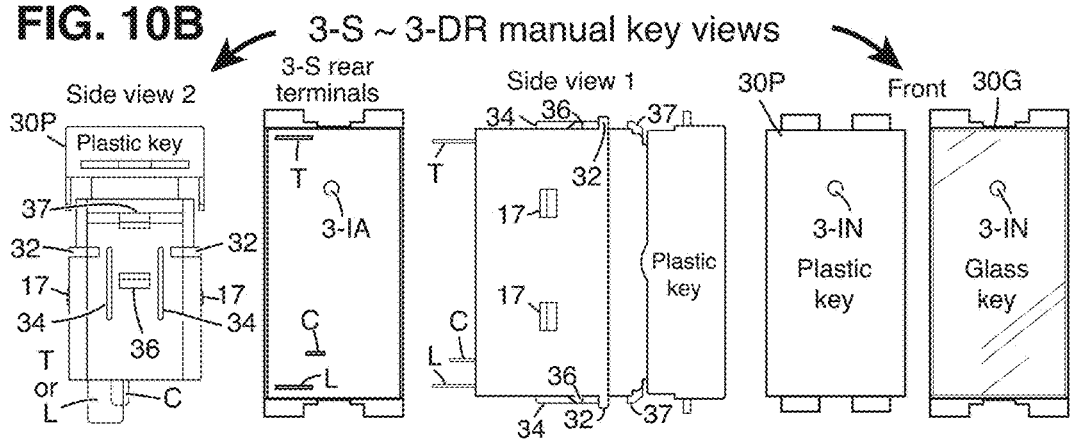
Figure 10C:
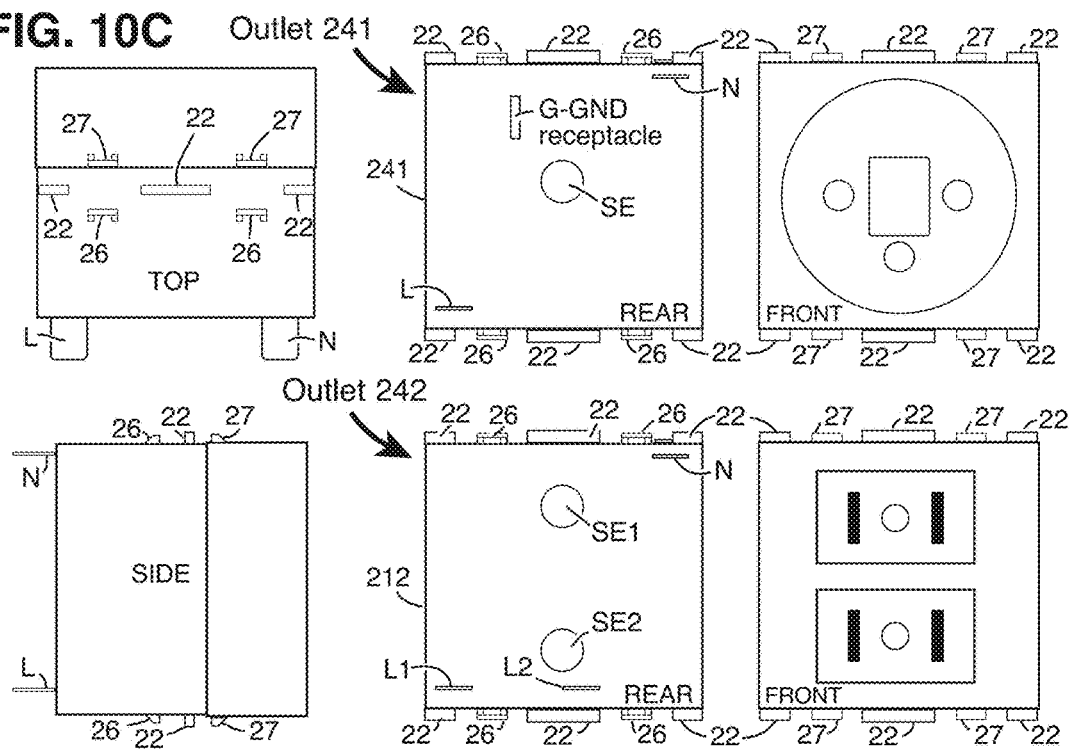

FIGS. 10A-10C provide detailing and summarizing drawings and references to the locking and release elements including the connecting terminals L, N, L1, L2 and the reciprocal socket G-GND of the plug-in AC outlets 241 and 242, including the hybrid switches shown terminals L and C (coil) of switch 3-S and the commonality of the hybrid switches, manual push key for all disclosed above 3-S to 3-DR switches or hybrid switches and of the support frame 11, all shown, disclosed and explained above.

FIGS. 10A-10C are introduced to better illustrate all the "standard elements" of the plug-in devices and the support frame in a simple 2D (dimensional) drawing to review and understand, via single page, combining all the related drawings that are shown in perspective views above.

Accordingly, FIGS. 10A-10C can be referred to be a cover all structures for the plug-in electrical wiring devices, the communication audio, telephone and other low voltage sockets terminals and outlets introduced into structured plug-in enclosure and elements, including the locking portions of devices such as IoTs and Ai and the optical access devices for linking optical POF cable between environment sensors, touch pads, IoTs and Ai devices, used for home automation and are connected via optical link via optoports direct to the electrical support boxes or are connected via an optical linking devices such as 80-84 shown in FIG. 12A, that provide direct or via interfacing optoports to the optical grid OPGL or OPGH or OPGL/H, OPGL+H shown in FIGS. 14C-15.

FIGS. 11A-11E introduce support boxes 902LD and 903LD for supporting a range of well known communication sockets including but not limited to the shown RJ connector 44-RJ, known as RJ45, RJ11 or other RJ connectors known as RJ9, RJ10, RJ25 or RJ61 representing different pins and contacts count, such as eight contacts for RJ45, as used extensively in computers and the internet shown as 44-INT, or connecting the other well known USB connector referenced 44-USB with CAT5 cable 75.

Further introduced are antenna connector 44-ANT and audio connector 44-AU.

The shown connectors are representative connectors, as any type of existing passive connectors can be used to replace the shown connector that are shown in the processed installation in FIG. 11A and installed into the "standard plug-in devices" 51, 52 and 54, categorized by the alpha characters C (circle), R (rectangular) or S (square) and shown in FIG. 11D as 51C to be installed with round audio connector 44-AU and another with round antenna connector 44-ANT.

The other shown audio and antenna connectors are shown in FIG. 11E are dual audio connectors 44-AU, also known as RCA jack, installed into the "standard plug-in device" 52CC having dual circle support for the RCA jack. The other circle connectors, the dual antenna connectors 44-ANT shown mounted on a square metal holder 50S in FIG. 11A, and further is shown installed in dual squares device 52SS in FIG. 11E.

The rectangular shape opening in the connector enclosure 51R of FIGS. 11B and 11D-E, show the installed USB connector having a rectangular shape. The USB connector can be replaced with many different well known connectors having smaller or bigger or other varying sizes connector, most of which are having a rectangular shape. The shown size fit the older USB connector, can be structured to smaller current USB connector or fit other size rectangular or square or circle shape for mounting current and any connectors to be devised in the future.

The connector can be mounted into the enclosure to become as defined above a "standard plug-in device" for mounting the connectors by a plug-in action be it half gang, single gang, dual gang or n gang device. Wherein more than one, two or four small size connectors (not shown) can be introduced in larger number into a single or multi socket "standard plug-in device" structure.

The market is experiencing in the past many years, constant changes in connectors and plugs, that are made smaller, such as used for mobile telephone device and others.

The "non changing surrounds" are boxes and structures embedded into the walls, and the need to establish a standard for "evolving structures", that are evolving and introducing constant changes, make it essential to ensure a simple plug-in and removal of connector and plugs to be replaced by a plug-in action and simple pull removals as disclosed in the present invention.

As shown in FIG. 11A-11E there are many different method and structures to connect different or similar connectors to the support boxes, be it 902, 903, 904 or 912 (not shown).

The support boxes can be structured with passages for communication, antenna, audio shielded wire, twisted pairs and/or multi core cables through the cable accesses CA and be connected in the well known assembly processes shown in FIG. 11A. In the shown example such as using crimping tools 440, or the very well known push tool (not shown) for connecting CAT5 cable to RJ45 connector, or screw on a shielded antenna cable, or solder using well known soldering iron (not shown) to solder the communication wires to the installed socket's pins, terminals or other contacts.

Pushing the cable back into the space behind the support box (within the wall box) for self locking or securing the socket assembly into the shown structured enclosures 51R-54SR-T of FIGS. 11D-E or a not shown 50n enclosure and plugging the assembly into the support box completes the introduction of the socket onto the wall, followed by attaching the decorative cover by a plug-in and push action, for completing the introduction with the box remaining decoratively pleasing, and with no damages to the wall surface.

The support boxes 902D and 903D are the standard plug-in boxes for accessing low voltage communication lines to a given one or more low voltage connector or socket assembled into standard plug-in enclosure. The boxes 902D and 903D shown are used to support (mechanically) standard plug-in device or enclosure, but do not provide power or include circuitry for the purpose of introducing low voltage connectors and/or outlets.

The shown support box 904T is provided with terminals and contacts 65 and 66 for plug-in assembly devices with reciprocal terminals 55 and 56 wherein the terminals 56 are power terminals for feeding low voltage DC power to socket assemblies 54SR, 52CC or 52SS such as shown in FIG. 11E.

The shown assemblies 54SR-T, 52CC-T or 52SS-T incorporate DC power feed through the assembled socket 44-TEL or 44-USB or the antenna socket 44-ANT or for powering a circuit included in the assembly attached, such as shown 52CS or 52CC or 52SS, which are an example, but many such assemblies presently and/or in the future will be introduced.

The connection terminals to the box 904T are identical with the terminals shown in the box 906-M of FIG. 12D showing terminals 65 and 66 including the rear accesses 65A for the wire 65B of the box 903nT that is an example for different box n sizes, including the box 904T of FIG. 11A. Box 906-M further shows two cable accesses CA for the two half gang outlets 44-NW (network) and 44-INT (internet).

The shown terminals are not identified individually, as they may be used or provide for different functions, signals and/or different polarities of signals and are customized or dedicated to a given plug in device, assembled into the "standard plug-in enclosure" that may consist of different IoT's or Artificial intelligent devices.

The power terminals of the support box 903nT are identified as DC+ and DC− terminals for applying DC power to the attached (plugged-in) IoT or Ai devices, but can also be used to feed power to a connected outlet that includes among others a DC power feed function, including the charging of batteries of a given device such as mobile phones, a shaver or a camera.

The shown low voltage devices forming the "standard plug-in device" in FIGS. 11A-11E cover different outlets, connectors connected via attached different cables such as CAT5, antenna cable and shielded cable, or it can be any cable and group of wires pulled via the cable access CA, provided in the support boxes and via connecting terminals 55 and 56 through reciprocal terminals 65 and 66 included in the support boxes, 903MD and 903-2-M shown in FIG. 12B in which the reference M is introduced for denoting "mix" connections such as via pulled cable and via terminals combined.

FIGS. 12A to 12C introduces an expanded range of support boxes and "standard plug-in device" to cover extensively the linking of optical signals with smart home or apartment optical network and grid that are disclosed to be mixed and mingled within the electrical grid ducts and pipes for communicating with and between the elements of the dectrical grid of a given apartment, home, business or public buildings, disclosed in U.S. Pat. Nos. 9,219,358 and 9,514, 490 on one end of the grid and with command converters and/or distributor/drivers, and/or controllers at the other end of the grid.

FIG. 12A shows "standard optical plug-in devices" 80, 81, 82, 84C and 84T structured into a single gang and dual gang standard plug-in enclosures for linking at least one way of a plurality of two way optical signals via optoports and POF terminated cables in many configurations for communicating with IoT and/or Ai devices that may not be attached to the support boxes because of size, such as being large or bulky, or for example by plurality of such IoT and/or Ai devices that need to be communicating together via or with the optical network, be it the higher speed or the lower speed optical communication network or both, or via a combined lower and higher speed network.

Communicating together through or with the shown optical plug-in devices 80-84T may include traffic control or timing circuits to coordinate the communicating optical signals with or via the optical network linked via the support boxes.

Each of the circuits to control the traffic or time the optical signals transmitted at random, include at least one optical transceiver with an optical access 67 shown in the rear of the support box 903nT for linking terminated cut end of a POF cable by a push action into the access 67.

The access 67 is supported by a lock element 67K shown in FIG. 12D, structured into the access, that is released by pushing a release pin 67P into a release opening 67A as shown in FIG. 12D being held by fingers, prior to inserting the POF 69-2 held by given fingers of the other hand.

The POF should not be entered or released into and from the access without pushing the release pin simultaneously with the insertion all the way to ensure physical attachment of the cut end onto the optical transceiver surface. The withdrawal of the release pin 67P from the release opening 67A causes the lock structure to lock the POF into place, i.e., disables the pull out of the POF cut end from engaging the access 67.

Alternatively, a lock screw head can be used for locking the cut POF end as shown in the prior art of FIG. 1C showing a lock mechanism by tightening a screw head upon the insertion of the cut POF cable, or release the screw head locking the access of the cut (terminated) POF.

Figure 13A:
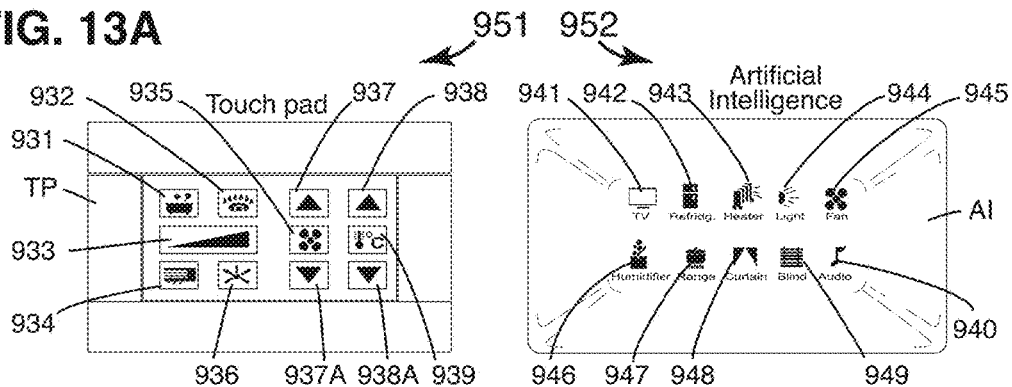
FIGS. 13A-13B are perspective drawings showing plug-in IoTs and Ai devices to be plugged and/or plugged into the prior art intelligent support boxes powered by AC power via built-in power supply into each IoT or Ai device linked via at least one updated optical access for communication and control via at least one optical grid.
Figure 13B:
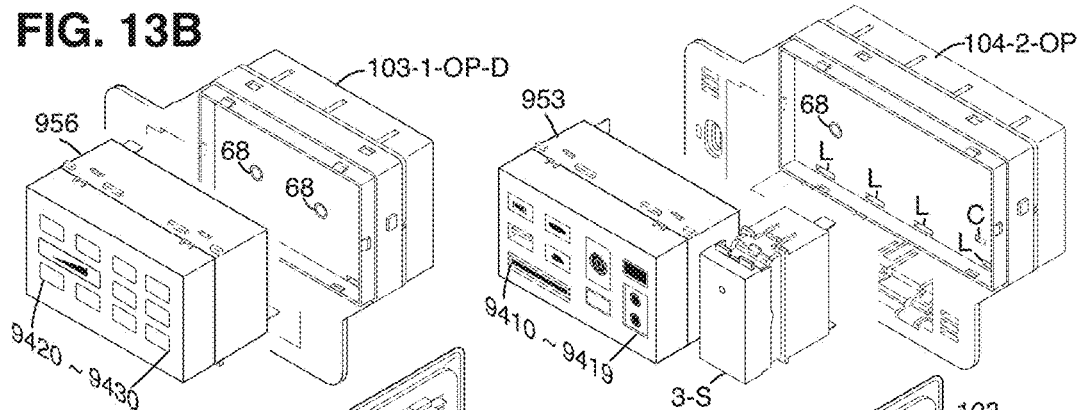
Figure 13C:
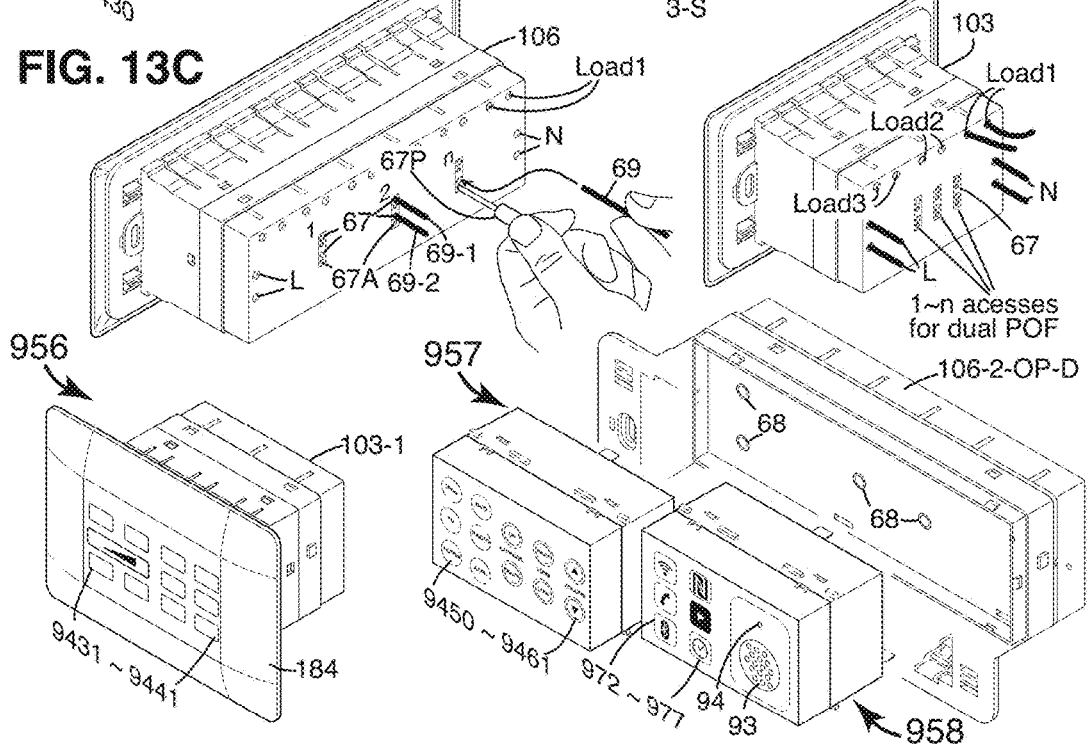
FIG. 13C introduces perspective drawings of the low voltage plug-in support boxes for IoTs and Ai devices and the plurality of optical accesses for POF cuts and direct accesses between the boxes surface and the IoTs or Ai devices or both.

With the attachment of the cut end of the POF explained, the other optical linking via the optical access 68 shown in boxes 103-OP-D, 104-OP of FIG. 13B and 106-2-OP-D of FIG. 13C that are AC powered intelligent support box of the prior art, modified to support intelligent circuits built into the IoT's, Ai and other standard plug-in devices incorporating low voltage circuit(s), that are powered by a power supply powered by AC power and built into the IoT or Ai device enclosure and are attached to an intelligent support box of the prior art as will be explained later below.

Further, the plug-in optical devices 80, 81, 82 and 84T are shown to include terminal 55 and/or 56 for connecting electrical signals and power feed to the shown low voltage devices. Some of the low voltage devices include regulator for regulating the DC power, such as the power fed to the CPU and the optoports via well known DC voltage regulator 87R, shown in FIG. 17A.

The front and rear sides of the optical device 80 of FIG. 12A show two different set-up, wherein the front view illustrates optical cables 69 at both sides, the front via access 67 and the rear view of the optical device 80 illustrates a selective access 67 or 68.

This is important for the understanding the many options and variations provided by the combinations of the POF and the optoports. As the IoT's and Ai's are yet to be massively introduced, the issues involving such introduction into the smart home or automated home or whatever term is given to the anticipated advanced ideas and electronics into residences and/or businesses, the main difficulties such new devices pose is how to link them to the electrical grid of a home or an office or a restaurant or a shop.

The above is due to the prohibition to connect low voltage copper lines (wires) to AC wall boxes or mingled with AC wires.

The signaling at present time for home automation and to very limited appliances that are RF (Wi-Fi, Bluetooth, UHF and other allowable frequencies), some of which include a "traffic" control programming of signal based on carrier frequency and/or modulation etc., but do not provide, at or as of current time, practical means to communicate with the internal electrical grid and its elements as used in buildings, and cannot deny or block wireless "trafficking" from neighboring apartments, houses or buildings.

The inability to prevent collision transforms the propagated RF signal to a non reliable means for communicating in a crowded environment (many electrical devices and elements) within a confine of an apartment or a house, office, or other business unit. The RF will be discussed further below.

The "bulky" or a large IoT or Ai device referred to above, is a reference to an outer size or dimension of an IoT or Ai devices. Such large IoT or Ai device may, for example, need to be placed on a shelf or be structured into an enclosure in a shape of a framed art work (not shown) hanged on a wall, to camouflage an Ai device to be a framed painting. Such device will over cover the support box and its decorative cover.

The larger device need to be linked and powered via at least one plug-in device discussed later below. The need to link optically via terminated cut POF is provided via, as an example, the optical accessing device 80 of FIG. 12A. Hence the need to provide at least one optical access to a cut (terminated) POF via the plug-in device top cover, shown to be provided in the devices 80 or 81 of FIG. 12A, can be a physical guide for inserting all the way to an access 68 shown in boxes 104-2-OP or 906-M of FIGS. 12C-12D.

Such device with at least one access shown as 80, 81, 82 and 84 or 84T can be used for such purpose. The device 84T is shown with the cover 84P removed, revealing four accesses 67A each with the release opening 67B, same as shown in FIG. 12D discussed above.

The POF 69 introduced through the plug-in device 84 of FIG. 12A are shown to exit the rear of the body 84C. The POF is entered into the shown access 67A and locked by the release pin 67P as explained above. In fact shown four (or more) POF cables can be introduced through the front cover 84P of the plug-in device 84, two are shown in the plug-in device 82 or all may be reduced to one only POF terminated by cut.

The introduced POF cut into an access 67 that provides entry all the way to the surface of the optical transceiver 68, inside the box 906-M and locked into position via the release pin 67P used against the release opening 67B of the plug-in device 84T.

With the one and up to four, or more (not shown), the linking of the four (or more) POF cut are attached and locked to the inner cover 84C. The process is complete by attaching the top cover 84P of the enclosure, using its mechanical lock bars 84A and the bar receptacles 84B for locking the top cover by a push-in of the cover onto the enclosure to complete the POF connections between the larger or bulky IoT or Ai device to the "standard plug-in optical device" 84, or 82 or 81 which can be structured the same way, with the exception of the number of optical accesses.

The "standard plug-in optical device" can be further structured in at least two ways, one is for providing optical link via (for example) dual optical accesses 68, one at the rear surface of the optical plug-in device and the other at the front surface of the support box be it 102-112 or 902-912 box, having their transceiver optical surface aligned with the physical surface of both the support box and the rear of the "standard plug-in optical device" and with both are positioned to face the other optoport 68 directly, to provide direct linkage between each receiver and each emitting transmitter, in a perfect alignment, improving substantially the communication flow.

The circuit and the power feed for the plug-in optical devices with the optoports 68 are connected via the terminals 65 and 66 respectively. The signal terminals 65 and the power terminals 66 are either connected to the elements of the circuits of the box 903nT including the DC power feed via the terminals DC⊕ and DC ⊖, but can also be separately fed by a solid wire 65B (such as AWG24 as used in a solid twist pair), to be inserted by a push into the push-in receptacle 66A. Same apply to the identical signal wire 65B inserted by push in to the receptacles 65A, shown in FIG. 12D.

The other optical link between the standard plug-in optical device and the support box 902-912 is, for example, via the optical device 84T shown with its top cover 84A removed provided with push-in terminals 65 and/or 66 (not shown) for feeding DC power and connecting signals between the IoT or the Ai device and the support box, such that the plugged in optical device 84T including a built-in insulated DC power supply for DC power feed to, as an example, the large framed artwork Ai device referred to above.

It is further possible to use the optical device 84T as a junction connector for both the optical via n optical accesses at the surface of the plug-in support box and via the push-in terminal, in many combinations, in which different circuits can be introduced into a given "plug-in optical module", for connecting "specific" or "customed" or "selected from a group" of "plug-in optical modules" for connecting different IoT's and/or Ai on the basis of differing functions, speed, structure and usage.

Moreover, the shown intelligent support box 103-2 of FIG. 4A and the AC outlet 211 (US) of FIG. 4B show the direct optical accesses 38-OP to be engaged with the AC plug 211P optical access by plugging the AC plug 211P into the AC outlet 211. This enables the circuits referred to the "standard plug-in optical module" be incorporated into an AC outlets or an AC plug for the most simple plug-in solution for a portable or movable IoT and/or Ai device, that is not installed into or onto a wall.

The circuits to control the signal's traffic are discussed further below.

From the above explanation, it should be clear that the use of the "standard plug-in optical devices" introduces a whole new concept and practical solutions for propagating and trafficking optical signals, using any optical cables such as fiber optic cable or plastic optical fiber having different core diameter, including a preferred 1 mm diameter core size of the POF cable that offer a perfect solution for optical communications, covering the whole of smart home's devices communications in a cascaded optical linking, within a confine of an apartment, office, shop, restaurant and other business units.

The introduction of the optical access 68 onto the front surface of the intelligent support boxes enables to introduce IoT's and/or Ai devices, such as the shown camera 98 into an AC powered intelligent support box 104-2-OP of FIG. 12C. Three cameras are shown in FIGS. 12B, 12C and 12D. The camera 98B is attached by a cable (CAT5 for example) through a passage CA in the box 903-2-M of FIG. 12D that also includes dual optical access 68, and the camera 98B is powered by or via contacts 56.

The camera 98A of FIG. 12D is shown to be linked via the optical access 68 and powered via the terminal 66 shown in the box 906-M, and as referred to above, the camera 98 is shown powered by AC power and is linked via the optical access 68 of the intelligent support box 104-2-OP of FIG. 12C, clearly attesting the high flexibility to adapt IoT or Ai devices to different structures, powering, signal speed, electrical connections and power feed.

In the shown examples, the voice (or audio) box 954A is shown in FIG. 12D connected to the terminals 65 and 66 of box 906-M, but it can be differently connected via any of the connections disclosed above for connecting the cameras 98, 98A or 98B.

The providing of intelligent or smart or IoTs or Ai devices with connections capabilities such as contacts 55 and 56, or AC terminal L and N and/or GND, or a direct cable connections, or an optical link directly via optical transceivers of the smart devices and the intelligent support box, and/or via optical cable passing through the "standard plug-in optical device", enables different linking and connecting configurations, so as to fit a given structured "standard plug-in device" in many forms, including large and bulky IoTs and Ai devices that can be linked to either intelligent support 102-112 boxes or to 902-912 standard plug-in boxes or simply to "support boxes" and beyond.

The non detailed elements of FIGS. 12A-12D discussed above are briefed below to show the inter compatibility between the different boxes and the standard plug-in devices.

As referred to above, the electric and building codes deny any introduction of low voltage wires into electrical wall boxes that are a simple mechanical box, made of metal or plastic materials, or to any devices fixedly attached to, or to be attached to the electrical wiring device (within the wall box).

The codes however do not deny the use of AC operated devices that include low voltage circuitry, built into (internal) to the device, such as mobile phone charger. The codes deny any wires or terminals connecting the low voltage circuitry (non insulated), from being exposed or connected to and from the socket access (front) of such AC operated device.

In the present invention, this issue is well preserved. One is connecting low voltage devices via low voltage support boxes or intelligent or smart boxes 902-912 (908-912 are not shown).

The shown and/or disclosed smart or intelligent support boxes 102-112 are structured for the linking of optical signals via optical cable to optical accesses that are permitted to be included, mixed or mingled with electrical wires within the box interior or the wires ducts and pipes or outside or in the vicinity of the electrical wall box and wires.

FIG. 12B shows the support box 903MD for attaching three single gang standard plug-in devices. The shown standard plug-in devices include dummy device 52D to cover a non used single gang space, with other standard plug-in dummy devices (not shown) for covering unused plurality of gang spaces.

The second standard plug-in device is the shown standard plug-in optical device 82 with dual optical accesses shown as 67, but can further include the release opening 67A or be accesses 68, as referred above to the shown optical device 82, or the shown optical device 80 or 84C, but with dual optical links. The third is a plug-in outlet 44-Tel in an enclosure 52S-T discussed above, for connecting a telephone line to a fixed line telephone.

FIG. 12B further shows a low voltage support box 903-2-M for supporting a camera 98B operated on low voltage feed via terminals and communicate via a connected cable 75, such as CAT5 or similar cable with fewer twisted pairs, such as three pairs only, and an outlet 44-AU+44ANT, wherein the antenna cable feeds power to a parabola antenna with power fed through the standard plug-in device 52CC-T via the terminals 56 and 66.

FIG. 12C shows an intelligent support box 104-2-OP that is a four gang box with a capacity to support dual AC outlets of the prior art. The shown optical access 68 is the modified optical access 68 discussed above to be an optical access 68 aligned to be flat with the box inner surface, for enabling optical link to, in the present example, the camera 98.

The camera 98 is the camera that includes an AC switching power supply (not shown), a lens 44-CM, an illumination sensor 91 and a flash light 92 for taking picture in under illuminated areas. The camera 98 is adjacent to an AC outlet 211, described above to be a standard plug-in AC device (US 3 pin outlet). The combination of AC powered camera 98 and AC outlet 211 with optoport OP-38 plugged into the intelligent support box.

The U.S. Pat. Nos. 9,219,358 and 9,341,911 of the prior art show and disclose the optical access to be an optical sensor structure as shown in FIG. 12C to be extended through the sensor entry SE shown in FIG. 2C of the AC outlet 211 or 212. Accordingly it should be obvious that the joining of the camera 98, be it IoT or Ai device, with the AC outlet 211 into the intelligent AC support box is in full compliance with the building and electric codes.

FIG. 12D shows six gang low voltage support box 906-M for introducing five standard plug-in devices, including the referred to above audio or voice box 954A with microphone 94 and speaker 93, similar to the disclosed speakers in U.S. Pat. No. 8,131,386 structured into two gang standard plug-in enclosure, powered and communicated via the terminal 66 and 65 disclosed above.

The other standard plug-in device, a camera 98A similar to the referred to above, but powered and operated by low voltage DC via terminal 66 and/or 65. The other standard plug-in devices shown are dual 44-ANT outlets in a single gang 52CC-T, and dual half gang enclosure 51S and 51R both connected via CAT5 cable 75 to their assembled outlets 44-INT (internet) and 44-NW (network) with the cable fed through the shown cable accesses CA.

The combinations or the mix of the different support boxes via low voltage bus line and DC power grid, the AC power grid and the optical grid attached to electric grid via the different intelligent support boxes 102-112 or larger.

The low voltage support boxes, the different standard plug-in devices, the different powering and connection methods, via different sockets and outlets and different plug-in devices to include electrical wiring devices, low voltage devices, IoT's and Ai devices in a mix and match, into a common optical grid or grids, combined with the electric grid and/or further combined with the low voltage grid, is vast in its combinations capabilities.

The above should make it further clear and obvious to be providing flexibility and practical low cost solutions to the smart homes and smart cities of the future and enhances the practical usability of IoT's and Ai devices, to be designed with simple to install onto wall by a plug-in action and simultaneously connect the IoTs and Ai devices by the same plug-in action.

FIGS. 13A-13C disclose such future IoT's and Ai devices that are not defined at present time, but are known to be communicating via Wi-Fi, Bluetooth or other RF signals with no standard of installing, powering or connecting to the residences, businesses or public premises. The IoTs and the Ai are looking for means to make them practical, which is a major object of the present invention.

The functions of the shown IoTs and Ai devices in FIGS. 13A-13C are not what the present invention and claims are. Their physical structure, signaling, powering, optical links and connections are one of the major objects of the present application and claims.

Wherein the IoT 951 and Ai 952 of FIG. 13A are attached by plug-in action to the wall as a single unit, or as a separate standard plug-in enclosure and a cover all front panel. Wherein the plug in enclosure and the front panel are attached with the ability to be detached from the support box for the purpose of removal as will be disclosed further below.

Wherein the IoT 951 and the Ai 952 are plugged into a support box 103-OP, 103-OP-D (dual optic grids (or dual optical speed signals) to link and communicate via a single optical grid), 104-OP or 106-2-OP-D with plug-in devices, may include or not include, the serrated bars, such as 141 or 181 shown in FIGS. 9A and 9B.

The issues involved are the holding force of the devices and the attachment to be flat with the wall surface, that is a user choice, for a selective structures, a single structured devices to include a decorative frame or a whole cover into a single structured unit, or combined into one support box, two or more separated unit and/or structures, such as shown in IoT 956 of FIGS. 13B and 13C, wherein the 956 of FIG. 13C is combined into a single structure.

Both, IoT 951 that is shown as a touch pad for controlling heating temp. 939 via "up" 938 and "down" 938A touch icons, and further provide for controlling an HVAC 934 with up-down touch control icon 933 including the HVAC fan 935 via "up" 937 and "down" 937A icon, water heater (boiler) via touch icon 931, oven via touch icon 932 and ceiling fan control via touch icon 936.

The Artificial intelligence Ai device 952 shows icon display and indicators to indicate and display environment statuses for identifying the statuses of varying environment appliances and of the environment sensors, including statuses of shutters, blind and curtains and/or other elements shown as symbols or icons 940-949.

The IoT's and Ai's shown in FIGS. 13B and 13C are shown assembled into standard plug-in devices with n gangs, such as the IoT 956 of FIGS. 13B and 13C is shown to be a three gang plug-in device with dual optical accesses 68.

The optical accesses 68 are shown in the inner front of the intelligent support box 103-OP-1-D. The IoT device 956 includes DC power supply regulator powered by AC power fed via the rear terminals L (live) and N (neutral), such as shown in the rear of the box 106 of FIG. 13C.

The intelligent support box 104-2-OP is an AC powered support box for combining IoT and hybrid switch 3-S into the electric and optical grids. The rear surface of the intelligent support box 104-2-OP is similar to the shown support boxes 103 and 106 of FIG. 13C, with its entire connections are to N and L AC terminals and to one, two or n pairs of dual in-out optoports shown as 67 for the POF cut end 69, secured into place by the release pin 67P.

The "optoport" is a trade mark by the applicant for one or two way optical accesses, for propagating one of two way optical signals, through each optoport, thereby providing a junction for a four way optical signals via single cascaded line of optical cable.

The single cascading optical cable is shown in FIG. 1C of the prior art connected to an optoport of a relay and the next cut is shown connecting the other transceiver of the first optoport with a first optoport of a second relay, with the second (other) transceiver of the optoport of the second relay is shown connected to a next cascading POF cut, disclosed to be (the link) to the next optoport.

As explained above, two or more band widths for optical signals propagating lower and higher speed signals via one or two grids, may be provided for the optical communications with the IoT's and Ai's of a given premises. As will be explained further below, the circuit and the optoport optical elements and the CPU costs are higher than those of the lower speed and/or lower band width propagated by the intelligent support boxes of the electrical grid, operating via a lower speed signals, explained later below.

The approximate number of wiring devices for common residential unit of 120-150 m$^2$ (1200-1500 feet$^2$) is fifty, and approximate twenty five intelligent support boxes (103~104). The larger boxes 106-112 are very few or none in residences.

The CPU and the optical transceivers for the intelligent support boxes (102-112) are low cost elements. Linking all the cascaded POF lines via single high speed to cover all optical communications, including the low voltage support boxes (902-912) discussed above, or via two POF cascading lines present issues of costs, installation complexity and the number of boxes in a given premises. The issues are therefore issues of choice, be it cost, complexity, installation or combined, all will be explained and discussed further below.

The shown three optoport pairs in box 903nT of FIG. 12D, the boxes 106 and 103 of FIG. 13C represent one or two or more optoport pairs by any of the boxes, be it the intelligent support box 102-112 or low voltage support box 902-912 (not all shown).

FIG. 14A shows the conceptual four way optical junction circuit comprising dual transceiver circuits 67L disclosed in the prior art to be comprising a photo transistor 68PT-1 and 68PT-2 and an LED 68L-1 and 68L-2 combined into two single opto coupler IC packages each with single optical access 67CSL. Optical access is disclosed in U.S. Pat. Nos. 8,041,221 and 8,340,527, that together form the lower speed junction JL.

The accesses size (diameter) including the POF cut are shown enlarged to provide better view of the transceiver and the access structure. Each of the access 67CS is linked by an attached POF 69-1 and 69-2 shown in FIG. 14A to be an identical access 67CS to receive from or transmit to optical signal between any two accesses of any optical communicating devices, including but not limited to such as between two intelligent support boxes 102-112, or between two support boxes 902-912, or between intelligent support box and standard plug-in support box, or between any of the boxes and at least one of a distributor and/or one of a command converter and a controller and any combinations thereof.

In a one way of two way optical signal, for example 10K baud or less, propagated via a 1-30 meter long optical (POF) cable, the incidences of signal collisions are very rare. Particularly when the propagated signal is a short command of an embedded protocol, such as five bytes command or be it five bytes inquiry or response of approximate 50 mSec. duration, disclosed in U.S. Pat. No. 8,170,722.

The shown left side receiver 68PT-1 in FIG. 14A will detect an on going propagated signal via the POF 69-1 "instantly" (depend on its speed), wherein the term instantly refers to time units measured in nano sec. or micro sec. or milli sec.

The CPU is programmed to block an intended transmission by the transmitter 68L-1 of the left optical access via the POF 69-1 of FIG. 14A. Same applies to the right side transceiver linked via POF 69-2, the CPU blocks an intended transmission via the LED 68L-2 if the photo transistor 68PT-2 detects a signal (light pulse or light).

With the on going propagated optical signal completed, and no further optical propagation is detected during a programmed time units via I/O R8 of the CPU 87P, the photo transmitter (LED) 68L-2 will be driven via the I/O T8 of the CPU 87P to proceed instantly with the transmission of the intended command.

Most of the known home automation circuits are operated and controlled by set of given embedded protocols, commands and programs. The protocols or the commands can be made short as disclosed in above U.S. Pat. No. 8,170,722, thereby a delay in a transmission will be a short time duration, measured in nano, micro or milli seconds, that does not disrupt the automation operation.

The applicant's automation coding disclosed in U.S. Pat. No. 8,170,722, as an example, provides control mediums via two way propagated IR command that are optical signals transmitted and received in open air and are well known to be operating at 600 bits per sec. The IR remote control dominates as of present time, almost all known remote controlled appliances globally (published to be some 97% of).

The applicant adopted a modified 600 bit/sec. control signal speed, via an expanded program, for the optical control and command communication, such as disclosed in U.S. Pat. No. 8,170,722 and corresponding issued patents in other countries and regions.

The limit of each command to a protocol structure of five byte (40 bit), for communicating a single command or response to be within time duration of some 50 milli seconds, or 0.05 sec. is insignificant delay.

In fact a delay between 0.05 to 0.5 sec. is considered an insignificant time duration for operating electric appliance (s), within the human habitual expectation to "instant" action, such as switch lights on or off.

In fact, a fraction of a second represent "a range of" time duration (or delay) for the pushing or toggling the mechanical lever of switches and/or the operating of relays, used to switch the power to electrical devices and appliances connected to the electric grid of a given premises.

The present invention moves further to expand upon the grid to include IoT's and Ai devices, that operate among others on the basis of data feed and data exchange. Data transactions and/or exchanges mandate higher speed and substantial band width for transacting "n" Bytes. Such higher speed calls for peer to peer communication such as RF (Wi-Fi). RF will be faster when it is secured for direct exchanges between IoT's, Ai's and Wi-Fi router.

However, to enable the IoT's and Ai's devices to operate via a given Wi-Fi channel or other wireless channels, does not and cannot link the IoT's and/or the Ai's with the electrical grid and devices, thereby the IoTs and Ais cannot report the statuses of the plug-in electrical devices nor operate or control the linked appliances or report the power consumed.

To this end the present invention introduces a novel communications and control by; i. linking IoT's and/or Ai plug-in devices to the optical grid via the intelligent support boxes, ii. providing standard low voltage plug-in boxes linked via the lower speed or/and at least one higher, selective communication signal and speed, and iii. further introduces a novel control elements for self controlling the optical traffic, propagated via the cascaded optical networks, wherein each access LJ or HJ controls the traffic between two adjacent accesses (LJ or HJ) by self suspending an intended transmission whenever optical "suspend" pulse or signal is detected.

The control is further augmented by including at least one RF transceiver in a given intelligent device of a given cascade line, and/or into home automation network device, such as a distributor 570 and/or a main controller 560 linked to the electric grid network and/or to a command converter 580, disclosed in U.S. Pat. No. 8,639,465 converting any of the RF, optical or bus line signals.

Each plug-in box of an optically linked cascaded plug-in boxes is linked to two independent accesses left and right, with the exception of a grid with single segment to a single device, or to the last device of an optical cascaded chain, that are linked to only one access (left or right).

Each CPU of each linked plug-in box is processing simultaneously two independent or related optical signals via two accesses can transmit or suspend via one of the linked access or both accesses, instant or at different random timing, or transmit two different commands simultaneously via its dual accesses (left and right) instantly or delayed.

Accordingly, each CPU 87U of FIG. 17A of the standard plug-in box and the CPU of FIG. 18 of the intelligent support box of the prior art links all the cascaded junctions, be it 67JL, single or plurality of 67*t*H or combined to the left and right with the exception of the single plug-in box or the last plug-in box that links only to the left or right.

Alternatively, each plug-in box can receive optical signal from the left, the right or both randomly, or can receive simultaneously two different protocols or data such as receiving commands or data from one access and for propagating the signal or signals to the device CPU 87U of FIG. 17A for further propagating the command or commands or data or a combination of data and commands to the opposite access, as directed by the command made to a given address of one other access included in the cascaded optical chain as recorded with particulars in each of the plug-in boxes of the given grid.

This mandates an explanation. If the adjacent plug-in box is further linked to n cascaded plug-in boxes, be it to the left and right plug-in boxes, each of the interim CPU can receive commands or data from left and right, if both were transmitted simultaneously.

The concept of such cascaded communication is to communicate with an addressed plug-in box only. All interim junctions ignore the command received, either from the left or the right, that is addressed to another plug-in box further down the left or the right of the command processing junction. With each CPU re-propagates the re-generated command through its left or right transmitter (LED).

If both left or right side optical receivers 68PT-1 of junction C and 68PT-2 of junction A of FIG. 14C received a command or data simultaneously, both transmitters 68L-1 and 68L-2 will proceed and re-propagate the received commands to both adjacent junctions simultaneously, directed to junction n and to a controller access respectively, as per the read command address and retransmit the processed and re-generated command further via the CPU 87P-A, B and C and via the I/O ports of the CPU A and C simultaneously, but independently from each other.

The advantage of the optical cascaded chain become further evident by the ability to detect a propagated signal from a given plug-in device of a given plug-in box to be a signal that is present only between two adjacent plug-in boxes, with all other junctions and plug-in devices can communicate independently with a further adjacent plug-in device, provide a practical solution with a maximum delay time of 50-100 mSec through six lower speed JL cascaded plug-in boxes.

This covers the receiving or transmitting a command from an optical and/or including low voltage bus-line via the distributor 570 or the command converter 580 shown in FIGS. 21 and 22, to distribute the optical signal to an n linked plug-in boxes and plug-in devices as disclosed further below.

The number of the communicating devices can reach 100 or more via, for example, eight (shown in FIG. 21) or sixteen (n) individually cascaded optical lines, each linking up to, for example, six intelligent support boxes (102-112) and/or plug-in boxes (902-912) or plug-in devices, having a propagation delay within a fraction of a second.

This includes the lower speed communication signal such as 600 bit per second, with each segment of each cascading line transacts the signal at 50 mSec. (max) or for a total delay of such as 0.2-0.3 Sec. for propagating through six support boxes, be it any of the 102-112 support boxes or any of the 902-912 plug-in boxes or be any other larger size support box for supporting n plurality of IoT's, Ai or electrical wiring devices linked via the shown junctions, be it JL or any of the JH of FIG. 14C or 15A-15E.

The distributor 570 that distributes individually one, n or all of the cascaded n lines, or to any combinations of lines, be it the cascading optical grids, or a bus-line (low voltage)

communication grids simultaneously, or individually, or a combination of number of grids (optical and/or bus line) simultaneously.

The circuit of each transceiver of the lower speed access 67CSL of FIG. 14A comprising an LED 68L-1 or 2, a photo transistor 68PT-1 or 2, a capacitor C1 for noise filtering, resistors network comprising R2 and R3 for providing ground reference and serial resistor with a diode D1 to ground, with the junction of C1, R3 and R2 is the feeding point of the received single to an I/O port shown to be I/O R7 or R8 of the CPU 78P.

The cathode of the LED 68L-1 or 2 is connected to the VCC and the anode is controlled via I/O port T7 or T8 of the CPU 87P.

As the photo transistor converts the optical signal into electric current signals, and amplifies the detected light signal, the photo transistor need no further signal processing of the propagated signal, via a terminated POF segment within a length of 40-50 m or 120-150 ft., terminated by a sharp guillotine cut tool disclosed in U.S. Pat. Nos. 8,453,332 and 8,594,956.

Moreover, as each intelligent support box and/or standard plug-in support box regenerate freshly the command (including the command address), enabling the cascading grid to stretch into 300 meter (1000 feet) to be longer than any literal single line of an electric grid in residences or businesses size, within the limitation (imposed onto electrical grids) for distribution of power within a given unit of a given building, for any activities. Such limitation are common to any known region or country codes and rules, for a single electric grid (in a residence or business unit) extending to over 300 meter.

FIG. 14B shows a novel higher speed junction H for the cascading POF 69-1 and 69-2. As stated above IoT's and Ai devices cannot be limited to communicate a pre-programmed protocols, commands or responses only. IoTs and Ai must respond to differing circumstances fed by sensing, or measuring different environments or sources, and cannot or should not be limited to a pre-conceived limitation.

Ai devices must be provided with data to conceive and predict by self analysis of the surrounding statuses and conditions correctly. The Ai or IoTs must communicate substantial data that may stretch into substantially far more than the short protocols or commands propagated via the lower speed junction JL of FIG. 14A.

The difference is in the receiver circuit, wherein the photo transistor is adequate with clear advantage for controlling and reporting the electrical devices status at the lower speed. The use of photo transistor for the receiving element is far cheaper and simpler, requiring no further active component circuits. The photo transistor therefore the preferred choice for the intelligent grid, structured for residences and businesses, for electrical control and reporting.

Figure 15A:
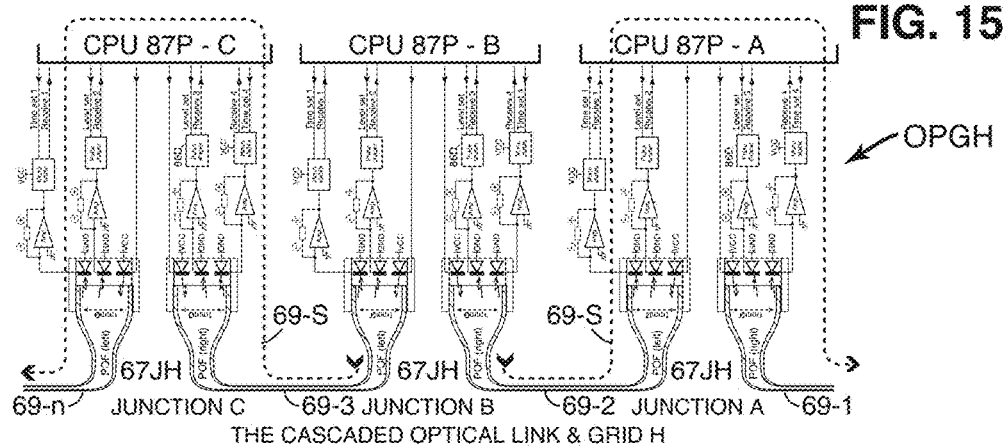
FIG. 15A shows the connections including block diagram of optical grid elements, for propagating higher speed signal in a cascaded optical grid of the preferred embodiment of the present invention.
Figure 15B:
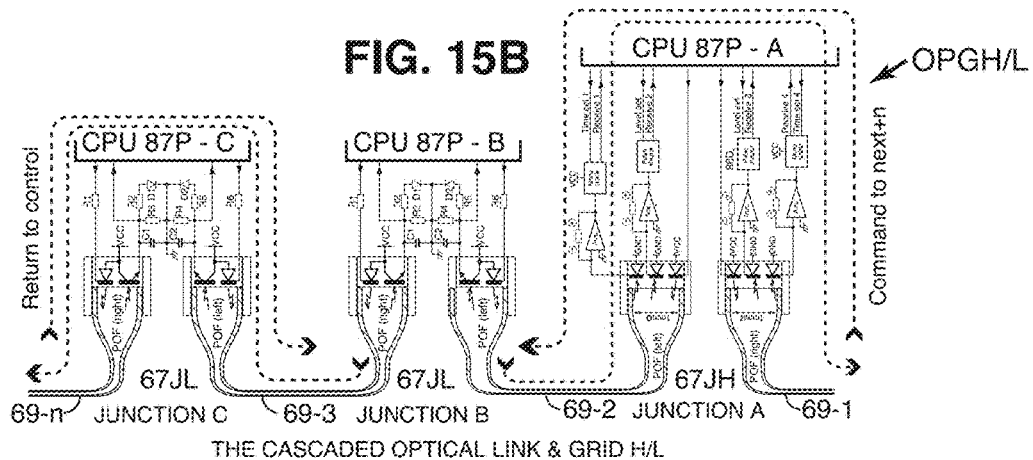
FIG. 15b shows a combined optical grid for propagating higher and lower optical speed signals via a single optical cable POF using the junctions shown in FIGS. 14A and 14B for controlling each cascaded segment with signal traffic control.

The junctions circuit JH of FIG. 14B can be used to replace the junctions JL of FIG. 14A for providing higher speed and bandwidth to the optical grid OPGH of FIG. 15A, or augment the circuits of the individual boxes and the whole of the grid shown in FIG. 14C to be a combined grid OPGH/L of FIG. 15B.

The higher speed circuits of the junction JH of FIG. 14B are augmented by replacing the photo transistor 68PT with a photo or opto diode 68PD, as the photo diodes operate at far higher frequencies and bandwidth. The photo diodes signal however, at the higher frequencies range, is a minute current signals in the nano/micro Ampere units and range. Such minute signal cannot be converted into usable signal levels and requires active components for signal processing.

This mandates the introduction of trans-impedance or operational amplifiers 86C (op-amp.) to convert and amplify the signal into a detectable-manageable signal by a CPU, such as 87P.

The signal output of the receiver 68PD-2 however further needs to be processed, shaped and compared with an original propagated data signals to ensure that no error readings of data will occur. This can be tested, verified or calibrated by an optical signal tester/calibrator shown in FIG. 16 that is disclosed further below.

The receiving circuit of the receiver 68PD-2 further includes pulse shaper 86D that feed a clean shaped received signal to the I/O R2 of the CPU 87P and further connect via a "level set" line to the I/O T2 for adjusting the signal level by the CPU, as set by the tester/calibrator 810 of FIG. 16B to be discussed further below.

The other receiver 68PD-1 of FIG. 14B includes the op-amp or trans-impedance amplifier 86A of FIG. 14B for amplifying a detected signal at random for preventing signal collision. This mandates the following explanation.

Signal collision is defined as signal at opposing ends of a communication line collide before reaching their destination at the end of the line, at either end.

The "academic" limit for collision prevention via copper wire that propagate the electric signal at approximate speed of or at about half the light speed C (C÷2) is 100 meter. The "academic" length of optical fiber cable propagating optical signal speed at about 70% of light signal is about 70 m.

Accordingly, on the basis of the academic or the rule of a thumb, the signal speed in copper wire (twist pair) is 0.4-0.7 of the light speed of 300,000,000 m, i.e., ranges from 4.7 nSec./m to 8.3 nSec./m or 0.47-0.83 μSec. per 100 m.

The fiber rule of thumb is 200,000,000 m/Sec., but it is slower for thicker core, such as the POF. With that said the signal propagation speed via POF is safely considered to be 0.5 μSec./100 m. If we limit the cable length to 50 m only, the max delay of signal sensing at the other end of the POF cable will be 0.25 μSec. or 250 nSec.

The propagation physics impose limitation to communicating optical signal via the cascaded POF segment chain that need to be re-visited, to better understand the issues involved.

i. The POF communication segment links two adjacent optoports only.
ii. Each optoport connects its receivers and transmitter via the CPU 87P, not via another optical elements of the access. This makes the collision issues a strict issue of signal collision of a stand alone single POF stretch of 50 meter long (max), linking directly via its two terminated ends to two photo/opto accesses or ports.
iii. The line can transmit from one optoport to a second optoport or reversely transmit from second optoport to the one optoport, and must be prevented from two way simultaneous transmission through the single segmented POF.
iv. Both optoports receiving circuits are connected to and are ready to receive and communicate via the explained above circuit, at all times, with a reference to a dual or two I/O ports of the CPU 87P, making the dual CPU's and the two optoports (the two accesses) on both ends of the POF segment to be the elements involved in denying transmission to avoid collisions.
v. As the only link between the two adjacent accesses 67 is a single POF cable segment, self denial or self blocking of a transmission at any one end of the POF, by one of CPU's involved is the most effective method (within the shortest disruption time duration).

vi. Any "request for transmission permission" will take far longer than self denial, as request and approval mandates two way protocols.

vii. The only practical issue may arise if the two adjacent support boxes intend to transact data or protocol signals as received from the next adjacent junction in the cascade at the same time (in micro or milli seconds coincidence), prior to the I/O ports of the CPU 87P receive the processed communication (command or response or power consumption reporting).

viii. The conclusion of such delay (in a choice of time and signal speed) represent a choice or choices, depending on practical anticipated performances in communicating data and/or command protocols, including responses versus the issues of costs as disclosed above.

It is important to note that CPU is or will be "aware" of the on-going through it, and if the two receiving I/O ports of the same junction are receiving possible colliding signals from the two adjacent junctions, the CPU can block both received signals instantly.

The practical realities are that a segment of cascaded line combined into the electrical ducts, pipes and network inside a confined premises, is rarely beyond 30 m (100 ft.) and an high speed signal such as 500 kbit (or 500 kHz) is well above the practical need for internal communication between electrical and IoT's or Ai devices. Higher needs for such communication set-up can be provided at low cost RF circuits and antennas, such as for Wi-Fi communication via routers and the internet.

The solution considering of all the above, is to provide practical signal speed of 100 kbit (100 kHz), enabling the use of a practical medium cost high speed photo diode 68PD, and single op-amp, AGC or trans-impedance amplifier 86C or other sensitive linear amplifier, referred to in the disclosure and the claims as the "receiving elements, to feed the incoming signal to both the pulse shaper 86D and the mono stable circuit 86B, for triggering a self delay time pulse, to block the intended transmit protocol or data by the adjacent CPU, "well" prior to propagating the first byte of the five bytes are sent. The well prior can last from micro sec. to milli sec. time units.

When no signal is detected followed by a "programmed re-verify duration and/or the suspend pulse" propagated (for example 5 mSec. delay) is received via the optical transceivers 68L, through the POF by the adjacent receiving junction. The suspend pulse prevents any intended transmission thereby preventing a collision.

The prevention concept can be summarized as; "first to transmit the suspend pulse is the one to continue with the transmission when the pulse is over". To further summarize, the system is programmed to operate on the basis of "first to intent will be first to transmit", and will proceed with the transmit process when the suspend pulse and the verifying duration is over.

The other end of the POF segment, i.e., of the adjacent junction that also intend to transmit will generate, for example, five milli sec. pulse at the end of the transmitted protocol or data stream, and will follow with the intended transmission, thereby preventing a collision.

To avoid error in detecting the end of the transmission the CPU is programmed for a time duration verification that no further signal is propagated, based on which the adjacent junction can proceed with its intend to transmit pulse.

In other words, the transmitting access generates a short delay pulse of, for example, 5 mSec. commanding the receiving access (that may "intend to transmit") to transmit only after the transmission of a command (or data) is completed.

Such introduction of a short delay time into a given segment of a cascade line is novel, yet it sets a constant delay time, of for example n units of nano, micro or milli sec. delay, which duration is in fact, an insignificant for internal communication between cascaded devices of a given optical grid, linked to an electrical power grid including smart or intelligent home devices, such as future IoTs and/or Ai devices for controlling and operating home automation elements via an home automation grid.

The choice to provide the optical access with one only photo diode or two or more is a question of costs. If the choice is to further propagate higher speed signals, for example 10M bit or 10 MHz, where any delay become meaningful, the use of a very fast photo diode and circuits, such as 500 MHz trans-impedance amp. and comparator, as well as high linear and high accuracy signal shaper and fast processing mono stable devices, or use a high speed CPU for such purposes. But the circuits to provide a communication speed of 10 MHz (as an example) between standard plug-in devices in peer to peer Wi-Fi or Bluetooth is practical, and such RF circuits and antennas shown in FIG. 17A can be used.

The cascaded optical grid OPG-L for the lower speed signals is shown in FIG. 14C linked by POF 69-1, 69-2, 69-3, 69-4-n via three junctions A-B-C and n (not shown). The individual circuits of each junction and the grid operation and feature are explained and discussed above. It should be obvious and clear that the propagated optical signals to and from the junctions are linked via the I/O ports of the CPU 87P of each junction A, B, C and n as programmed.

The term Optoport® is a trade mark by the applicant for a given optical access or to dual accesses such as the term junction, also termed four way junction. The cut end of POF cable that is a receive and/or transmit access is also termed optoport.

Each end of the POF segment, access and junction is termed throughout the application and in the claims to be first, second, left or right, even though the actual physical state of the POF segment end, the access and/or the junction may be shown or disclosed to be in the opposite position or side.

It should be noted that the terms pertaining to the cascaded optical chain elements, referred to in the disclosure and in the claims, defined to be four way junction, comprising two or dual optical transceivers combining transmitting elements such as LED or Laser and at least one receiving element, such as photo transistor or photo diode, also known as pin diode, packaged into a single combined optical enclosure with a single optical access for linking two way optical signals via POF or other fiber optic cables.

The term segment in the disclosure and the claims refers to POF or other fiber optic cable or optical cable for linking its one end with an access of a given junction and the other end with an access of an adjacent junction.

The terms first, second, left and right are terms used in the disclosure and the claims to identify the one POF segment end from the other POF end or identify the one access of a junction from the other and from first junction with the second junction, or the adjacent junction linked via a single segment, with the first-second or the left-right can be reversed.

The first and last plug-in box of a cascading line refers to the first plug-in box linked to at least one of the controller 560, the distributor 570 or the command converter 580. The last plug-in box is linked via a single last POF segment of the cascading line.

FIG. 15A shows the higher speed circuit included in the optical grid OPG-H of a cascaded low voltage support plug-in boxes, similar to the lower speed optical grid OPG-L of FIG. 14C. The different is only in the make up and circuits of each of the accesses 67H of the junctions 67*t*H A, B, C and n, with each junction and/or access comprises the elements and circuits shown in FIG. 14B and disclosed above.

The difference between the grids OPG-H and OPG-L is that the costlier grid OPG-H can communicate and propagate both, the pre programmed slower speed commands and responses including the higher speed data exchanges between IoT and/or Ai devices, versus, as an example, the lower speed grid OPG-L of FIG. 14C that is structured to communicate a lower speed commands and responses, such as limited to, for example 9,600 bit per sec. or an analogue signal or signals of up to 10 KHz and over.

FIG. 15B shows a combined grid OPGH/L using a single cascaded POF, combining the lower and higher speed signals via two lower speed JL junctions B and C and a single high speed JH junction A.

Figure 21:
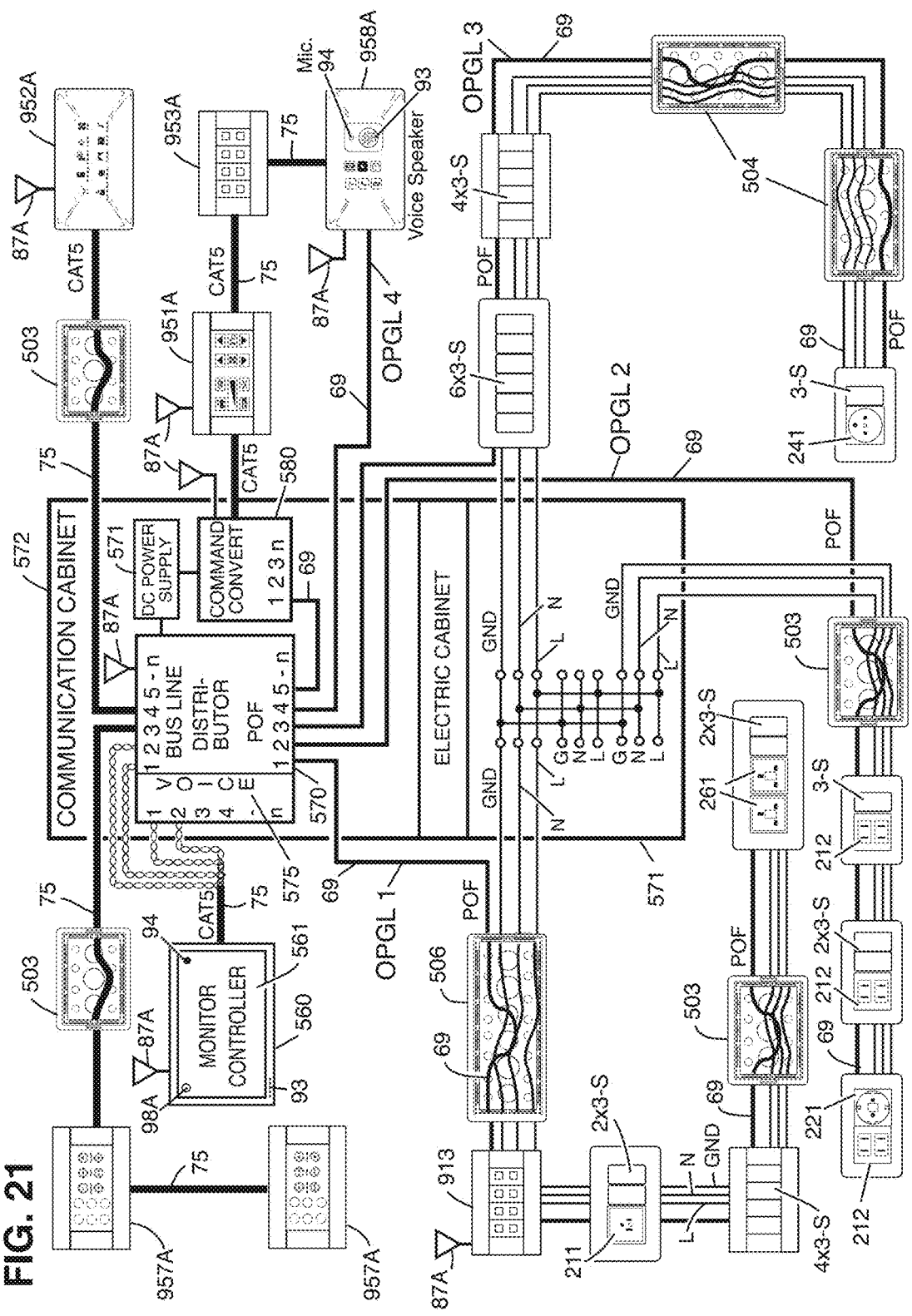
FIG. 21 is a block and connections diagram of the lower speed optical and low voltage bus-line grids, with the POF cable of the optical grid segments mixed and mingled with the electric power wires and conduits are all connected into electrical and communications cabinet including a distributor, a command converter and a power supply that are further connected to a controller and plurality of blank wall boxes for future additions of IoTs and Ai devices.

It is important to note that in FIG. 15B the first A junction is the higher speed junction 67H-1 that is to be linked to a controller or a distributor or a command converter of FIG. 21 communicating higher speed signals via access 67H are for the purpose of being linked first to H speed accesses, because the lower speed accesses will not be able to communicate and propagate high speed data and/or protocols generated by the controller 560, the distributor 570 or the command converter 580 of FIG. 21 without errors.

Figure 15C:
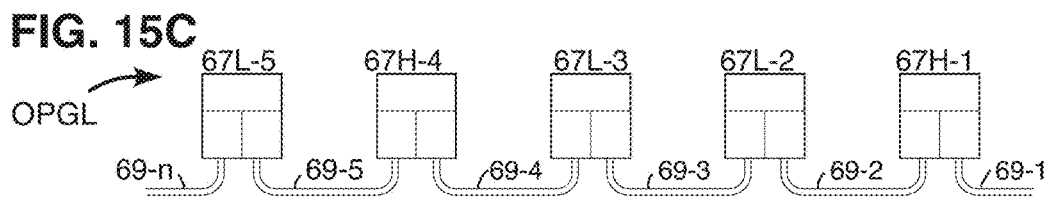
FIGS. 15C-15E show block diagrams of optical grid cascaded via n intelligent support boxes combined with standard plug-in support boxes via lower speed optical signal, combined lower and higher optical signals via a single POF cascading cable and via dual cascading POF cables propagating separately the lower speed and the higher speed signals.
Figure 15D:
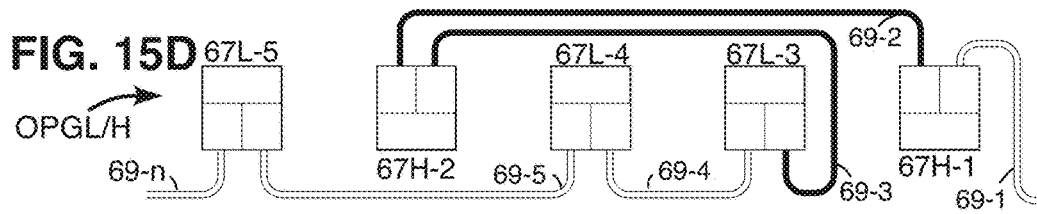

This mandates field installation with care, to ensure that the POF cables will link first the cascaded high speed support boxes of the cascaded chain, as shown also in FIG. 15D, to be POF 69-2 and 69-3, linking the higher speed devices 67H-1 and 67H-2 to be first in line to link with a controller (560, 570 and/or 580).

Figure 15E:
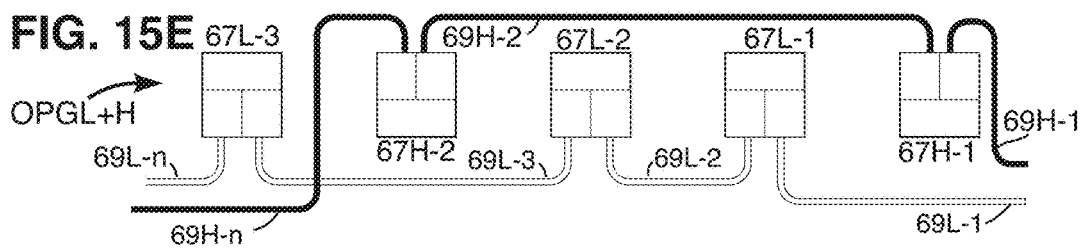

FIGS. 15C to 15E summarize the linking of a cascaded chains by a single or dual or more (not shown) POF cables, with the higher speed links are shown in solid black lines to clearly illustrate the different speed, though both signals, the higher and the lower speed signals are propagated via identical POF cables 69.

FIG. 15C shows five cascading plug-in support boxes each with single junction 67L for propagating the lower speed signal through the five plug-in boxes identified by their access number 67L-1 to 67L-5, linked via six shown cut POF or segments, for one more box 6 or n to be linked, such as six linked standard plug-in boxes.

It should be noted and clear that all the boxes shown and fully discussed and explained, including the intelligent circuit and the power supply to operate the referenced boxes of the prior art, disclosed as intelligent support boxes, the circuit diagram of which is shown in FIG. 18 of the prior art, and further include the standard plug-in support boxes, also termed low voltage support boxes or low voltage plug-in boxes that operate on a low voltage (DC) fed via the low voltage communication grid, using twisted pairs cable such as CAT-5, for powering the circuits shown in FIG. 17A, that is explained further below.

FIG. 15D shows three intelligent support boxes with lower signal speed accesses 67L-2, 67L-3 and 67L-5 and two plug-in support boxes with higher signal speed accesses 67H-1 and 67H-4 connected by segmented POF cut cables 69 shown in segments or cuts 69-1 to 69-*n* similar to the number of cuts shown in FIG. 15C for indicating other "n" box or boxes connections.

As referred to above, the shown POF 69, shown in two colors white and black, is to enhance the difference in the signal speed the POF is propagating, but the POF itself is the same identical POF cable, even though the POF is shown in two colors and referred to in FIG. 15E as 69L and 69H, for the sole purpose of identifying the discussed two speeds signals propagated via the POF segments.

Another item refer to the above is the single cascaded grid for propagating the slower and the higher speed signal. In such combined grid, the higher speed accesses should be linked first in the row of the cascaded chain, as the slower speed accesses may not propagate the higher speed signal without error, while higher speed accesses will properly propagate slower speed signals.

On the other hand it may be necessary to install physically in the room or zone within the premises for implementing a given set-up into the wall boxes and the support boxes, that does not provide for the cascade to be physically run in a given single direction, with the POF cable to be linked, not in line with the single electrical grid run.

In such set-up it is perfectly proper and doable to pull three POF cables within a given stretch, shown in FIG. 15D comprising 69-2 and 69-3, 69-4 and 69-5 pulled via the same single pipe or duct for a reversed link with two devices or boxes containing IoT's or Ai, propagating higher speed signals.

The shown reversed connection of FIG. 15D needs no further explanation, with the exception of the shown upside-down boxes are only to simplify the presentation how the reversed three POF cuts are pulled (with the electric wires) together for connecting the grid as planned, and has no other reason or function, outside the simplified showing.

FIG. 15E shows the same setup as shown in FIG. 15D with dual separated optical grids OPGL+H, for propagating the lower and the higher speed signals independently. Both signals are linked to the network distributor and can communicate via lower speed commands and protocols for operating the electrical appliances and receive responses, propagate reports of power consumed via lower speed protocols directly to and from the distributor 570.

Figure 22:
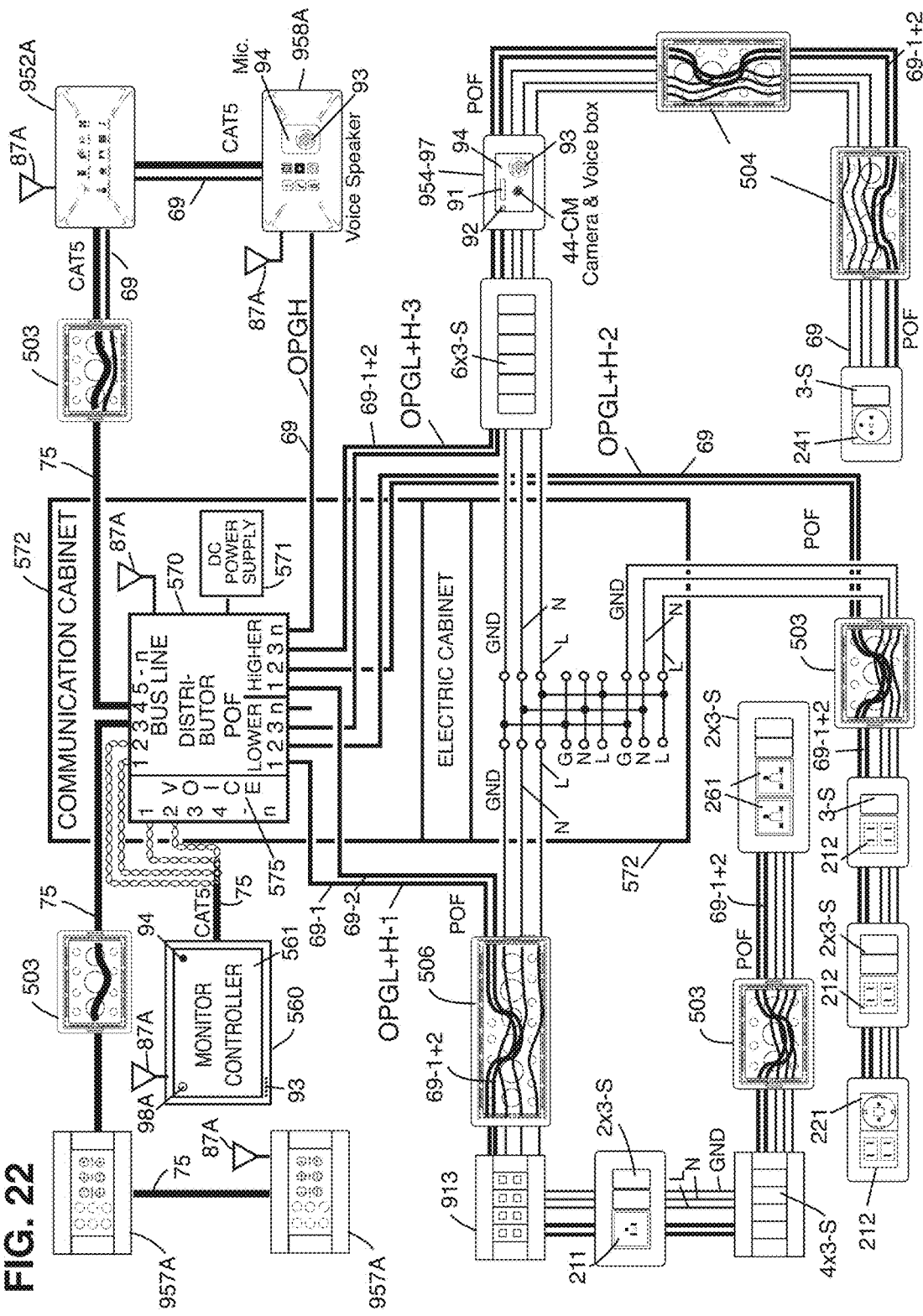
FIG. 22 is a similar block and connection diagram to the shown diagram in FIG. 21, connected and operated by dual optical grids with higher and lower speed signals emphasizes by extended IoTs and Ai devices.

The higher speed signal communicates directly via the high speed cascaded chain with the distributor 570 and between IoT's and Ai and/or further communicated via high speed optical signal or Wi-Fi router with the higher speed devices and the internet, or via the bus-line shown in FIGS. 21-22 as bus line CAT-5 75.

It should be obviously clear that the cascaded line of FIG. 15E could combine the further third higher speed optical signal, for connecting IoT or Ai device to be the sixth plug-in box for directly connecting to the distributor optical access and/or to the distributor bus line, which can control the communication to and from the sixth plug-in box, as further discussed below.

The shown optical grids summary of FIG. 15C-15E are introductions of simplicity in design, install and operate an electrical automation grid, wherein the electrical grid is known to be the harshest environment for signal propagation.

The harshest environment are the noises generated by each electrical action such as switch on switch off, via the electrical devices and appliances and by neighboring appliances, generating electrical noises, including switching power regulators, start and heavy torque motor's currents. The power line is further known to feed non stable AC lines in many of world countries, and further including the strict harshest electrical and building codes for maintaining electrical safety.

In contrast is the well known fiber optic cable that is totally immune to electrical noise and generate zero (no) noise. The high cost of the optical fiber, the high skill and know-how required for fiber optic system installations, and other physical limitations in bending radiuses and connector sizes were the reasons that kept the electrical industry from considering optical grid solution for residences, offices and other businesses.

The POF solutions shown in FIGS. 15C-15E and as explained above are clearly novel, not only in regards to the electrical grid of the prior art, disclosed in the referenced US patents (and other countries patents), but including solutions for installing IoTs and Ai devices, not as an add on adaptor, or a plugged gadgetry into an AC outlet, but to be fixed, part and parcel of an home automation grids and network. The obvious example is the linking of voice commands and environment data to operate electrical, IoT and Ai appliances and devices.

As explained above, the well known Wi-Fi, Bluetooth, UHF and other RF frequencies are sensitive to noise and interference, and the IoT's and Ai devices plugged into wall boxes near power lines and communicating via a given Wi-Fi channel with a Wi-Fi router will be better served by converting the Wi-Fi data and/or commands into optical signals converted by the data and command converter 580 of FIG. 21 fed via the distributor 570.

This will provide a solution to two anticipated obstructions. One is the avoiding any other communication through the optical cascading line OPGL+H and particularly the devices 67H1 and 67H2 of FIG. 15E, and the other is the total immunity to noise, provided by communicating optical signal.

The third possible obstruct is the receiving by the converter 580 antenna 87A (as an example) two or more Wi-Fi signals propagated within the residence or business unit or by other units in the neighborhood simultaneously.

Such interfering frequency band or channel within the premises or the neighborhood must be identified for which the controller 560 or the distributor RF transceivers include a well known frequency scanning circuit or a scanner for identifying all the frequencies and bands involved in the RF communications and interferences.

An independently communicating IoT or Ai device that is not connected to the cascading grids, of the present invention, cannot be stopped or blocked from transmitting via the optical and/or the bus-line grids.

The present invention other basic objective is to block all devices from transmitting any Wi-Fi signal (or a given Wi-Fi channel) when a single IoT or Ai is communicating Wi-Fi data and/or commands.

In other words, only a single IoT or Ai device is able to transmit, or exchange Wi-Fi data and/or commands, at a given time via a given channel. If more than one IoT and/or Ai devices intend to communicate or exchange commands and/or data using Wi-Fi, such as between two IoTs or Ai devices or combination of devices communicating with each other, their communication will be managed via the traffic control included in the controller 560 or the distributor 570, and/or the command converter that simultaneously communicates with both devices to alternate synchronously or at a precise timing, alternately enabling the transmission by one IoT or the other, via one or more than one given channels.

To summarize, the controller 560 and the distributor 570 are programmed to command the Wi-Fi via a given channel or channels, optical and bus-line traffic for preventing collision in all communicated signals. Starting with the initial delay by the propagation of signals between the cascaded junctions, and second is to allow only one Wi-Fi communication signal. It is also possible to provide for converting received Wi-Fi signals into optical signals and blocking all other cascaded plug-in boxes of a given cascaded line to suspend all intended transmissions connected by any one of the plugged in devices within the cascaded chain.

Such blocking/denying time durations are insignificant time duration for home control and operate devices. The fundamental position is that the blocking of all others from communicating provide a clean environment for Wi-Fi signals to operate in the confines of a given congested unit, of the near future, when serious IoTs and Ai devices will be available and useful.

As referred to above, the solution for the future IoT and/or Ai devices is the installing of blank wall boxes into and within the cascaded electrical, low voltage including optical lines and grid of premises, is a very low or insignificant cost solution, with a vision to provide future introductions of useful devices, as and when become available.

Regardless of the introduction simplicity, the optical grid is embedded into ducts and pipes attached to intelligent support boxes and to standard plug-in boxes of smart devices in a cascaded chain.

A cascaded chain may develop a defect which raises an issue of how to find a defect or the location of a defect, be it during installation, at the time of commissioning or afterwards, when the grid, part of or an element of is malfunctioning.

To this end the hand held field tools for testing, checking and verifying optical signal propagation via a single segment and up to a whole cascaded chain and beyond are introduced below.

FIGS. 16B-16D show four hand held series of optical signal testers 810, 820, 830 (831+815) and 840 comprising touch screen 87S; 87SA and 87Z, push keys PK882 and PK883-1-$n$ and POF access entries combined with mechanical locking keys PL883-1-$n$.

The top of the line tester 810 shows push keys PK882-1-$n$ for mode select and touch screen display 87S of FIG. 16B. The tester 820 shows keys to operate a field tester including smaller display 87SA, push keys and indicators PK882-1-$n$, mode select keys and indicators PK883-1-$n$, mechanical locking key and POF entries PL883-1-$n$.

The shown field optical responder (and tester) 840 in FIG. 16C is a remote tool for field or workshop testing and measuring the propagated optical signal. The responder comprising dual POF accesses lower and higher speed 67-L and 67-H respectively, mechanical locking keys PL883-1-2, indicators 886-1-$n$ and push keys PK882-1-$n$ for operating and identifying errors and malfunctions.

A slimmed version (not shown) of the tester 810 or 820, for testing and verifying the lower speed grid only, using the touch screen 810 or the select keys PK883-1-$n$, or a version for testing both the lower and the higher speed grid models via single HL access with a smaller display screen (not shown).

The testers 810 or 820 design are similar to the calibration testers disclosed and shown in the U.S. Pat. Nos. 8,442,972; 8,594,965; 8,639,465 and 8,930,158, that can be modified or adapted to be a cover all electric grid and Home Automation tester 830 of FIG. 16D. This is by combining the add-on test adapter 815 with the modified calibrator 831 into a single combined tester 830 by attachment for testing optical grid in a workshop or in the field.

The combined-modified-calibrator-loader 830, including the installing of additional programs for operating the calibrator with the given adaptor 815 to operate, test an perform by the touch screen 87Z to fully replace the mode keys and select icons to enable testings and verifications to be same as provided by the tester 810.

All the shown optical signal testers 810-830 and the optical responders 840 are shown with at least two optical accesses 67-L or 67-HL referenced as shown in FIG. 16A, to be L, H or HL. However the testers 810 and 820, the responder 840 and the add-on adaptor 815 all include combination of dual 67H and/or dual 67L accesses that are combined into two JH and JL junctions.

FIGS. 17C-E show two accesses 67H or 67L or 67HL or forming a combined dual H, L, or HL two way junctions for the testing of and responding to and from dual POF adjoining grids.

The circuit diagram of the different testers and the responder shown in FIGS. 17B, C, D and E are similar to the circuit in FIG. 17A of said standard plug-in support boxes, also termed low voltage support boxes or low voltage plug-in device and similar terms for receiving and transmitting optical signal via the attached POF cut end (terminated by the cut) of the POF or other fiber optic cables with larger core. The cutting and terminating by a guillotine cut hand tool is disclosed in U.S. Pat. Nos. 8,453,332 and 8,596,174.

FIG. 17B shows at least two of "n" or plurality of optical accesses 67-n forming at least one optical junction 67JL or 67tH or both, and at least one multi RF transceiver 87B linked to I/O ports of a CPU 87U and antenna 87A-1-n. The CPU 87U that can be an analog/digital signal processor is similar to the CPU 87U shown in FIG. 17A showing the very similar circuit diagram used for standard low voltage plug-in device circuit and also to the CPU of FIG. 18 showing the circuit of the intelligent support boxes of the prior art.

The noticeable differences between the CPU's are the number of I/O ports and the memory size/capacity, selected to be sufficient for the given number of I/O ports needed and the calculated maximum capacity and speed of the memory circuits.

Same apply to the number of the LED indicators L-1 to L-n, the indicators color, be it single or multi color, the display screen and the touch icon programs, or the push keys PK882 or PK883 or the mechanical lock keys PL883 are all selected to commensurate with a choice, as designed and programmed for measuring signal level, command to transmit, receive, read and respond.

The possible responses to the selected actions are confirmation of indicate or display error protocol (received or transmitted) and/or indicate via LED the steps of the tests and the protocol read result, or re-transmit the received protocol with the error as read, or verifying along with indicating (via the LED indicators) and/or displaying onto the display screen the ongoing statuses, be it via a single POF segment or segments linked via at least one operating box. The basic select, commands and responses are shown in FIG. 16A.

All the circuits of FIGS. 17A-E show DC ⊕⊖ terminal and VCC, with the power fed to the terminals 56 are fed via the low voltage bus line grid and the voltage reference ⊕⊖ to the testers and the responder circuit are shown to be powered by replaceable such as 4A or 3A batteries (not shown). The battery can be a built-in rechargeable battery (not shown) charged by a well known charger, using a cable and a well known plug to charge via a charge socket CH of FIG. 16B.

The unique novel functions, including the ability to simultaneously communicate a four way two independent optical signals via the two accesses and the CPU 87U as disclosed and explained in details above, along with the two accesses forming a junction and the cascaded network circuits shown in FIGS. 14A to 15E are fully discussed above.

FIGS. 17D and 17E show two simplified circuits of the tester and the responder devices 820 and 840 respectively as used for field testing of the conductivity and the optical signal propagation via AC powered intelligent support boxes 102-112 and low voltage support boxes 902-912, from and/or up to any of the cascaded POF segment end, or from and up to the controller POF segment 69-1 (FIGS. 15C-D), to the last POF segment "69-n" shown in FIGS. 15C-15E, and any interim segments in between.

FIG. 17D shows a simplified circuit diagram of the tester 820 and FIG. 17E shows the circuit diagram of the hand held responder/tester 840. Both the tester 820 and the responder/testers 840 can be used for checking and verifying the conductivity of a pulled POF via a conduit or a pipe between two adjoining wall boxes.

Figure 19A:
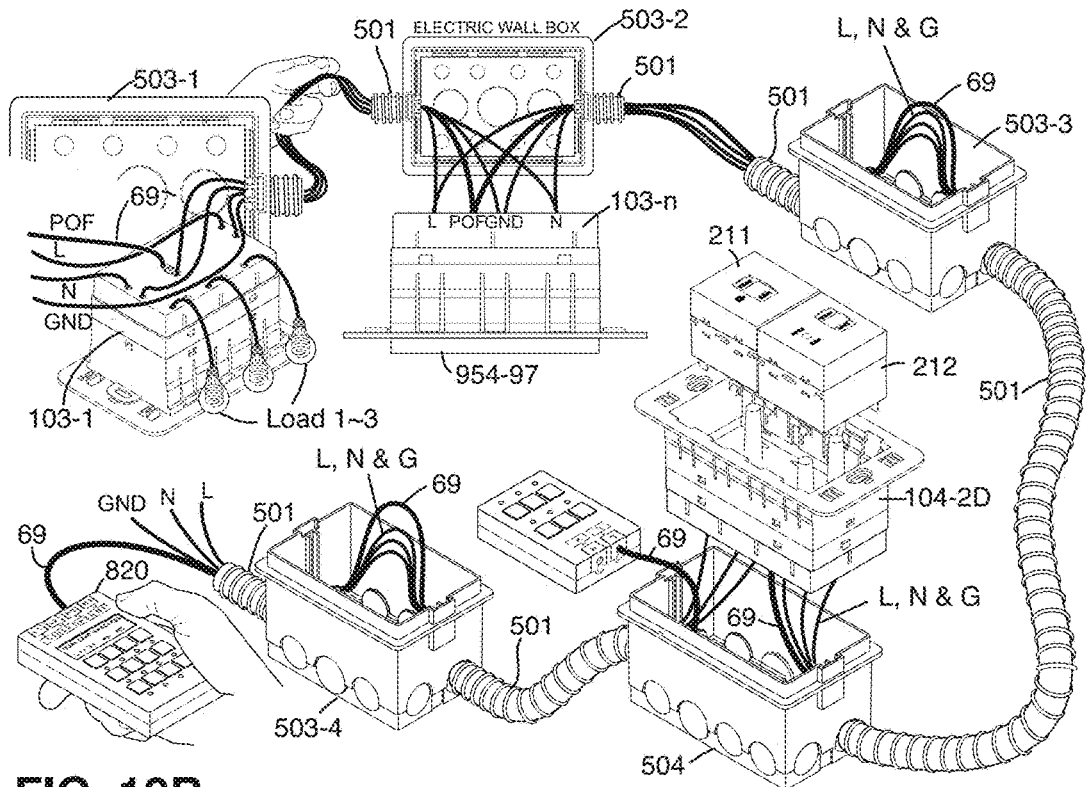
FIGS. 19A and 19B are two illustrative presentation of a cascaded electrical and low voltage grids as used in buildings, modified to include at least one optical cable grid and plurality of blank wall boxes with loose wires and cables within the box to enable the introduction of future IoTs and Ai devices or other plug-in devices to the cascaded optical, the AC and the low voltage grid and lines of the preferred embodiment of the present invention, with FIG. 19A further showing the optical tester and responder of FIG. 16C.

FIG. 19A shows the electrical and optical grid as pulled through the installed wall boxes 503 and 504 for installing intelligent support boxes 103 and 104-2D of the prior art discussed above, or IoT's and Ai's plug-in devices powered by the AC power line via a built-in AC powered DC power supply.

Figure 19B:
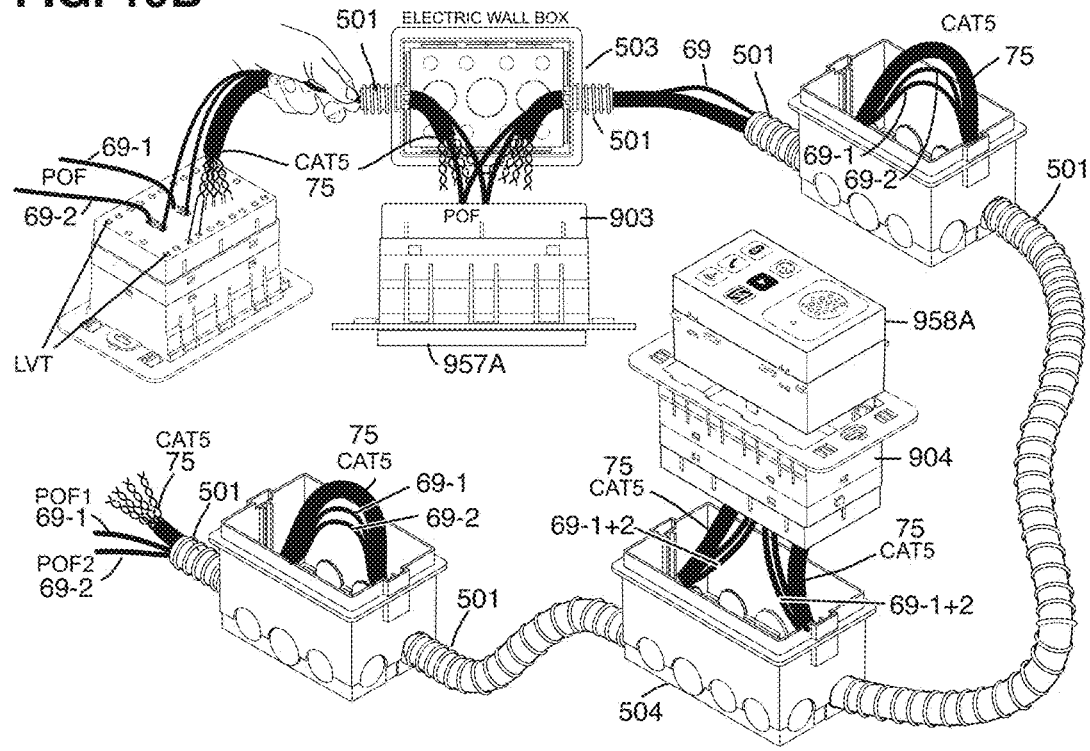

FIG. 19B shows the low voltage plug-in support boxes 902-912 of the present invention that are also simple to link via bus line and POF such as DC operated IoT's and Ai's devices for controlling elements and plug-in devices of the electrical grid, including AC appliances.

FIGS. 19A and 19B introduce yet another object of the present invention, summarized to be the install of an unused wall box or boxes 502-512 into walls within the cascaded cabling path of the prior art, providing pre locations/positions for enabling the install of IoT's or Ai's devices of the future and be linked to the optical grid of the electrical grid and/or to the low voltage grid and network of the given residence or business, at the very low cost of blank wall boxes and covers.

A major obstacle at present times to the proliferation of IoT's and Ai's is the inability to connect and link such devices to the electrical grids of an occupied residence and business premises. Dwellers and occupied businesses can rarely agree to an in wall installation (requiring substantial walls renovations) and will literally never agree to a visible wires or optical cables on walls.

The construction industry will not consider to provide an installed IoT's and Ai's devices into new buildings for two obvious reasons, the first is the costs and the other is warrantee for items, the construction industry is;

i. not aware of, or knowledgeable about, and ii. the value added by such IoT's and Ai's devices and the "relations" difficulties between the "construction industry" and the potential buyers of mansions or business. The IoT's and Ai's are not even "a talk" subject with potential rental customers.

To solve the need for major renovations of walls and/or the electrical grid or the low voltage grids of the future, the present cascaded optical link, that is in fact joint with the common cascaded electrical grids of premises, as structured throughout the last century until present time.

The ability to introduce wall boxes in mid line of the combined electrical with a single thin (2.1 mm diameter) optical cable (POF) by providing loose wires and POF cable (uncut) passing through and into the added blank wall boxes (as designated) shown in FIGS. 19A and 19B is a visioned introduction. Further is the covering of the empty boxes (containing the passing uncut POF and electrical wires) with decorative cover to complete the pre-install boxes, at literal minute, insignificant cost, is novel and attractive.

The cost of the wall box and the decorative cover are minute costs, to which the construction industry will provide, the same way they provide such similar wall boxes and ducts for cable TV and PC or network cabling (CAT-5) that are acknowledged to be part and parcel of the grids, by the construction industry, and are commonly provided for all new buildings.

The grid shown in FIG. 19A includes such two wall boxes 503-3 and 503-4 (for three gang support box), but can be any size of wall boxes such as 503-512. It should be clear that the loose electric wires and the POF cable and the grid OPGL shown in the two wall boxes 503-3/4 (blank) boxes can be cut, i.e., terminated and linked into a single junction 67JL or freely into two 67 accesses (no in-out polarity or designation).

The electric wire are inserted into the appropriate push in terminal (no in-out polarity involved), for powering a selected IoT or Ai device operating on AC power by comprising a built-in power supply.

FIG. 19B shows the other low voltage (CAT-5) grid with dual POF grids referred to above as OPGL and OPGH, with the CAT-5 cables are cut, trimmed and inserted into the low voltage push-in terminal LVT that are provided with color coding to prevent errors in connecting CAT-5 cables.

The two, POF-1 and POF-2 must be correctly linked to the higher speed junction 67JH which must be marked as such, and/or preferably color coded. Moreover it is preferable to provide the lower speed POF-1 in black color (as an example) and the second POF can be any dark color, such as dark red or blue or green, or color strip along the POF cable, to ensure no cross connections between the two cascading POF cables.

Further, it is necessary to check for conductivity all the way to the optical accesses of the distributor 570, or the controller 560 or the command converter 580, to which the cascaded optical grid is linked to. The common link is to the grid distributor 570.

The control devices 560, 570 or 580 are programmed to respond to an embedded test protocol including the responding to a conductivity check command via the lower or higher speed junction 67JL or 67JH, propagated via the lower speed or the higher speed access of the hand held tester 810, 820 or via the tester 830 combining the modified calibrator 831 with the add-on adaptor 815, and via the responder 840.

The test to verify the proper conductivity all the way in response to one such command, can be processed only when the grid is in active state and operating. During the installation process or prior to completing the network and its links, the testing/verifying of each segment should be processed with and via the hand held tester 810, 820 or 830 and the hand held responder-tester 840 of FIG. 16C, with the circuit diagram of the responder-tester 840 is shown in FIG. 17E.

FIG. 17E shows the simplified circuit for operating the tester/responder 840, using identical CPU 87U with different number of I/O ports, memory size and modified programs, with the subject of reading a received test command and responding to the hand held or any other of the shown testers 810-830 upon receipt of the test command, or a request for other action, such as to initiate a test in the reverse direction, reversing the signal between the tester and the responder, to verify no errors during an opposite or return propagation of commands or data.

The responder-tester 840 is attached to one of the two accesses 67L or 67H (lower or higher speed access), can also perform as a responder-tester via a single junction 67JL or 67JH, or it can be structured with two differing accesses 67CSL and 67CSH for testing by responding to either higher or lower speed optical signal propagation.

When the test is carried for a single POF access, the other opening of the access is not exposed to any random penetrating lights via the push to lock key PL883, that is structured to cover the opening to the POF entry, particularly to prevent random light from interfering with the verifying process.

The POF is only accessed when the PL883 key is pushed down and the access is exposed. At which point of time the POF end is inserted and pushed in all the way to physically engage the optical access, followed by the released of the PL883 key to lock the POF end into the engaged state. It is very important to maintain tight engagement state to ensure conductivity and no-error communication.

The push to lock keys PL883 are provided for all the accesses of all the tester models 810, 820, 840 and to the add-on test adaptor or module 815 for combining the present testing/verifying processes to the prior art tester-calibrator, disclosed in U.S. Pat. No. 8,442,792.

The circuits of the hand held tester for optical conductivity testing and verification disclosed in FIGS. 17B, C, D and E are literally identical with the circuit of the low voltage plug-in box or device of FIG. 17A, with as stated above, to be different in the number of indicators ports and I/O ports.

The further differences are shown to be in the display/touch screen 87S that is included in the tester 810 that differs in size and content from the display 87SA of the tester 820 showing a small display screen, with the displays 87S and 87SA are not included in the circuit 17A of the standard plug-in support box.

The circuits 810, 820 and 830 employ a display screen and operate via LED indicators, be it single or multicolor LED, the number of which is different to commensurate with the functions and the verifications variations, such as the signal measuring may be needed and/or provided for high speed accesses only.

The final two elements that are shown in the circuit of FIGS. 17A, 17B and 17D-17E are the referred to above RF transceiver 87B and antenna 87A that are shown in the tester 810 and 820 in FIGS. 17B and 17D and in the responder 840 of FIG. 17E.

To this end the use of RF signal propagation may be needed during testing by communicating, as referred to above, between the tester and the responder, or with the control devices 560, 570 and 580 disclosed above. The access of at least one said control devices is linked to the first segment of a given optical grid under test.

The RF transceiver and antenna can among other, supplements two way propagation of an incomplete test or when the optical signal propagation is incomplete or blocked (for whatever reason) in one direction or the other, at which time the need to transmit RF and receive optical response, or the opposite, transmit optical and receive RF response and combinations thereof. Such supplemental function is very helpful and is the reason to provide a similar RF transceiver 87B and antenna 87A to the responder shown in FIG. 17E.

The usefulness of the combined testing is therefore a question of choice in design, structure and cost, and in which an RF transceiver, or several different transceivers and antennas may be employed in all the circuits 17B-17E shown, in some of or in none.

Same apply to the circuit 17A that is shown to employ plurality of RF transceiver 87B and antennas 87A, but can be structured to include range or combinations of RF transceivers and antennas, such as shown in FIG. 17A or none, for communicating using different bands or frequencies, including the disclosed above 25-60 MHz cordless telephone band that can be used in voice commands propagation signals to voice operated IoT's or Ai devices, for operating elements of the electrical grid via the optical link and/or recall e-commerce and e-service via voice command input, such as included in the controller 560.

The other element shown in FIGS. 17A, 17B and 17D are the rotary setting selectors 40RS-1 to 40RS-n, that are primarily used for setting identifications, or location, or function selection, all of which are replaceable by setting programs for recording the setting identification into the memory 87M via the touch screen of the controller 560, or by the calibrator 831 of the prior art, therefore the rotary set selectors may not be needed.

Same apply to the standard plug-in low voltage devices 902-912, wherein the identification location or the function that are set via the touch screen 561 of the controller 560 of FIGS. 21 and 22, therefore the rotary setting selectors or other setting selectors may not be needed or used.

Same apply to the testers 810 and 820, with the functions selection keys PK882 that can be replaced by touch icon and program setting, and the shown keys PK882 may not be needed and not used, or partially used.

FIGS. 19A and 19B show similar perspective cascaded intelligent support boxes and standard low voltage plug-in boxes, being mounted into wall boxes, wherein FIG. 19A shows the wall box 504 being installed with the intelligent support box 104-2D for supporting the AC outlets 211 and 212 of FIG. 5B. Another connected intelligent support box 103-n is shown to be attached to an AC operated IoT or Ai device 954-97 combining the voice box 954 and the camera 97 of FIG. 12D assembled into three gang box 103-n.

FIG. 19A further shows an electrically connected intelligent support box 103-1 powering load 1-3 (three light bulbs). The wall box 503-1 is shown in the back ground to include the intelligent support box 103-1 linked to the last POF segment in the cascaded chain.

FIG. 19A further comprising two non used wall boxes 503-3 and 503-4 with loose electrical wires L, N & G and a loose cascading POF 69, for enabling future introduction of plug-in IoTs and/or Ai devices, or communication devices, or other AC powered devices of the future Home Automation.

The field tester 820 is shown in FIG. 19A attached to the one open end of the cascaded POF segment, with the responder 840 is attached to the POF segment entering the wall box 504 for checking and verifying the conductivity of the POF segment, as explained above.

The installer (not shown) pressing the verify request transmit key PK882 of the tester 820 will generate a verify command request via the POF segment to the responder 840, that will read, compare the received command with given commands stored in the memory 87M of FIG. 17E and will respond with a confirming command or report an error when no matching command is found.

It is similarly possible that the command received is distorted command, i.e., an error is received by the responder, at which time the program provide for returning the error received command for further analysis by the tester 820 shown.

It is further possible that no command is received altogether, at which time the program is set to wait a programmed time duration of, for example, n milli sec. such as 0.5 sec delay to switch on an error indicator, to indicate no conductivity (no communication).

The incidences of possible errors are displayed on the screen 87SA, followed by warning, flashing or otherwise warning by color, such as switching a yellow color (processing) to red color (test failed) indicators.

The installer at this junction must physically check the POF segment cable for cuts, sharp bending, over twisting or other pressure or pull damages to the POF segment. If none is found, the installer has to replace the POF segment and pull a replacement cable through the pipe or conduit.

The procedure and steps to be taken when a defect is found are a subject of site management and directive how to correct. The important is the fact that a single working installer is able to check any single stretch segment during installation, and/or check the entire cascaded chain connected directly to a controller 560, a distributor 570 and/or a command converter 580 when the power is applied and the standard plug-in support boxes are powered, linked and operating.

Testing the whole cascaded line is even simpler as the only tester used is any of the shown testers, including the responder, that is programmed to transmit and receive an inquiry command, respond to an inquiry command two ways by verifying the returned command or indicating error.

The stated, for example, the controller 560, the distributor 570 and the command converter 580 of FIG. 21 and any other control device directly linked to a cascaded POF line, or to a bus line are all programmed to respond to a test inquiry, or any inquiry as programmed to check the given line elements, and maintain the functionality of each cascaded line 1-8, 1-16 or 1-n by checking and verifying processes, to simplify to the maximum, the verifying processes and further.

The verifying of each plugged-in device is simple, as the basic program recorded in the memory 87M of the intelligent support box and/or the standard plug-in support box, be it each individual plug-in box 102-112 or 902-912 that identifies each physical plug-in position within the box, and further programmed to record each plug-in device, be it electrical, IoT or Ai device and the "nature of the device".

Further, the recorded programs within the memories 87U of FIGS. 17A-E and the memory of FIG. 18 of the prior art including the memories of the control devices 560, 570 and 580 of FIGS. 21 and 22 are set to record each given room or zone name, such as kitchen, living or "Mike" (child room) as set by the dweller via the controller touch display screen 561, and further use the appliance "type", the physical control switch or connection position within the cascaded line (1-8 or 1-f) or the room name (1-8 or 1-f) to be the device address, similar to the disclosed address in U.S. Pat. No. 8,170,722.

Further, each control device 560, 570 and/or 580 is programmed to scan at least one cascaded or individual device line or lines at given times, such as once per 24 hours, and report defect(s) found via the controller display screen 561, with the control devices recording all correction performed and/or modification and changes made, keeping the programs and the address updated at all times.

The recorded type of appliance does not include the particulars of the appliance, such as model number, the name of the manufacturer, serial number and other identifying data.

Such data can be recorded by the dweller via the touch screen 561 or by downloading such data with the dweller consent into a separate program, providing particulars data only by dweller consent. This is in contrast with the power consumed data, that is reported to authorities regularly.

The above descriptions of the regular scanning of the optical and the bus-line grids, via each grid 1-n individually and its attached plug-in device, can only be performed when the system is complete and operating.

The testers 810, 820, 830 and the responder 840 are needed for the installing and connecting plug-in boxes into each given cascade line and the whole of the grids and particularly when the grid or at least one single cascade is malfunctioning.

Therefore, the use of the testers and the responder is needed during the installation of the plug-in boxes (when the installed cascaded line is not yet powered) by carrying the only possible to check and verify segment by segment, prior to attaching the two terminated ends of a segment to the boxes. The terms "box" or "boxes", refer to the intelligent support box or boxes and to the low voltage or standard plug-in boxes referred to above and in the claims, but does not cover or refer to the wall box or boxes, that are termed to be wall box or wall boxes.

The single cascaded segment may or may not be attached to any of the support boxes 102-112 or 902-912 and the checking and verifying conductivity and the "no error" read and the response are proper, can be processed by a set of limited protocols.

The protocols that need to be stored in the tester for further testing the propagated protocols and command accuracy, including signal levels (in milli volts) requiring signal measuring via the level set circuit 860 of FIG. 14B, programs and references, including data to provide updates and analyze defects found in a cascaded optical grid.

Such measuring and verifying programs may include further protocols, beyond the five byte disclosed in the U.S. Pat. No. 8,170,722.

Same apply for the need to verify the tests of the higher speed data, propagated at random, and the recording of a test data into the memory 87M, and/or programming the responder to record and re-retransmit the longer data, for the tester to check and verify the accuracy of the resent data, or trigger an error alarm and/or indication when the data stream, being short or longer stream is not identical.

Yet another testing and verifying the conductivity of a cascaded chain, is to check, test and verify the junction operation, be it a single or dual optical grids, propagating lower and higher speed signal.

Further, the testing and verifying of both speeds, via the lower and higher speed grid's signals i.e., via the two grids, or via a combined grid (H/L), the responder 840 and the control devices recited above to be the controller 560, the distributor 570 and/or the command converter 580 are structured by choice to respond to both signals as received via a single access, two accesses or limited to the lower speed or the higher speed.

The responses to dual signals by the controller introduces minor delays, measured in milli second units, thereby the responses via a single combined accesses does save testing time versus the more complex testing via two grids individually.

The listed testing particulars of dual accesses versus single access clearly show that the differences are minor, representing an issue of choice in structuring the testers and the cost saving by cutting the testing time (measured in seconds or a minute or two). The choice is simple i.e., to combine the higher and the lower speed for the purpose of testing any of the intelligent support boxes (102-112) and the plug-in boxes (902-912) or separately.

Above all, to simplify the process it is necessary to provide a master select and a procedure select via a key or a touch icon for the ongoing checking and verifying a single optical connectivity of each given segment and any portion or section of each given cascaded chain, with "no-error" readings.

The below listing summarizes the basic programs needed to be included and installed into the different testers 810 and 820 including the responder 840 and the tester 830 with the add-on adaptor 815.

To support the different testing and verifying processes, the below summary listing includes sub headers A-G to identify first the "nature of the test" or the "nature of command/response" to be;

A. Single Access—Single grid—Lower speed: SASL
 1. Single segment (POF only) via Responder: S-R
 2. Multi segments via Boxes via Responder: MBR
 3. Multi segments via Boxes via Controller: MBC
B. Single Access Single grid—Higher speed: SASH
 4. Single segment (POF only) via Responder: S-R
 5. Multi segments via Boxes via Responder: MBR
 6. Multi segment via Boxes via Controller: MBC
C. Junction—Single Grid Lower speed: JSGL
 1. Single segments (POF only) via Dual Responders: SDR
 2. Multi segments (via boxes) via Dual Responders: MDR
 3. Multi segments (via boxes) via Controller+Responder: MCR
D. Junction—Single Grid Higher speed—JSGH
 4. Single segment (POF only) via Dual Responders: SDR
 5. Multi segments via boxes via Dual Responders: MDR
 6. Multi segments via boxes via Controller+Responder: MCR
E. Junction Dual Higher and Lower speed: JDHL
 7. Junction Single segment (POF only) via Dual Responders: SDR
 8. Junction Multi segments and boxes via Dual Responders: MDR
 9. Junction Multi segments via Controller Responder(s): MCR
F. Dual Junction Dual grids—Lower and Higher speed—DJLH
 7. Single Segment via Dual Responders: SSDR
 8. Multi Segments via boxes via Dual Responders: MSDR
 9. Multi Segments via boxes via Controller+Responder: MSCR
G. Signal Voltage Measurement (Higher speed only): VM The "nature of the test" listed above directs to the testing and verifying modes of the many disclosed versions of the optical grids to cover and summarize the basic needs for the given test configurations and verifications as provided, for the two speed signals.

The present objectives of the present invention is to provide simplest and fast means to check, test and verify the conductivity and the functionality of the optical grid, or grids and perform the task of linking electrical switches, hybrid switches, outlets including IoTs and Ai devices with the electrical grid, via the intelligent support boxes and the standard plug-in boxes.

The shown reference of each test in FIG. 16A and as listed above are the given alphabetic identifying references for selecting the test programs, as listed in the table above and referred to in the shown display screen of FIG. 16A.

The references displayed into the touch icons of the display screen 87S, are the references included in FIG. 16A. The actual icons however, are illustratively drawn icons (not shown) for the recall via a touch of a selected given icon for proceeding with the test program, followed by TX or RX or VM step touch icons, into the processing display area, for further indicating by color for example, the test being processes and the result of:

The test is initiated by a command transmit TX-Test followed by a command transmitted and a response (if received) R—No error or—Error or no response. When no response or "no error" is displayed, as shown in FIG. 16A display 800T.

When the test is applied via the Higher speed, it is preferable to send a command for signal measuring and the responder 840 or any of the control devices 560, 570 and 580 will measure the received and amplified signal using the level set value via the I/O 0.73V value shown in the display 800-VM, as a gauge to the measurement and automatically increase or decrease the signal level via the level set I/O port T2 or T5 (left or right) of FIG. 14B.

If the value is in a range, such as (for example) 0.5-0.8V, the signal as measured will be recorded into the memory, and the response will be transmitted to display the measured level (for example) 0.63V followed by new level set at 0.8V (by self increasing the set level of T2 or T5 (left or right).

The new value prompt a retransmission of TX Test, and a response RX No error or RX error. The adjustment of signal level is made possible by the permanently fed two way signals for the only two signal sources on both ends of the POF segment.

Moreover, as the first test is for single POF segment, it should be simple to check the terminations of the POF, or the actual attachment to the responder and to the tester itself.

The handling of an identified error mandates a directive manual "how to process a discovered error" and it is not the object of the present invention, that is an introduction of a novel tester or testers that process the testing and verification (of the transmitted commands or data), in a simplest possible process by electrical grid installers as explained above.

Similar processes are provided for all other test, via single or dual accesses or junction, be it the single grid or dual grids, wherein the test has repeated steps for each TX transmission and RX receiving, and the means to measure the signal level that is recommended, even if the response shows No error.

The items needed to be checked in regards to signal level, are, i. the length of the POF segment, ii. the termination (the cut of the POF end) and the attachment of the cut (terminated) end, of each cut end into each access in the cascade. A tight attachment in needed to reduce signal loss.

Such checking and verifying during the install and attach the POF segments, is the most effective process to ensure high reliability cascaded grids, while each test can be completed in few seconds or minutes, such as 4-5 min, at most to attach two terminated end to the tester and the responder accesses and touch the icon(s) of the tester and wait a second for a response.

Figure 20A:
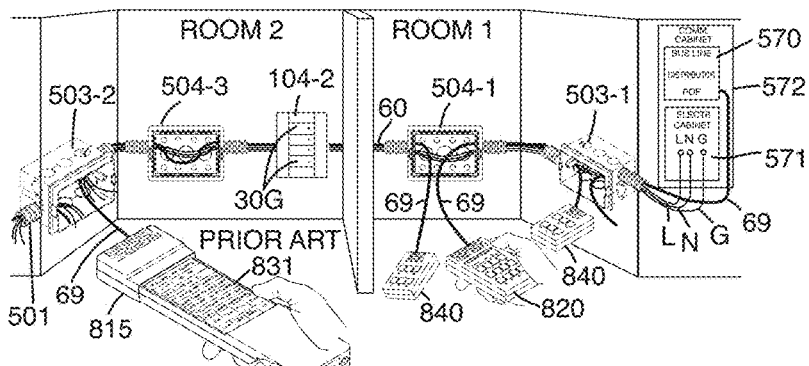
FIG. 20A-20D are illustrative drawings showing the use of the different testers and responders of FIGS. 16A-16D for testing the cascaded optical grid in different setup and other variations.

FIGS. 20A-20D illustrate the different set-up and process of the test and verification wherein, FIG. 20A shows tow tests carried one via the combined tester 830 linked for testing two POF segments, the one segment is passing through a blank wall boxes 504-3 and 104-2 shown to include four plug-in light switches and exit from the blank wall box 504-1 linked to the responder 840.

The other test of FIG. 20A is processed via single POF segment drawn from the wall box 504-1 to a wall box 503-1 by a tester 820 and a responder 840, for checking the conductivity of the POF segment drawn through the pipe, between the two wall boxes, i.e., 504-1 and 503-1.

Figure 20B:
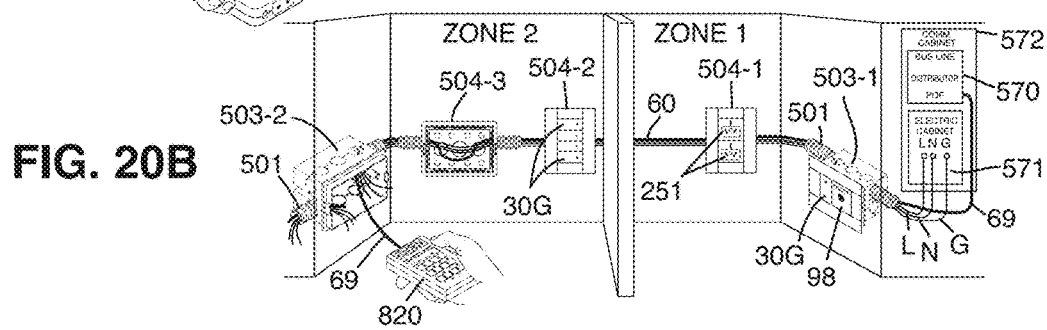

FIG. 20B illustrates the testing and verifying the conductivity of the entire optical grids between the tester 820 and the distributor 570 linked via dual blank wall boxes 503-2 and 504-3 and three installed intelligent support boxes (104, 104-2 and 103-2) shown connected to the AC power grid via the power lines L and N and the ground line G in the electrical cabinet 571. The first optical segment is linking the single optical grid of POF cables 69 to a distributor 570 included in the communication cabinet 572. The intelligent support box 503-1 is shown to include an hybrid switch and AC powered camera 98.

All the four grids of FIGS. 20A-20D show dual zones or rooms 1 and 2 powered by the electric grid L, N and G with the optical grid 69 mixed and mingled with the electrical grid stretching from the combined cabinets 571+572 to the exit pipe 501 from a wall box 503-2. The differences between the four shown systems are the shown testers 810, 820 and 830 and the tests being carried by the testers in combination with the responders 840 and/or the distributor 570.

Figure 20C:
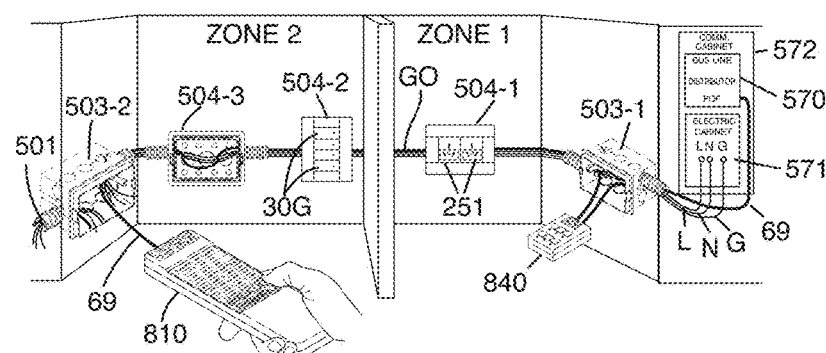

FIG. 20C shows a similar test via the tester 810 to the shown test in FIG. 20B with the introduction of the responder 840 replacing the intelligent support box 103-2 to link the grid with the distributor 570, wherein the responder 840 perform triple functions/test, which are:

i. responding to a received test transmission from the tester 810, and ii. simultaneously propagates the test command to the distributor and receive the response from the distributor (verifying or not), and iii. re-propagate the received response (between the distributor and the responder), and iv. with the responder, re-propagate the distributor response to the tester 810. Thereby verify the 810 to the responder link, the responder to the distributor link and the link between the distributor and the tester 810 via the responder 840.

Figure 20D:
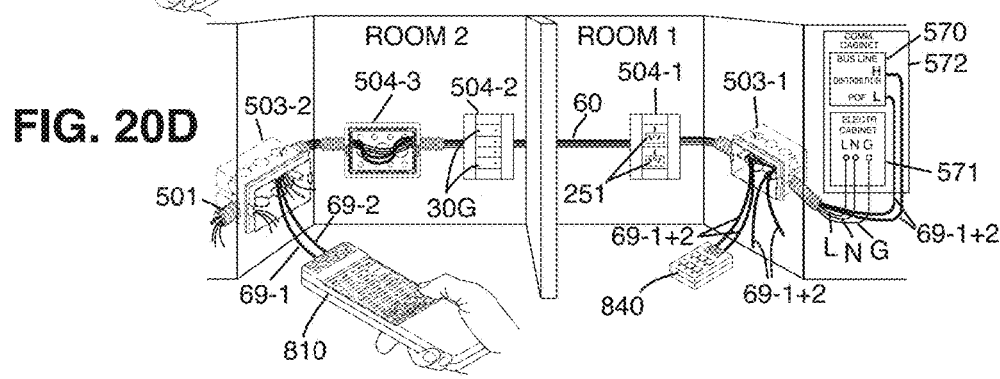

FIG. 20D shows the same testing set-up between the tester 810 and the responder 840 via dual optical grids, the lower and the higher speed individually, wherein the testing procedure is duplicated (self generating all steps) i.e., starting with TX transmission of test command of the lower speed via the lower speed grid and receiving the response from the responder, proceeding and transmitting the test command of the higher speed, via the higher speed grid and receiving the responder response and when both result in no error, the test is complete.

If the test fails (error or no response) the same procedure as disclosed above for error, etc., is carried out.

The test shown in FIG. 20D does not show or give an answer to the not tested first segment of the two grids, from the box 503-1 to the distributor, as the responder 840 shown in FIG. 16C, is provided with only one L access and one H access. Such responder cannot link dual junctions of both L and H optical speed signals.

However, the testing of first cascaded segment of the L and H junctions connected to the responder 840 or the tester 810 can be tested and verified by a further test between the responder 840 and the distributor.

Alternatively, the use of a responder with dual junction L and H, if the choice to use a costlier responder 840. Such four accesses responder will enable simple test of the dual grids of FIG. 20D, similar to the single grid test of FIG. 20C.

Another option is to connect the tester 820 instead of the lower cost responder 840 between the POF segments of the wall box 503-1, and connect the responder 840 to the segments of the wall box 503-2 to replace the tester 810.

As the optical conductivity test of the present invention objectives are limited to testing of conductivity of optical cable having a larger core such as POF cable, it is obviously clear that the well known multi mode silica (glass) fiber with thicker cores that can be tested for conductivity by the present inventive tester and that the present invention, cover other optical fiber cables, such as disclosed in the many prior art inventions and recited patents that cover other currently available fiber optic cable or to be introduced in the future to be covered by the claims of present invention.

Moreover, no field test for verifying the conductivity of bare core fiber end, is known to exist or serve a purpose. All testing made in the field of communications, be it in building or surround or open spaces, or under water all are based on testing fiber optic cables fit with plug assembly, as it is literally impossible to test the end cut of a fiber optic cable in the field, such as during installation in a building or outdoors, without fitting a connector first, including the lapping process, that is a mandatory process for ensuring no-error by silica (glass) fiber.

Any change in the wall boxes orientation such as vertical/horizontal, or the electrical wiring devices such as hybrid switches or AC outlets has no bearings on testing of the conductivity and the optical communications between the intelligent support boxes or via the blank wall boxes, prepared for future introduction of standard plug-in boxes such as into the wall boxes 504-3 and 503-2. The box 503-1 is shown to contain intelligent support box such as 103 to operate IoT's or Ai device shown as AC powered operating camera 98 with face recognition (for example) disclosed and explained above.

FIGS. 21 and 22 show the conceptual connection and wiring diagrams of the home automation or the combined smart home grid of the present invention, combining the many known communication signals, including electrical signal, wireless signals, optical signal and voice signal to jointly operate IoT's, Ai's, electrical wiring devices and appliances, including but not limited to each and every element or appliance powered via AC outlets that are manually controlled, self controlled and centrally controlled via the shown grids, connected to at least one controller 560, via a distributor 570 direct or via a command converter 580 that is also known as an interface.

FIG. 21 shows the electrical wiring grid connected to the power terminals L (live AC), N (Neutral AC) and ground terminal G, in cascaded chains via wall boxes, such as 503-512 and intelligent support boxes 102-112 disclosed above to electrical wiring devices such as SPST hybrid or manual switch S-3 and/or outlets such as 211 disclosed above.

The well shown electrical cascading grid combining L—live AC, N—neutral AC and G—ground wire connections start at the electrical cabinet 571 with the electrical wires are shown in FIGS. 19A, 20A-D, 21 and 22 to be mixed and mingled with an optical cable POF, that is cascaded via two way in-out junctions of FIGS. 14C, 15A and 15B.

FIG. 21 shows four lower speed OPGL cascaded lines of FIG. 14C, and FIG. 22 shows three dual cascaded lines OPGL+H of FIG. 15E and one OPGH/L line of FIG. 15B.

The four shown cascaded lines forming the optical grid are linked via the distributor 570 via four POF cables 69 and into POF accesses 1-n of the distributor 570 as shown in FIG. 21.

Each of three POF cascaded line comprising the electric wires L, N & G and the POF cable 69 are cascaded through at least one blank wall box 503 with the POF segment and the electrical wires are shown to be loose within the wall boxes, be it 503, 504 or 506 shown in FIG. 21.

The fourth optical grid connects the low voltage bus-line CAT-5 75 to include two IoTs (touch pad) devices 911A and 913A and a single Ai device to include voice box 958A for operating electrical devices and appliances by voice.

The wall box reference numeral 503 or 512 refers to the maximum capacity of gangs, such as 504 can accommodate intelligent support box or standard plug-in support box 104 or 904 respectively. Wall box 912, for example, is a wall box with a capacity for accommodating twelve gang plug-in boxes be it 112 or 912.

Wall boxes can be structured into a long stretch, for vertical or horizontal mounting, or can be structured to accommodate, for example, twenty four gang wall boxes, accommodating three intelligent support boxes, such as 108 or three standard plug-in boxes 908 mounted side by side, or accommodating dual 112 or 912 plug-in boxes, or four 106 or 906 plug-in boxes mounted side by side.

The other grids shown in FIG. 21 are three cascaded low voltage bus lines propagating electrical signals, such as the known low voltage differential electrical signals via CAT-5 cable 75, but can similarly propagate analog voice signals, such as voice signal of telephone lines or voice generated by a plug-in voice unit 954A of FIG. 12D, or the shown combination Ai of voice speaker device 958A.

The grid combining the shown cascaded lines can further communicate via RF signal in given bands, frequencies and modulations, be it Wi-Fi, Bluetooth, UHF or cordless telephone communicated voice signals via the antenna 87A of the shown controllers, such as the monitor/controller 560, the distributor 570, the command converter 580, including variety of standard plug-in devices, such as the shown Ai device 952, the voice speaker combination 958 and the low voltage touch pads 951A, including the AC powered touch pad 951, all communicate via at least one RF antenna 87A shown in FIGS. 21 and 22.

The different communication signals propagated inside home, or high rise residence, be it small or larger apartment, the incidence of collision between "communicating signals" generated by differing devices, including such as voice communicated by two or more dwellers of the same family, with two or more different voice boxes simultaneously, ends up with dual or more colliding converted voice signals, be it electrical, RF or optical command signals, that are bound to collide, following the rule that if they can collide—they will collide.

Considering the on-going need for signal propagation within the confines of a given residence, it should be absolutely clear that the incidences of signals propagation pertaining to the living, within a given confines, such as an apartment of higher rise, or lower rise, or single home are non continuous, random and conceptually short.

Such incidental or occasional signal propagation will be substantially upgraded to a literal perfection, by having a central processing unit CPU, or pluralities of CPUs included in a unit or units termed controller 560, or command converter 580, or distributor 570 or video interphone, or shopping terminal or set-top box, or a shopping box or a television, disclosed in U.S. Pat. No. 8,117,076, to control the communication traffic throughout, be it a residence of a building, or home, referred to above, or offices, shops and other business.

Such traffic control can be provided by controlling each cascaded segment via the optical grid discussed above and via each of the bus lines individually that can also be implemented to control the signal traffic at low cost as explained below.

The U.S. Pat. No. 8,170,722 discloses five byte code structured command, as referred to above, wherein the header identifies the signal to be bus line (low voltage), IR (in open air), RF and optical (via POF). The sub header is disclosed to be identifying the nature of command and acknowledge status. The third byte is the link code from source to zone and zone to source.

The fourth byte, termed ID-CODE lists given operate commands and responses to and from a given appliance in a given location i.e., room or zone of the premises and the last (fifth byte) is the trailer (checksum).

The fourth byte, disclosed in the 722' patent lists one byte commands and responses 0x01 to 0xff that are organized per particulars of the type of appliance, and the power switch or the outlet locations. As the type and the location of the appliance and its power source (switch or outlet) are all recorded in the memories of the plug-in box 102-112, the controller 560, the distributor 570 and the command converter 580, any of the above particulars need not be introduced in the header, sub header, or into the link code of a command or a response directed to and from the plug-in box, be it a switch, an outlet, Ai or IoT.

Therefore the operating of any given appliance, be it light in any of the rooms or zones, HVAC, or curtain, or television receiver, need not be addressed in the command or response propagated within any of the cascaded chain.

This makes the three byte address propagated within the cascaded chain to the box number 2-6 and the position number 1-*n* within the box, with the left side gang being the first or number one plug-in device. Such short address simplifies and shorten the communication within each cascaded chain, yet provide identification to the appliance, the appliance location and the plug-in device (the power source) position, enabling to address by the forth byte of the referenced U.S. Pat. No. 722' to cover the operation of all conceivable appliances within the premises.

The same applies to both commands, propagated within the optical grid or the low voltage bus line signal through a cascaded chain, need not use the header nor the sub header, as it needs not identify the source and the propagated signal.

The cascaded grid is fixedly connected to a controller (source) and it communicates optical or electrical (low voltage) signal throughout the cascaded lines and to an appliance or IoT or Ai device linked to a signal source within the cascaded chain.

The object of the signal propagation is to transfer an operation command for an action by a given appliance, linked to and operated via, an example, a given hybrid switch to switch light on, or via a switchable outlet, connected to an oven via the cascaded chain or within the cascaded chain. This is followed by reporting the appliance status and/or reporting the power consumed by the switchable given outlet of a given support box within the cascaded chain to the distributor 570.

The five byte command structure are needed for communicating between individual appliances, including hand held remote controls, IR for example, from one room to another, with no line of sight, wherein the command must identify the signal being propagated to the distributor.

Addressing a plug-in device and/or appliance powered via a plug-in outlet of a given cascaded chain, linked via POF, can only be optical signal. Same applies to an IoT device connected in a twisted pair bus line, inside wall pipes or other conduits can only be low voltage electrical signal. Cascaded lines can only be addressed by a pre-programmed addresses, allotted to each cascaded line, and its plug-in device position within the standard plug-in box, be it optical signal via POF or electrical signal via twisted pair.

The cascade starts via the first connected box of the cascaded chain, connected to a controller 560, 570 or 580 is the only option available. Same applies to an intelligent or standard plug-in support box individually connected to a controller direct or via a distributor or via a command converter with the two ways signals cannot be other than electrical or optical, this includes the propagation of voice signal be it optical or via a twisted pair.

All the other cascaded boxes operate two ways in two directions, termed above to be left and right, are therefore locked into the grid signal be it optical, bus line or voice.

The shown distributor 570 is provided with eight or "n" optical accesses, as an example, and the four or "n" bus line accesses, as an example. The above makes it obvious that all outgoing commands and incoming responses, statuses and power consumption reports are addressed to and from a given identified cascaded line via the first cascading box.

The well known common wiring devices, such as mechanical switches and AC outlet installed in a 120-150 m$^2$ ($\approx$1,120-1,400 feet$^2$) unit will be (high average) between 50-55 individual devices. Premises unit of over 220 m$^2$ ($\approx$over 2,000 feet$^2$) will be installed with (high average) of 60-75 devices.

Considering the above, for establishing the essential limit to given codes for identifying each given device in a single premises (apartment, home, office or other business), connected via 16 cascaded chains of boxes, with each line links a maximum of six cascaded boxes, will be a total of 96 boxes.

Linking 96 combined plug-in boxes with each intelligent or plug-in support box containing two plug-in devices only (such as 103 and 903), the number of plug-in devices will be 192, which is far more than needed for over 500 m$^2$ unit, leaving more than large number of unused (blank) plug-in positions, or linking far less cascaded lines, such as a total of 6-7 lines, each with 4-5 cascaded plug-in support box.

Considering that each linked plug-in device code is stored in the control 500, 570 and 580 memory, self set by the dweller with limited details of the attached plug-in device. The limited details are pertaining to (as an example) the electrical load, attached (such as light, the light location, the switch location and the room or zone name (that can be recalled by voice) or the appliance that is fixedly connected to plug-in AC outlet.

There is also a need to identify the plurality of commonly unused AC outlets to be a "random" outlet for randomly connected appliance. This can only be entered by the user (the dweller).

It should be clear that a command between any of the boxes within the cascaded chain need not be addressed beyond single assigned alpha numeric character code, such as 0x01-0x06~0xf1-0xf6 for a total of the maximum 96 boxes code addresses. Such address can be programmed into the third byte (the link code) disclosed in the U.S. Pat. No. 8,170,722, replacing the codes for each individual device appliance.

This enables to reduce the propagated command and responses between the cascaded boxes to three byte only, substantially improving and simplifying the cascaded traffic.

The propagation of the three byte commands, i.e., the modified link code, the appliance operation and command, and the trailer checksum can be propagated in two versions. The first mandates the loading of appliance particulars and plug-in position particulars into the memory of the intelligent support box or the standard plug-in support box. Such installing or loading data in each support box individually, that is not known or available at the time of installation is complex and presents a serious issue.

Once the apartment, home or business is occupied, a dweller can load such data via the controller display screen, but the process is complex, mandating change in each of the plurality of boxes, requiring a knowledgeable professional.

To simplify the loading of data pertaining to each plug-in device function, location, within the box and the room zone, as named by the dweller, the appliance and the appliance function key and its remote control signals and commands, including any changes made to the system and the appliances locations cannot be handled by a dweller.

Such flexibility is not possible with data recorded into each box memory pertaining to each plug-in device. Such simplicity, allowing the dweller to set, modify or update the system via the controller 560 touch screen is provided by programming the intelligent support boxes and the low voltage plug-in support boxes, with active cascading address program.

The active cascaded address provide for the single byte link codes 0x01-0x06~0xf1-0xf6 addressed to the first connected plug-in box to become self updating numeral, wherein the initial link code (during setup) is amended by the first plug-in box to propagate ascending order address numeral 0x02-0xf2, transmitted to the second box of the cascaded chain.

The second box will automatically record its position to numeral 0x02 and will regenerate the next ascended order address numeral 0x03, if no box is connected or responding within a given time set duration, the cascade will be recorded by the distributor 570 and the controller 560 or including a command converter 580 to be a cascade chain of two boxes only.

Same apply to the third, fourth, fifth and sixth boxes of a given cascaded line. The CPU 87U of FIG. 17A is programmed to block the sixth cascaded box or any other last box of a given cascaded chain from any further communication via the sixth or last box, such as with its left access shown in FIGS. 14C, 15A, 15B and 15C-E.

In the process of setting up the network addressing and recording, and/or during re-setting or amending the grids(s), such as introducing new IoT's or Ai or adding new AC plug-in devices to the blank wall boxes, referred to above.

The responses from the last cascaded box is programmed to decrease or generate descending numeral order from the last numerical by one, such that the last box 6 will generate address 0x05-0xf5 and the following box will propagate a further descended order address 0x04-0xf4 with the second box in the cascade propagate the address 0x01-0xf1 to the first connected box, responding to the controller (560, 570, 580) with the original address of five bytes, detailing the set-up of the six boxes or any other number, or a single box only if no second box is connected (or responding).

Each of the CPU 57U of a given upgraded intelligent support box 102-112 or standard plug-in support box 902-912 is recorded with particulars of the plug-in structure for each given plug-in devices to be attached, such as AC outlet (2 gang) with three terminals L, N and G (ground) for three pin plug, or three terminals N, L1 and L2 for dual two pin plugs with no ground, AC hybrid switches SPST with L, load and coil feed terminals, or SPDT with L and dual T1 and T2 traveler terminals and coil feed terminal, or no coil feed terminal for manual SPDT switch.

Same applies to DPST and DPDT hybrid and manual switch, and any of the IoTs and Ai plug-in position, be it single gang, dual gang, or n gangs, all are structured for including the terminals (or no terminals) for each device. The CPU recording of the plug-in device is programmed to be within given pattern, maintaining the needed standard for all the referred above plug-in devices, gang size, the terminals, the positions of each device—read from left to right, as an example, to be first, second—n position—the last, which is communicated with the controller to display the plug-in box with each individual plug-in device size and position within the displayed box.

Such standard specific structures are recorded in the memory 87M of the CPU 87U of each standard plug-in box and in the memory of the prior art of FIG. 18 of each intelligent support box.

The only remaining items to set up the grid is by the user, to enter the room number or name for each given box, the light number or name for each switch, or for each operated curtain, or blind or window shutter, or water boiler and identify each permanently connected appliance, such as washing machine, dryer, dish washer, garbage grinder, refrigerator, and stand alone freezer, oven, micro wave oven, or cooking range and similar.

The other randomly used AC outlets, plugged into by a randomly used appliance (hand held hair dryer as an example) can be updated randomly via the controller touch screen 561 or the appliance plug can be fitted with RFID tag 39T shown in FIG. 4C and disclosed in U.S. Pat. No. 8,930,158 or via optical accesses 38-OP shown in FIG. 4B.

The shown optoports 38-OP are disclosed in U.S. Pat. Nos. 8,148,921 and 8,344,668 and in the other disclosed above US patents. The AC power cord of a given appliance comprises an active optical access or a terminated POF cable linked to optical access included in the appliance.

The optical linking thereby, extended from the AC plug aligned with the AC outlet optoport, disclosed to be accessible via the sensor entry SE shown in FIGS. 2C and 10C with the sensor structure 38-OP (optical) or 39 (RFID) is shown in FIG. 4A.

The RFID tag 39T attached to AC plug is identifying the type of the appliance being powered via a given outlet. The optical access 38-OP is further providing full two way communications between the plugged appliance, the box and the controller, for operating, reporting power consumed and any other ongoing communication of data with a data source via the AC outlet.

The optical accesses can be used for ordering e-commerce and/or e-services via the controller and/or given appliances incorporating such capabilities, as an example is the known refrigerators or washing machines, or with future IoTs or Ai plug-in devices.

The optical accesses and RFID antenna are shown to be extended via the box to be positioned against the AC plug surface to be in literal touch in a close proximity.

Same is not needed for the IoTs or Ai devices of the future, moreover the proximity of the two surfaces, the plug-in device's bottom or rear surface and the box (102-112 or 902-912) top inner surface are in literal physical contact, enabling peer to peer direct RFID two-way, read-write communication and the obvious two way optical communication accesses shown in FIG. 12A structure 80 with a bottom or rear access 67 or 68, structure 82 shown with n-accesses 67-*n*, 84C structure is shown with two optical accesses 67 or 68 at its bottom, and structure 84T show a single optical access 67 or 68.

FIG. 12B further shows dual optical accesses 68 and cable access CA for linking to Ai camera with face recognition 98B. FIG. 12C shows dual optical accesses of a box 104-2-OP for two plug-in devices, AC outlet with optical access OP-38 via a rear access SE shown in FIG. 2B for the extended optical access 68SS of the box 104-2-OP of FIG.

12C, including an optical access 68 via the internal cover surface for the plug-in AC powered camera 98A.

FIG. 12D shows the voice plug-in device 954A with plurality of low voltage bus-line terminals 55 and power terminals 56 and a rear optical access (not shown) for providing electrical signal, DC power and optical accesses for communicating analog or digital optical signals with the voice box via the terminals 65 and 66 respectively, and via the optoport 68 of the box 906-M, to prevent "hum" from reaching and distorting the received voice signal. "Hum" is explained further below.

For RF propagation (in open air) it is not possible to apply the shorten simplified address referred to above. However IoT or Ai devices installed by a standard plug-in device into a given cascaded plug-in box of a given cascaded line, be it 102-112 or 902-912, enables to access the IoT or Ai devices for communicating commands, data or voice via optical or electrical or voice (analog or digital) signal, via the shorten address.

The commands, be it optical or electrical can well include group of commands to control the Wi-Fi or any other RF communication, including the "intend to transmit" (RF) command, or request for transmit permission, and timing response with the band, channel, and other particulars as recorded in the controller memory.

The recording of RF particulars can be self processed at the time of installing an IoT or Ai device, by feeding the RF particulars data via the applicable grid, be it originally installed or at the time of adding IoT or Ai device to the system, and into a standard plug-in box installed into a blank wall boxes 503, 504 or 506 shown in FIGS. 19A-B, 21 and 22 or larger size wall box. It can also be a blank space within an installed and connected intelligent or low voltage plug-in support box.

This makes it obvious that signal traffic control inside the confined space of a residence or office or other businesses, can be well operated via the cascaded intelligent support boxes and the standard plug-in support boxes, or as termed via low voltage plug-in support boxes, can provide traffic control to all signals, including RF signals, be it Wi-Fi, Bluetooth, UHF or cordless telephone frequencies.

Considering that a short delay in the random control and communications between an element of the given apartment, home or business, caused by generating the "ready or intent to transmit" pulse or code, or request permission to transmit and a confirming or denying response causing a short delay is perfecting the infrastructure network.

Be it via the optical or electrical cascaded signals that blocks the adjacent cascaded plug-in boxes, or any RF capable plug-in box of a given cascaded line, will not affect, on the contrary will upgrade the on-going control and/or operate electrical devices or appliances by the minute delay (part of a second) the request may cause.

Managing the Wi-Fi or other RF signals transmission propagations within a given channel of a given band, in a crowded environment may reduce the incidences of collisions, that damages, as currently experienced, by the use of Wi-Fi or Bluetooth or other RF signals for home automation systems, but cannot solve the fundamental issues and problems involved.

Moreover, as disclosed above and in FIGS. 19A-22, the IoTs and the Ai devices are physically introduced into support boxes 102-112 or 902 to 912 or larger, each IoT or Ai device is confined to a given grid, be it the optical or the bus line grid connected to the control device 560, 570 or 580, that can time, synchronize and coordinate its wireless signal with no collisions. Augmenting the Wi-Fi communication in crowded space by blocking the random transmission for a duration of milli seconds units, cannot cause any difficulties with the operation of electrical appliances, IoTs or Ai devices. After all the time it takes for a relay or a mechanical switch (or a triac IC that its delay time is 16.6 or 20 milli sec—zero cross) to operate, as stated above, is similar or longer than the delay time needed to enable peer to peer uninterrupted RF communication, discussed further below.

The voice plug-in devices 954, 954-97, 954A, 958 and 958A shown in FIGS. 12D, 13C, 19A, 19B, 21 and 22 can communicate via optical signal, be it analog audio signal or coded stereo signals via POF grid OPGL or OPGH, or via bus line grid, or via a single twist pair including power feed to the voice circuit of the plug-in devices as disclosed in U.S. Pat. No. 8,131,386 and via RF using the 900 MHz band or the 43-50 MHz and/or other frequency bands and channels of the cordless telephone, as allocated by the authorities.

The advantage of propagating short voice commands for operating appliances, within the apartment confinement, via the optical grid to a control circuit, such as 560, 570 or 580 that includes circuits to identify and convert the voice commands into given codes, be it for e-shopping, or for e-services is advantageous, as it can transform the voice control to a major base for daily activities, include the communication with bed ridden, or the elderly for medical help as disclosed in U.S. Pat. No. 8,131,386.

Another clear advantage in propagating analog voice signals via each cascaded line of the optical grid is the absolute isolation from noise and the 50-60 Hz interference, known as "hum", that distorts voice signal propagated via copper wires in a vicinity of power lines. Particularly when the voice over copper lines is non "floating" i.e., having ground or power line reference, mandating separate conduits and shielding for voice copper lines, far from the electrical grid, which is not simple in a confined size of an apartment, or home, or office or other businesses.

The optical voice signal of the present invention enables the control line of electric elements within the electrical grid, via the intelligent support boxes 102-112 of the prior art directly, or routed via the control devices 560, 570 or 580 to control and operate any of the electric powered appliances and devices of given residences and businesses.

Further, voice control can be directly fed to an IoT or Ai device via the low voltage grid, be it via voice identification and command recognition, within the IoT or Ai device, or transforming the recognized command via the voice plug-in device 954, 954-97, 958, 958A or other operated voice devices linked to the system via RF antenna. With the propagation of signals are timed via the optical grid (intent to transmit) by denying all other elements of the combined grids, operating on same RF channel/frequency from transmitting RF signal for the duration of the RF transmitted voice command.

To summarize, the voice signal can be distributed in its analog original form, free from hum and noise, via the POF optical grid or grids. The voice can also be propagated via floating single twisted pair and/or via the bus line in an encoded signal and/or via cordless telephone circuits in variety of authorize frequency channels and bands and/or operate the intelligent or smart home devices throughout the residence, home or business via a controller such as 560, 570 or 580.

The voice control circuits inside the controllers enable to positively identify the voice of dwellers and friends, and further programmed to identify "strangers" when no family and/or friends are in the premises.

An Ai plug-in voice box 954 can allow friendly visitor to enter the building and/or generate alarm when a non recognized person by voice 954 or image by a camera 98 or 98A is entering the building without being allowed to enter, verified at time or timing when no dweller actuated the door lock to allow entry to a "stranger".

Further, the system may allow to identify each person (and his picture) of the family members with permission to command an order for e-shopping and/or services and limit the amount or the product or the services a given person of the family can order.

The system can generate alert when a "stranger" is ordering by voice, or via a touch screen of the controller (the shopping terminal) via a camera 97 shown in the control 560 of FIGS. 21 and 22.

Other devices of security items are motion detection by the cameras disclosed above and by the well known motion detectors, that are not shown, but can be installed into the blank wall boxes that can be used together with the cameras and voice devices at time when movement is detected, but no family member or known guest is identified.

Such programs to enhance security by IoTs or Ai devices, that can upgrade substantially the security in residences or offices or businesses, can be installed into the blank boxes 503 or 504 or 506 and other gang sizes shown and not shown in FIGS. 19A-22.

The controller, monitor and display 560, the distributor 570 and the command converter 580 of FIG. 21 are shown to include an antenna 87A, but can include several antennas and RF transceivers for communicating Wi-Fi, Bluetooth, UHF bands, and/or cordless telephone frequencies as authorized by the authority.

The shown distributor comprises and operates via a well known central processing circuit (not shown) that is well known to be a CPU, similar to the CPU 87U of FIG. 17A with plurality of I/O ports including assigned n I/O ports and circuit 575 for voice recognition and interfacing the voice commands for integrating the different individual cascaded lines, be it the optical grids, the bus lines and the RF signal communications into a combined smart home grid.

As disclosed in U.S. Pat. Nos. 9,514,490; 9,679,326; 9,684,921; 9,684,922; 9,684,923; 9,741,068 and other patents disclosed above, the controller 560 is further combining the circuits and programs of a shopping terminal disclosed in the above six and other US patents, as updated to further processes the e-shopping by voice commands propagated via a standard plug-in voice device such as 954 of FIG. 12D or 958 of FIG. 13C or direct via the shown microphone 94, included in the shopping terminal i.e., the controller 560 of FIGS. 21 and 22.

Another fundamental element for shopping recognition or identification is the use of face recognition program installed into a camera such as the shown camera 98B of FIG. 12B, or 98 of FIG. 12C, or 98A of FIG. 12D or combined with the plug-in voice device 954-97 of FIGS. 19A and 22.

The camera 98A is also shown embedded in the monitor-controller, termed also shopping terminal. The shopping terminal is also disclosed in the above listed six U.S. Pat. Nos. 409'-068' and U.S. Pat. Nos. 7,461,012; 7,945,032 and 7,973,647, disclosing the shopping terminal to be a touch screen monitor of a video interphone system.

Video interphone is commonly installed in high-rise and houses for entry control via an entry panel also known as door unit, well known to enclose a camera for identifying visitors, enabling a dweller to remotely open the building or the house entrance/door.

FIG. 22 introduces the dual optical grids OPGL+H for linking the prior art intelligent support boxes 102-112 and the higher speed standard plug-in devices, such a camera and voice device 954-97 including blank wall boxes 503, 504 and 506 or other sizes for future adding standard plug-in devices, to be AC powered and optically linked by either the lower or the higher speed grids, both are connected to the distributor 570.

The other grid shown in FIG. 21 is the bus-line linked via CAT-5 (75) cable as shown between the distributor and low voltage plug-in devices 957A and 952A Ai device disclosed above and a combination of voice and touch pad 958A, powered by low voltage fed by the CAT-5 with DC power, supplied by the DC power supply 571 included in the communication cabinet 572. The power supply 571 powers the distributor circuits including the command converter 580 of FIG. 21.

The low voltage grid cascaded via CAT-5, can be replaced by a single twisted pair for communicating two way signals and power feed via single twisted pair as disclosed in the referenced patents above. Other items of importance are the communication signals for propagating command protocols and data between the IoTs and Ai devices 957A, 951A, 952A, 953A and 958A and the distributor 570 are via at least one twist pair of CAT-5 cable 75, yet the voice device 958A is further shown to be linked via POF cable 69 disclosed as optical grid OPGL in FIG. 21 and OPGH in FIG. 22.

The introduction of optical grid to mix and mingle with the low voltage bus-line provides uniformity throughout the premises and in the particulars of voice signal, the optical grid provides for propagating analog voice signals with no electrical noise or the 50/60 Hz hum affecting severely the quality of the voice signal in copper lines.

It is well known that hum noise makes it difficult to recognize the propagated voice signal, and depending on the hum levels (due to adjacent AC power lines), proper voice recognition may be impossible.

The issue of the propagated voice signal through is an issue or issues of choice, yet the possible errors in recognition and/or in the reading a voice command, be it analog voice or digitally converted electrical signal, the preferred communication is the use of optical grid, particularly as it provides clear advantages at low cost.

As the distributor 570 of FIGS. 21 and 22 is distributing two way signals via all its connected signals, by self conversion and/or interfacing circuits, accordingly the converter 580 may not be needed and is not used in the communication box 572, or may be needed for specific conversions of given signals.

The above disclosure and explanation make it ample clear that the present invention provide a simple, viable, low cost solutions to the absolute need to structure a physical grid or grids to link all the IoTs and Ai devices currently existing, and/or being developed to be introduced into future devices with intelligence to create conveniences, efficiencies to the dweller of residences, homes, offices and other business.

It should be further clear that the wrong anticipation to solve the overcrowding of Wi-Fi or other RF signal in the interiors of premises did not succeed, despite the almost 20 years of research and development, particularly at present time when IoTs and Ai devices are being introduced into the market.

The need to have a grid that can be upgraded, added to and modified if necessary or desired. Such add on must be designed for introduction without major renovations to walls and the electrical wiring, such as provided by the present invention, enabling to go forward.

The present invention overcome the eluding hope that Wi-Fi is the solution to Smart Home, Home Automation, smart city and the solution to power consumption reporting that never existed, outside some plug-in sensor/adaptors, that can never be a base for "smart electrical grid", such as providing full control and power consumed reporting by each and every electrical device and appliance, disclosed in the present application.

The upgrading, adding, replacing or modifying installed plug-in devices stated to be "standard", shown and disclosed with approximate sizes, does not intend to be a fixed "non bending" size or sizes, or be a patentable sized item.

The reference to "standard sizes, shape or design" do not suggest to be the exact or identical structure, shape or size of the shown structures of the wall boxes, nor the shown prior art intelligent support boxes, or the present shown modified intelligent support boxes and wiring devices.

The standard size and shape should apply to any sized support box that fits a plug-in device and vice-versa.

Any design that includes plug-in device for plug-in into a support box is subject to modifications with times, and any support box for electrical wiring devices such as power outlets, or hybrid power switches may need to be modified to comply with electrical and building codes and rules, that differs between countries and regions.

The term "standard" as recited throughout the application and the claims is to be a standard to fit plug-in wiring devices, built to be plugged-in by a simple plug-in action into a mounted support box, simple to install, be it the outlets and/or the power switches, hybrid or simple mechanical switches, into the standard or fit box.

The same plug-in "standard" or fit should be applied to IoT's and Ai's that are now being introduced, or will be introduced in the future into the intelligent support boxes 102-112 or larger such as 124, and same applies to installing the IoT's and Ai into the low voltage plug-in support boxes 902-912 or larger such as 924.

The above explanation, covering the installing of the plug-in devices introduces other important reasons to maintain the plug-in structure to be a "standard" or "fit". One reason is the need to remove the plugged-in devices by similar simple actions such as push and pull in reverse. Be it during the installation of the system, during commissioning and in the future, as an example, intent to replace older device with an upgraded device.

FIGS. 9A and 9B disclosed above show the decorative frames 143 and 186 with the serrated bars 141 or 181 for locking the decorative frames onto the support box be it 102-112 or 902-912 or larger.

The decorative frame can be pulled outwards by hand and removed for accessing the channel of ramps of the given plug-in device, intended to be removed. Each channel of ramps includes lock ramp for single gang size device or 26 for plurality of gangs devices and pull ramp 37 (single gang) or 27 (plurality of gangs), shown in FIGS. 2A-2C.

FIGS. 23A-23E disclose the conceptual lock, release and pull actions of the present invention, to enable the removal of an installed plug-in device by a simple action of push and pull.

Each single gang device includes two lock ramps 36 at both top and bottom surface, wherein the surface shown in FIGS. 2A-2C are the top surfaces, with the bottom surfaces (not shown) are identically structured, including all the shown element 22, 26 and 27 of the AC outlets, and 32, 34, 36 and 37 of the hybrid switches or mechanical switches. The top and bottom surfaces are referenced to be 3BT-top and 3BB bottom, shown in FIG. 23A.

FIG. 10A shows the support frame structure including the guiding grooves 14 for directing the switches into position, the bending lock arm 18 with a lock step 16 that engage the lock ramps 26 of the structured switch on both surface top 3BT and bottom 3BB surfaces by the two opposing bending lock arms 18 of the support frame when the switch is fully plugged-in.

The same apply to the two gang AC outlets. The AC outlet top and bottom surfaces are structured without the convexes 14 as two gang devices are self guided into the support frame without the convexes 14. The AC outlets are structured with four lock ramps 26 and four pull ramps 27 accessible via four channels of ramps, two on the top surface and two on the bottom surface, locked via four bending lock arms 18.

Same will apply to IoT's and Ai devices, it is sufficient to lock 3-6 gang devices or larger into four channels of ramps only, locked by four bending lock arms 18.

FIGS. 23A, 23D and 23E show the insertion and the removal of the dual release bars 1 (top and bottom) into and from the channel of ramps. There is no difference between the top and bottom release bars 1, as the two can be reversed, and as explained below, each of the bars can be inserted individually into a channel of ramps.

The important elements of the structured bar 1 are shown enlarged in FIG. 23B to be the two guides 1A and 1B for sliding the bar into the guiding grooves 14 of FIG. 10A, provided on both sides of each bending lock arm 18. The other elements are the sliding surface 1D on top of a step 1F and the slant 1C that pushes outward the lock arm 18 as the bar is inserted into the channel of ramps (top and bottom), and releases the lock pin in the process.

FIG. 23C shows the tip of the bar 1E that includes the step 1F, the sliding surface 1D and the slant 1C structured to slide all the way over (passing) the pull ramp 27 or 37 to a stop by the lock ramp 26 or 36 and be pushed into the space between the lock and pull ramps with the sliding surface 1D is engaging the switch or the outlet flat top surface referenced 3BT, as shown in FIG. 23C.

FIG. 23A shows the sliding bars to being inserted into the channel of ramps. The top and bottom tips 1E engage the top and bottom flat surfaces of the outlet body 3BT and 3BB as shown, or into a cutout of the switch key (not shown) with the outlet or switch are to be unlocked by the inserted tips 1E and be pulled from the support frame 11.

FIG. 23A shows step A, the start of, and FIG. 23D shows the process of, pushing the tips 1E of the bars 1 in three steps or position B-D, wherein step B shows the tips 1E being pushed inwards and are reaching the release ramps 27 or 37 and the edge of the bending lock arm 18.

Step C shows the mid way with the tips are riding over the slant of the pull ramps 27 or 37, with the slant 1C is pushing outwards the tip of the lock arm 18, at which point of time the lock ramps 26 or 36 are in fact shown released from the locking edge of the step 16 by the outward pushed lock arm 18.

Step D shows the fully pushed bar, all the way as shown and disclosed in FIG. 23C, with the tips 1E are pushed back inward onto the flat surface of the switch or the outlet, between the lock ramps 26 or 36 and the pull ramps 27 or 37, and with the lock ramps 26 or 36 remain released from the edge of the locking step 16.

FIG. 23E shows the removal step E or action by pulling the released switch or outlet including any of the plug-in devices be it IoT or Ai or electrical plug-in device or low voltage plug-in device. Standard plug-in wiring device can be plugged-into a support box with no intelligence or circuits, but provide electrical terminals to link AC or DC power and/or load to the plugged in device. Similar is a blank plug-in enclosure, structured to fill (cover) an empty/non used space within the support box.

FIGS. 24A-24D show a simple "hand tool" 400 comprising four release bars 1 with a hole 402 at the rear end of the bar for inserting four pull cords 401 tied together into a knot 403 to provide a pull via the knot 403 as shown in FIG. 24A.

The process to pull the plug-in devices shown as an AC outlet and AC switch starts with step A, inserting each individual tip of the four release bars 1 into the channel of ramp of the shown outlet in step A of FIG. 24A all the way in to release the outlet four lock ramps 26, continued by step B, pulling the released outlet from its lock state position and continue by step C, the pull by hand of the released and loose outlet to complete the outlet removal.

FIG. 24B shows the three steps to release a switch by two only release bars 1, step A starts with individual insertion of the two release bars 1 all the way to release the switch lock ramps 36, continued by step B, the pulling of the released switch from its lock position and step C the removal by hand of the released and loose switch from the support frame to complete the removal action.

FIG. 24C shows four half gang plug-in devices (low voltage sockets) that are plugged-in or removed individually or in pairs. The shown half gang devices are separated to illustrate the guide groove 48 and the ridge 47 to align the two half gangs devices into single gang space for the plug-in action with precision.

FIG. 24D shows four half gang low voltage devices locked into plug-in two gang box 902 with a single release bar 1 inserted into the upper channel of ramps to release and pull the upper half gang device, continued with step B the pull of the released device and further continued with step C, the removal by hand of the released and loose half gang socket referenced as 51S, shown in FIG. 24C to be telephone or internet socket 44-TEL of FIG. 11E.

FIGS. 25A and 25B show a different embodiment of a structured release and pull hand tool 650 and 650D comprising a holder with dual slots 653 for supporting the two release bars combinations 1SS or 1DS for providing combined insertion of two or four release bars to release a single gang device or dual gang device by single action, wherein 1SS includes the release bar 1 structured with a sliding support 656 for insertion into the slots 653.

The other shown two sliding support 656 are structured each with dual sliding bars 1 for pulling dual gang devices such as AC outlets, IoTs and/or Ai devices.

It should be obviously clear from FIGS. 25A and 25B that longer sliding guide 656 for three of four gang or n gang can be similarly provided. As referred to above, larger plug-in devices that occupy more than four gangs need not be attached to more than four locking arms 18, such as IoT or Ai device may need to be 6 gangs long, can be locked into four only locking arms 18.

Such long device can be well plugged-in into six gang standard plug-in support box and be locked into place via only four locking ramps 26 or 36. Two lock ramps in the first gang and the other two in the last gang (six) and be released by the four tied release bars 1 of FIG. 24A or by a structured release bars 1DS of FIG. 25B having six gang long sliding support 656.

Similar structured hand tools for releasing and pulling larger plug-in devices can be applied to the release and remove hand tools of different embodiments are disclosed below.

FIG. 25C shows simpler structured hand tools 670S and 670D including assembled holder, comprising U shaped punched and bended metal holder 672 and a wooden handle 673 attached to the U shape holder 672 by screws 674 including screws 675 to attach the single 1SS release bar or 1DS dual release bar.

The shown single release bar 1SS and the holder 676S combination and the dual release bars 1DS and holder 676D combination are structured for attachment to the U shape holder 672 by set of screws 675, showing a low cost simple solution to a simple to assemble a release hand tool embodiment.

FIG. 25D shows other structure for pulling an installed plug-in dual gang device 211B with the dual gang device 620D structure differ from the dual gangs structures shown in FIGS. 25A-25C and disclosed above.

The structured plug-in dual gang outlet 211B shown in FIG. 25D differs from the above shown outlet 211 by the position of and the number of the release or pull ramps 627, one only at the top center as shown and the other at the bottom center (not shown) of the shown outlet 211B.

The shown hand tool 620D is provided with dual pull slots, shown in a formed spring metal with a rectangular cutout slot 632 for the pull action.

The release action is provided by the four or dual pairs of identical bended metal rails 631 for unlocking the lock ramps 26 by pushing the four bending lock arms 18 outwards, and simultaneously passing, by the push motion, over the pull ramps 627 to catch the two ramps 627 tightly by the dual slots 632, ready for pull the released outlet 211B.

FIG. 25E shows release and pull hand tool 620S similar to the hand tool of FIG. 25D for pulling a single gang device, such as the shown hybrid switch 3-SB having similar structure to the shown hybrid switch 3-S in FIG. 2C with the exception of the pull ramps 37. Instead the shown switch 3-SB is structured with four pull ramps 637 with two ramps are structured onto the switch left and two ramps 637 on the right side of the switch (not shown).

The pull elements are four cutouts or slots, two on each side (left and right) of a U shape bended thin metal, such as springy stainless or steel metal sheet 635 attached to the handle 622 along with dual release rails 631, identical with the rails 631 of the hand tool 620D.

The rails 631 are aligned with the center of the channel of ramps to push outwards the top and bottom bending lock arm 18 by the insertion action, for releasing the two lock ramps 36 and simultaneously catching tightly the four pull ramps 637, by the four cutouts or slots 633 shown in both perspective illustrations of front sideway A and rear sideway B.

The enlarged size of the rear left side lock ramps 637 to better show the slant portion 637S of the release ramps 637 for enabling smooth pass over to promptly catch the release ramps by the cutout 633 and pull the switch to a loose released position to be removed out by hand.

FIG. 26A shows yet another preferred release and pull hand tool conveniently packaged into a single handle 600 with the release and pull bars for single gang 606S and dual gang 606 are combined and stored or kept safe into dual cavities 608 in the left and right side of the handle comprising the body 600B and cover 600C.

The body 600B and the cover 600C are each including insert 603 and a lock 609 respectively to lock and release the cover 600C to and from the body 600B, and dual inserts 607A and 607B each with a slot 606A and 606B respectively shown in greater details in FIG. 26B.

FIG. 26B shows the slots 605A and 605B and the side covers 604 to provide a solid combined handle locked by the dual lock 609 by pushing the cover onto the body and lock.

FIG. 26A shows the four sliding guides, two pairs of 606 with dual release bars and 606S with a single release bar are stored in the cavity 608 including the two cutout holes 607 on both sides left and right of the shown body 600C and not shown cavity portions in the cover 600C.

The shown slits 606A and 606B and the release bars 1 are off center versus the sliding guides 606 and 606S to assure no reverse insertion of the release bar by error, so as to provide clean handle solidly locked to support the release bars 1 for single gang or dual gang. The shown hand tools 600D and 600S operate by a simple push and pull actions as referred to the release hand tools shown in FIGS. 23A to 25E above.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the scope of the invention.

What is claimed is:

1. A method for verifying bidirectional optical conductivity via dual bare ends of at least one segment of optical cable terminated by a guillotine cut and drawn at least in part through at least one of alternating current (AC) and low voltage conduit by one of a pair of optical testers each includes at least one optical access with mechanical self lock key for attaching said at least one cut segment end and a single tester in combination with one end of said at least one cut segment linked to an optical access of a powered cascaded device under testing;
    wherein each optical tester of said pair of optical testers and said cascaded device is self operated by a central processing unit (CPU) programmed to one of process said bidirectional optical conductivity verification by said pair of optical testers and by said optical tester and said cascaded device, said cascaded device further includes at least one start key and at least one display indicator, said method comprising the steps of:
    a. Attaching dual testers to two ends of said at least one cut segment, or attaching single tester to a single end of said at least one cut segment with the other end of at least one cut segment is attached to said powered cascading device;
    b. Initiating the bidirectional optical conductivity verification process by actuating the start key; and
    c. Reviewing the display indicator for one of confirmation and failure of the bidirectional optical conductivity test.

2. The method according to claim 1, wherein one of said pair of testers is replaced with plurality of simplified test-responders for attaching each said simplified test-responder to one end of each single cut segment included in the cascaded line and start the verifying process by moving the tester from one cut segment end to another along cascading line without need to move two testers at the end of each cut segment verification that otherwise calls for repeated back and forth walking along the cascaded lines for each verification.

3. The method according to claim 1, wherein said at least one cut segment is linked to an optical access of said cascaded device for propagating lower and higher optical speed signals and said tester is provided with dual start key and dual indicators for verifying ire conductivity of said lower speed signal and said higher speed signal independently.

4. The method according to claim 3, wherein said tester is provided with touch screen and display icons for enabling the processing of said bidirectional optical conductivity verification to range from a single cut segment to a combination testing selection via a pre-programmed touch icons.

5. The method according to claim 1, wherein the cascaded devices are linked at least in part via dual cut segments and dual optical accesses for propagating lower speed optical signal and higher speed optical signal independently, and said tester includes dual accesses each with said mechanical self lock key for attaching two cut segment ends, dual start keys and dual indicators for individual verification of said lower optical speed conductivity and said higher optical speed conductivity.

6. The method according to claim 3, wherein said tester is a four way tester including dual optical accesses supported by said mechanical self lock keys for verifying four way conductivity between a first cut segment linked to the optical access of a left cascaded device and a second cut segments linked to the optical access of a right cascaded device to be linked via dual optical access of a center cascaded device, wherein said tester is provided with said dual accesses and dual mechanical self lock keys for enabling the four-way tester to replace a center cascaded box for verifying the four way propagations between both the left cascaded device and the right cascaded device via the four way tester.

7. The method according to claim 6, wherein said tester is the four way tester for verifying optical conductivity of lower speed signals and higher speed signals individually via dual cascaded cut segment lines and four optical accesses with dual optical accesses for the lower speed signal and dual optical accesses for the higher speed signal, to be linked with the left cascaded device and the right cascaded device respectively through four optical accesses of a center cascaded device, wherein said tester is provided with four optical access and four mechanical self lock keys for enabling the tester to replace the center cascaded device for verifying the four way conductivity between both the left cascaded device and the right cascaded device with the four way tester via dual cascaded optical lines for individual verification of four way lower speed conductivity and the four way higher speed conductivity.

8. The method according to claim 2, wherein a first cascaded device is linked to at least one optical access of a cascaded optical line controller selected from a group comprising a cascaded optical network controller, a cascaded optical grid controller, an optical command converter, at least one of optical and low voltage signal distributor and combination thereof, and
    wherein said cascaded optical line controller is operated by a CPU programmed to respond to and process the verifying protocols generated by said tester, replacing the simplified test-responder within said cascaded optical line.

9. The method according to claim 1, wherein said tester is enclosed in a plug-on tester structure for attachment to an hand held calibrator used by electrician for calibrating power consumption calculation, said calibrator including a CPU, a memory, current sensor and further elements selected from a group comprising keys, indicators, display touch screen, built-in rechargeable batteries and combination thereof for enabling an installer to attach a small plug-on tester onto said hand held calibrator commonly used by electrical installers for installing the present cascaded optical grid and devices and simultaneously testing conductivities of a given cascaded cut segments including entire optical grid via a combined calibrator with the plug-on tester.

10. The method according to claim 4, wherein said tester comprising a display, touch screen and circuits for generating and displaying the higher speed optical signal the lower speed optical signal, signal level and signal pulse shape along the verifying protocols generated by said tester for providing important optical accesses signals and optical cable particulars pertaining to at least one of a given cascaded device and a given cut segment within a given cascaded line along with said displaying of said optical signal, the signal levels and the pulse shape, that provide elevated data for handling identified defect during said testing.

11. A tester for measuring and verifying bidirectional optical conductivity of at least one bare segment of an optical cable terminated by a guillotine cut at both said bare segment ends and drawn at least in part through one of alternating current (AC) and low voltage conduit for linking a pair of optical accesses including in a chain of optical accesses of cascading devices, said tester comprising a central processing unit (CPU), a memory, at least one bidirectional optical access and a self lock mechanical key, one of replaceable and built-in rechargeable battery and further including circuits and elements selected from a group comprising radio frequency (RF) transceiver, RF antenna, two way buffer circuit, touch screen display, control keys, setting selector, display screen and combinations thereof, and wherein said measuring and verifying is processed and communicated between dual testers, a tester and a responder, a tester and an optical access of a cascading device within an optical grid of said optical cable and between said measuring and verifying the conductivity through one of said single cut segment and via a cascaded optical line of said cascaded optical grid with a controller of said optical grid.

12. The tester according to claim 11, wherein said tester is simplified and formed into a responder controlled by CPU with limited functions and low power consumption responding to a received given command and generating response as programmed with at least one of command and a given set of commands.

13. The tester according to claim 11, wherein said at least one optical access and said CPU are selected and programmed to extend optical speed signal into dual bands of lower and higher speed signals to further include dual start keys and dual indicators for enabling verification of the conductivity of the lower speed optical signal and the higher speed optical signal independently.

14. The tester according to claim 13, wherein said tester comprises touch screen and display icons for enabling the processing of said verification to range from verifying the single cut segment to a combination selection including testing and verification via a pre-programmed touch icons.

15. The tester according to claim 11, is expanded to enable the measuring and verification of dual optical speed signals via dual optical accesses individually, wherein each of said dual optical access includes said mechanical self lock key for each of the dual cut segment and individual said start keys and indicator to display verification statuses of lower speed optical signal and higher speed optical signal individually.

16. The tester according to claim 13, wherein said tester is a four way tester including dual optical accesses supported by said mechanical self lock keys for verifying four way conductivity between a first cut segment linked to the optical access of a left cascaded device and a second cut segments linked to the optical access of a right cascaded device to be linked via dual optical access of a center cascaded device, wherein said tester is provided with said dual accesses and dual mechanical self lock keys for enabling the tester to replace center cascaded box for verifying four way propagations between both the left cascaded device and the right cascaded device via the four way tester.

17. The tester according to claim 16, wherein said tester is the four way tester for verifying optical conductivity of lower and higher speed signals individually via dual cascaded cut segment lines and four optical accesses with the dual optical accesses for the lower speed signal and the dual optical accesses for the higher speed signal, to be linked with the left cascaded device and the right cascaded device respectively through four optical accesses of the center cascaded device, wherein said tester is provided with four optical access and four mechanical self lock keys for enabling the tester to replace center cascaded devices for verifying the four way conductivity between both the left cascaded device and the right cascaded device with the four way tester via dual cascaded optical lines for individual verification of the four way lower speed and the four way higher speed conductivity.

18. The tester according to claim 12, wherein the first cascaded device is linked to at least one optical access of a cascaded optical line controller selected from a group comprising a cascaded optical network controller, a cascaded optical grid controller, an optical command converter, at least one of optical and low voltage signal distributor and combination thereof, and wherein said cascaded optical line controller is operated by a CPU programmed to respond to and process verifying protocols generated by said tester, replacing responder within said cascaded optical line.

19. The tester according to claim 11, wherein said tester is enclosed in a plug-on tester structure for attachment to an hand held calibrator used by electrician for calibrating power consumption calculation, said calibrator including a CPU, a memory, current sensor and further elements selected from a group comprising keys, indicators, display touch screen, built-in rechargeable batteries and combination thereof for enabling an installer to attach a small plug-on tester onto said hand held calibrator commonly used by electrical installers for installing present cascaded optical grid and devices and simultaneously testing conductivities of a given cascaded cut segments including the entire optical grid via a combined calibrator with the plug-on tester.

20. The tester according to claim 14, wherein said tester comprising a display, touch screen and circuits for generating and displaying the optical signal, the signal level and the signal pulse shape along the verifying protocols generated by said tester for providing optical accesses signals and optical cable particulars pertaining to at least one of a given cascaded device and a given cut segment within a given cascaded line along with said displaying of said optical signal, the signal levels and the pulse shape, that provide elevated data for handling identified defect during said testing.

* * * * *